(12) United States Patent
Nishio et al.

(10) Patent No.: US 9,660,166 B2
(45) Date of Patent: May 23, 2017

(54) THERMOELECTRIC CONVERSION MATERIAL, THERMOELECTRIC CONVERSION ELEMENT, ARTICLE FOR THERMOELECTRIC POWER GENERATION AND POWER SUPPLY FOR SENSOR

(71) Applicant: FUJIFILM Corporation, Tokyo (JP)

(72) Inventors: Ryo Nishio, Kanagawa (JP); Ryo Hamasaki, Kanagawa (JP); Kimiatsu Nomura, Kanagawa (JP); Yoichi Maruyama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/862,264

(22) Filed: Sep. 23, 2015

(65) Prior Publication Data

US 2016/0013390 A1 Jan. 14, 2016

Related U.S. Application Data

(63) Continuation of application No. PCT/JP2014/056869, filed on Mar. 14, 2014.

(30) Foreign Application Priority Data

Mar. 29, 2013 (JP) ................................ 2013-072148
Jul. 31, 2013 (JP) ................................ 2013-159268

(51) Int. Cl.
*C08K 3/08* (2006.01)
*H01L 35/24* (2006.01)
(Continued)

(52) U.S. Cl.
CPC .............. *H01L 35/24* (2013.01); *H01L 35/14* (2013.01); *H01L 35/20* (2013.01); *H01L 35/32* (2013.01)

(58) Field of Classification Search
None
See application file for complete search history.

(56) References Cited

U.S. PATENT DOCUMENTS

| | | | |
|---|---|---|---|
| 2003/0032709 A1* | 2/2003 | Toshima | C08K 3/08 524/439 |
| 2011/0215306 A1 | 9/2011 | Kato et al. | |
| 2011/0284804 A1* | 11/2011 | Kim | H01B 1/18 252/503 |
| 2016/0099397 A1* | 4/2016 | Maruyama | H01L 35/14 136/236.1 |

FOREIGN PATENT DOCUMENTS

| | | |
|---|---|---|
| JP | 2004-303930 A | 10/2004 |
| JP | 2005-039130 A | 2/2005 |

(Continued)

OTHER PUBLICATIONS

Sun, et al., "Organic Thermoelectric Materials and Devices Based on p- and n- Type Poly (metal 1, 1, 2, 2-ethenetetrathiolate) s." Advanced Materials 24.7 (2012): 932-937.*

(Continued)

*Primary Examiner* — Allison Bourke
*Assistant Examiner* — William E McClain
(74) *Attorney, Agent, or Firm* — Sughrue Mion, PLLC

(57) ABSTRACT

A thermoelectric conversion element (1) having, on a substrate (12), a first electrode (13), a thermoelectric conversion layer (14), and a second electrode 15, wherein a nano conductive material and a low band gap material are contained in the thermoelectric conversion layer (14); an article for thermoelectric power generation and a power supply for a sensor using the thermoelectric conversion element (1); and a thermoelectric conversion material containing the nano conductive material and the low band gap material.

10 Claims, 1 Drawing Sheet

(51) Int. Cl.
*H01L 35/12* (2006.01)
*H01L 35/14* (2006.01)
*H01L 35/20* (2006.01)
*H01L 35/32* (2006.01)

(56) References Cited

FOREIGN PATENT DOCUMENTS

| | | |
|---|---|---|
| JP | 2006-128444 A | 5/2006 |
| JP | 2008-305831 A | 12/2008 |
| JP | 2010-199276 A | 9/2010 |
| JP | 2011-181363 A | 9/2011 |
| JP | 2011-243809 A | 12/2011 |
| JP | 2012-009462 A | 1/2012 |
| JP | 2012-102209 A | 5/2012 |
| WO | 2011/149991 A1 | 12/2011 |
| WO | 2012/133314 A1 | 10/2012 |

OTHER PUBLICATIONS

Sun, et al., "Flexible n- Type High-Performance Thermoelectric Thin Films of Poly (nickel-ethylenetetrathiolate) Prepared by an Electrochemical Method." Advanced Materials (2016).*

Alves, et al. "Conductors based on metal-bisdicyanobenzodithiolate complexes." Synthetic metals 133 (2003): 397-399.*

Miles, et al.. "Semiconducting metal-organic salts." Inorganic Chemistry 14.10 (1975): 2357-2360.*

Wüsten, Jens, and Karin Potje-Kamloth. "Organic thermogenerators for energy autarkic systems on flexible substrates." Journal of Physics D: Applied Physics 41.13 (2008): 135113.*

Ribera, E., et al. "The (DT-TTF)-M (mnt) 2 family of compounds." Synthetic metals 102.1 (1999): 1743-1746.*

Simao, D., et al. "Charge transfer salts based on Cu (qdt) 2, Ni (qdt) 2 and Au (qdt) 2 anions." Synthetic metals 102.1 (1999):1613-1614.*

Kaddour, Wafa, et al. "Thermoelectric power of TTF [Ni (dmit) 2] 2." Physica B: Condensed Matter 407.11 (2012): 1715-1717.*

Pukacki, W., et al. "Electronic and spectral properties of organometallic tetracyano-p-quinodimethane (TCNQ) salts with metallocene stacks."Inorganic Chemistry 26.8 (1987): 1328-1331.*

Nunes, João PM, et al. "Transition Metal Bisdithiolene Complexes Based on Extended Ligands with Fused Tetrathiafulvalene and Thiophene Moieties: New Single-Component Molecular Metals." Chemistry—A European Journal13.35 (2007): 9841-9849.*

International Search Report for PCT/JP2014/056869 dated Jun. 24, 2014.

* cited by examiner

THERMOELECTRIC CONVERSION MATERIAL, THERMOELECTRIC CONVERSION ELEMENT, ARTICLE FOR THERMOELECTRIC POWER GENERATION AND POWER SUPPLY FOR SENSOR

CROSS-REFERENCE TO RELATED APPLICATIONS

This application is a Continuation of PCT International Application No. PCT/JP2014/056869 filed on Mar. 14, 2014, which claims priority under 35 U.S.C. §119 (a) to Japanese Patent Application No. 2013-072148 filed in Japan on Mar. 29, 2013, and Patent Application No. 2013-159268 filed in Japan on Jul. 31, 2013. Each of the above applications is hereby expressly incorporated by reference, in its entirety, into the present application.

TECHNICAL FIELD

The present invention relates to a thermoelectric conversion material and a thermoelectric conversion element, and an article for thermoelectric power generation and a power supply for a sensor using the same.

BACKGROUND ART

A thermoelectric conversion material that allows mutual conversion between heat energy and electric energy is used for a thermoelectric conversion element such as a thermoelectric generation device and a Peltier device. In thermoelectric generation to which the thermoelectric conversion material or the thermoelectric conversion element applys, heat energy can be directly converted into electric power, and a movable part is not required. Thus, the thermoelectric generation is used for a wrist watch operated by body temperature, a power supply for remote districts, a space power supply or the like.

As one indication for evaluating the thermoelectric conversion performance of the thermoelectric conversion element, there is a dimensionless figure of merit ZT (hereinafter, simply referred to as a figure of merit ZT in some cases). This figure of merit ZT is represented by the following Equation (A), and for enhancement of the thermoelectric conversion performance, it is required to increase a thermopower per absolute temperature of 1 K (hereinafter, referred to as a thermopower in some cases) S and an electrical conductivity σ, and to decrease a thermal conductivity κ.

$$\text{Figure of merit } ZT = S^2 \sigma T/\kappa \tag{A}$$

In Equation (A), S(V/K): thermopower per absolute temperature of 1 K (Seebeck coefficient)
σ (S/m): Electrical conductivity
κ (W/mK): Thermal conductivity
T(K): Absolute temperature Preferable thermoelectric conversion performance is required for the thermoelectric conversion material, and thus a material which is mainly put into practical use at the present day is an inorganic material. However, the inorganic material needs a complicated processing process for using in the thermoelectric conversion element, is expensive, and contains harmful substances in some cases.

On the other hand, an organic thermoelectric conversion element can be produced at a relatively low price and facilitated to process for forming a film or the like. For these reasons, recently, researches have actively been carried out, and eventually an organic thermoelectric conversion material and a thermoelectric conversion element using the same have been reported. In order to increase the figure of merit ZT for thermoelectric conversion, an organic material having high Seebeck coefficient and electrical conductivity and low thermal conductivity is demanded. For example, a thermoelectric conversion element, which includes a carrier transportation layer formed by an organic semiconductor material such as pentacene and a carrier generation layer of tetrafluorotetracyanoquinodimethane or the like, is proposed (see Patent Literature 1). In addition, a conductive polymer or a charge-transfer complex is proposed as an organic compound in a thermoelectric material including an organic compound and a dopant (see Patent Literature 2). Moreover, phthalocyanine is proposed as a thermoelectric conversion material (see Patent Literature 3). A metal phthalocyanine is proposed as a p-type semiconductor material to be used in a thermoelectric conversion element (see Patent Literature 4).

CITATION LIST

Patent Literatures

Patent Literature 1: JP-A-2011-243809 ("JP-A" means unexamined published Japanese patent application)
Patent Literature 2: JP-A-2006-128444
Patent Literature 3: JP-A-2008-305831
Patent Literature 4: JP-A-2010-199276

SUMMARY OF INVENTION

Technical Problem

As a conductive organic material, a nano conductive material (nanometer-sized conductive material) such as a carbon nanotube is known. However, when a nano conductive material is used alone, it is difficult to obtain desired performance as the thermoelectric conversion material.

An object of the present invention is to provide a thermoelectric conversion material and a thermoelectric conversion element which exhibit excellent thermoelectric conversion performance and an article for thermoelectric power generation and a power supply for a sensor which use the same.

Solution to Problem

The present inventors examined a material in which high thermoelectric conversion performance can be realized when a nano conductive material is co-existed in a thermoelectric conversion layer of the thermoelectric conversion element, in view of the above-described problems. As a result, they found that, when an organic material having a specific optical band gap is co-existed with a nano conductive material, excellent thermoelectric conversion performance is exerted in the thermoelectric conversion element. The present invention has been made based on these findings.

According to the present invention, there is provided the following means:
<1> A thermoelectric conversion element comprising, on a substrate, a first electrode, a thermoelectric conversion layer, and a second electrode,
wherein a nano conductive material and a low band gap material are contained in the thermoelectric conversion layer, and an optical band gap of the low band gap material is 0.1 eV or more and 1.1 eV or less.

<2> The thermoelectric conversion element according to item <1>, wherein the low band gap material is a charge-transfer complex composed of an organic electron donor and an organic electron acceptor.

<3> The thermoelectric conversion element according to item <2>, wherein the organic electron donor is a compound having an aromatic ring structure.

<4> The thermoelectric conversion element according to item <2> or <3>, wherein the organic electron donor is a compound having a condensed ring structure with three or more rings, and the condensed ring has an aromatic ring structure.

<5> The thermoelectric conversion element according to any one of items <2> to <4>, wherein the organic electron donor is a compound having a carbazole structure or a fluorene structure.

<6> The thermoelectric conversion element according to any one of items <2> to <5>, wherein the organic electron donor is a compound represented by Formula (2):

$X\text{-}(EWG)_{na}$  Formula (2)

wherein, in Formula (2), X represents a na-valent organic group; EWG represents an electron-withdrawing group; and na represents an integer of 1 or more.

<7> The thermoelectric conversion element according to item <1>, wherein the low band gap material is a metal complex.

<8> The thermoelectric conversion element according to item <7>, wherein, in the metal complex, at least one of atoms that coordinate to the central metal is a sulfur atom or an oxygen atom.

<9> The thermoelectric conversion element according to item <7> or <8>, wherein the central metal of the metal complex is a metal atom selected from the group consisting of Ni, Fe, Cu and Sn, or a metal ion thereof.

<10> The thermoelectric conversion element according to any one of items <7> to <9>, wherein the metal complex is a compound represented by Formula (3):

Formula (3)

wherein, in Formula (3), M is a metal atom selected from the group consisting of Ni, Fe, Cu and Sn, or a metal ion thereof; when M is a metal ion, the compound represented by Formula (3) may have an arbitrary counter ion; $X^{11}$, $X^{12}$, $X^{13}$ and $X^{14}$ each independently represent a hetero atom; at least one of $X^{11}$ to $X^{14}$ is a sulfur atom or an oxygen atom; $R^{11}$, $R^{12}$, $R^{13}$ and $R^{14}$, each independently represent a substituent; $R^{11}$ and $R^{12}$ may be bonded to each other; and $R^{13}$ and $R^{14}$ may be bonded to each other.

<11> The thermoelectric conversion element according to item <1>, wherein the low band gap material is an arylamine compound.

<12> The thermoelectric conversion element according to item <11>, wherein the arylamine compound is a compound represented by Formula (5), or a one- or two-electron oxidized derivative of the compound represented by Formula (5):

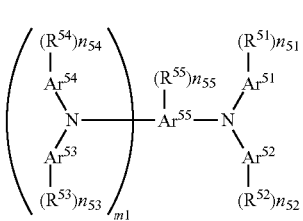

Formula (5)

wherein, in Formula (5), $Ar^{51}$ to $Ar^{55}$ each independently represent an aromatic hydrocarbon ring, an aromatic heterocycle, a single bond, or an alkylene group, proviso that at least one of $Ar^{51}$ and $Ar^{52}$ is an aromatic hydrocarbon ring and at least one of $Ar^{53}$ and $Ar^{54}$ is an aromatic hydrocarbon ring; $R^{51}$ to $R^{55}$ each independently represent a substituent; $n_{51}$ to $n_{55}$ each independently represent an integer of 0 to 3; and m1 represents 0 or 1.

<13> The thermoelectric conversion element according to item <12>, wherein, in Formula (5), $R^{51}$ to $R^{55}$ each independently represent a dialkylamino group, a diarylamino group, or an alkoxy group.

<14> The thermoelectric conversion element according to any one of items <1> to <13>, wherein the thermoelectric conversion layer contains at least one polymer selected from a conjugated polymer and a non-conjugated polymer.

<15> The thermoelectric conversion element according to item <14>, wherein the conjugated polymer has, as a repeating unit, a constituent derived from at least one compound selected from the group consisting of a thiophene compound, a pyrrole compound, an acetylene compound, a p-phenylene compound, a p-phenylenevinylene compound, a p-phenylene ethynylene compound, a fluorene compound, and an aryl amine compound.

<16> The thermoelectric conversion element according to item <14>, wherein the non-conjugated polymer has, as a repeating unit, a constituent derived from at least one compound selected from the group consisting of a vinyl compound, a (meth)acrylate compound, a carbonate compound, an ester compound, an amide compound, an imide compound, and a siloxane compound.

<17> The thermoelectric conversion element according to any one of items <14> to <16>, wherein the thermoelectric conversion layer contains a conjugated polymer and a non-conjugated polymer.

<18> The thermoelectric conversion element according to any one of items <1> to <17>, wherein the nano conductive material is a nano carbon material or a nano metal material.

<19> The thermoelectric conversion element according to any one of items <1> to <18>, wherein the nano conductive material is at least one kind of material selected from the group consisting of a carbon nanotube, a carbon nanofiber, graphite, graphene, carbon nanoparticles and a metal nanowire.

<20> The thermoelectric conversion element according to any one of items <1> to <19>, wherein the nano conductive material is a carbon nanotube.

<21> The thermoelectric conversion element according to any one of items <1> to <20>, wherein the thermoelectric conversion layer contains a dopant.

<22> The thermoelectric conversion element according to any one of items <1> to <21>, wherein the substrate has flexibility.

<23> The thermoelectric conversion element according to any one of items <1> to <22>, wherein the first electrode and the second electrode each independently are formed by aluminum, gold, silver, or copper.

<24> An article for thermoelectric power generation using the thermoelectric conversion element according to any one of items <1> to <23>.

<25> A power supply for a sensor using the thermoelectric conversion element according to any one of items <1> to <23>.

<26> A thermoelectric conversion material for forming a thermoelectric conversion layer of a thermoelectric conversion element, the material comprising a nano conductive material and a low band gap material, wherein an optical band gap of the low band gap material is 0.1 eV or more and 1.1 eV or less.

<27> The thermoelectric conversion material according to item <26>, comprising at least one polymer selected from a conjugated polymer and a non-conjugated polymer.

<28> The thermoelectric conversion material according to item <26> or <27>, comprising an organic solvent.

<29> The thermoelectric conversion material according to item <28>, wherein the nano conductive material is dispersed in the organic solvent.

In the present invention, a numerical value range indicated using "to" means a range including the numerical values described before and after "to" as the lower limit and the upper limit.

In the present invention, when a substituent is described as an xxx group, the xxx group may have an arbitrary substituent. Also, when there are a number of groups represented by the same reference symbol, the groups may be identical with or different from each other.

A repeating unit represented by each formula includes different repeating units when they are within the range represented by the each formula, but they are not nonetheless completely identical repeating units. For example, in the case that the repeating unit has an alkyl group, the repeating unit represented by the each formula may be composed only of a repeating unit having a methyl group, or may include a repeating unit having another alkyl group, e.g. an ethyl group, in addition to the repeating unit having a methyl group.

Advantageous Effects of Invention

The thermoelectric conversion material and the thermoelectric conversion element of the present invention exhibit excellent thermoelectric conversion performance. Further, the article for thermoelectric power generation, the power supply for a sensor, and the like of the present invention using the thermoelectric conversion element of the present invention exhibit excellent thermoelectric conversion performance.

Other and further features and advantages of the invention will appear more fully from the following description, appropriately referring to the accompanying drawings.

BRIEF DESCRIPTION OF DRAWINGS

FIG. 1 schematically shows a cross-sectional view for another example of the thermoelectric conversion element of the present invention. An arrow in FIG. 2 shows a direction of temperature difference to be imparted during using the element.

DESCRIPTION OF EMBODIMENTS

Figure 1:
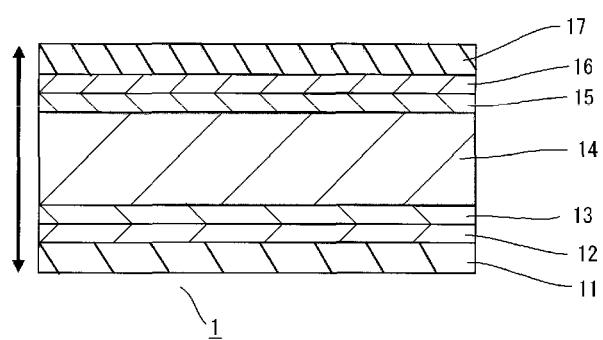
FIG. 1 schematically shows a cross-sectional view for one example of the thermoelectric conversion element of the present invention. An arrow in FIG. 1 shows a direction of temperature difference to be imparted during using the element.

A thermoelectric conversion element of the present invention includes a first electrode, a thermoelectric conversion layer, and a second electrode on a substrate. The thermoelectric conversion layer contains a nano conductive material and a low band gap material. This thermoelectric conversion layer is formed on the substrate by a thermoelectric conversion material of the present invention containing a nano conductive material and a low band gap material.

Thermoelectric conversion performance of the thermoelectric conversion element of the present invention may be defined in figure of merit ZT represented by Equation (A).

$$\text{Figure of merit } ZT = S^2 \cdot \sigma \cdot T/\kappa \qquad (A)$$

In Equation (A), S(V/K): thermopower per absolute temperature of 1 K (Seebeck coefficient)

σ (S/m): Electrical conductivity

κ (W/mK): Thermal conductivity

T(K): Absolute temperature

As is apparent from the above Equation (A), for enhancement of the thermoelectric conversion performance, it is required to increase thermopower S and electrical conductivity σ, and to decrease the thermal conductivity κ. As such, the thermoelectric conversion performance is largely affected by factors other than electrical conductivity σ. Therefore, even for a material which is generally considered to have high electrical conductivity σ, it is still unknown whether the material would function effectively as a thermoelectric conversion material in actual applications.

Furthermore, a thermoelectric conversion element works under the condition of keeping a temperature difference in the direction of the thickness and the plane of a thermoelectric conversion layer, so as to transfer the temperature in the direction of the thickness and the plane. Thus, it is necessary to form a thermoelectric conversion layer by forming a thermoelectric conversion material into a shape having a certain thickness. Therefore, in the case of forming a film shape of the thermoelectric conversion layer by coating, a thermoelectric conversion material is required to have satisfactory coating property or film-forming property. The thermoelectric conversion material of the present invention has satisfactory dispersibility of a nano conductive material and excellent coating property or film-forming property, so that the thermoelectric conversion material is suitable to be molded and processed into a thermoelectric conversion layer.

Hereinafter, thermoelectric conversion material of the present invention and, next, thermoelectric conversion element of the present invention will be explained.

[Thermoelectric Conversion Material]

The thermoelectric conversion material of the present invention is a thermoelectric conversion composition for forming a thermoelectric conversion layer of a thermoelectric conversion element and contains a nano conductive material and a low band gap material.

First, each component to be used in the thermoelectric conversion material of the present invention will be explained <Nano Conductive Material>

A nano conductive material to be used in the present invention may be a material having a nanometer size and having electrical conductivity. As such a nano conductive material, a carbon material having electrical conductivity and a nanometer size (hereinafter, referred to as the nanocarbon material in some cases), a metal material having a nanometer size (hereinafter, referred to as the nano-metal material in some cases), or the like is exemplified.

Among the nanocarbon materials and the nano-metal materials, as the nano conductive material used in the present invention, nanocarbon materials such as a carbon nanotube (hereinafter, also referred to as CNT), a carbon nanofiber, fullerene, graphite, graphene, and carbon nanoparticles, and metal nanowires, which will be respectively described below, are preferable, and a carbon nanotube is particularly preferable from the viewpoint of improving electrical conductivity and the dispersibility in the dispersion medium.

The content of the nano conductive material in the thermoelectric conversion material is, from the viewpoint of thermoelectric conversion performance, in the total solid content of the thermoelectric conversion material, i.e. in the thermoelectric conversion layer, preferably 2 to 60% by mass, more preferably 5 to 55% by mass, and particularly preferably 10 to 50% by mass.

One kind of the nano conductive materials may be used alone, or two or more kinds thereof may be used in combination. When two or more kinds are used in combination as the nano conductive material, at least one kind of nanocarbon materials and at least one kind of nano-metal materials may be used in combination, or two kinds of respective nanocarbon materials or nano-metal materials may be used in combination 1. Nanocarbon Material The nanocarbon material is, as described above, a carbon material having nanometer size and electrical conductivity. The nanocarbon material, for example, includes the nanometer-sized conductive material obtained by the chemical bonding of carbon atoms by means of a carbon-carbon bond formed at $sp^2$ hybrid orbital of a carbon atom. Specific examples thereof include fullerene (including metal-containing fullerene and onion-shaped fullerene), a carbon nanotube (including peapods), a carbon nanohorn having a shape in which one end of a carbon nanotube is blocked, a carbon nanofiber, a carbon nanowall, a carbon nanofilament, a carbon nanocoil, vapor grown carbon (VGCF), graphite, graphene, carbon nanoparticles, and a cup-shaped nanocarbon substance in which a hole is formed on the top portion of a carbon nanotube. In addition, various carbon blacks having a graphite crystalline structure and electrical conductivity can be used as the nanocarbon material, and examples thereof include Ketjen Black and acetylene black. Specifically, carbon blacks such as "Vulcan" manufactured by Cabot are exemplified.

These nanocarbon materials can be produced by a production method of the related art. Specifically, examples thereof include catalytic hydrogen reduction of carbon dioxide, an arc discharge method, a laser vaporization method, a CVD method, a vapor-phase epitaxial method, a vapor-phase flow method, a HiPco method in which carbon monoxide is allowed to react together with an iron catalyst under high temperature and high pressure to grow carbon in a gas phase, and an oil furnace method. The nanocarbon material produced in this way can be used as it is, or a nanocarbon material subjected to purification by cleaning, centrifugal separation, filtration, oxidation, chromatograph, or the like can also be used. Further, a nanocarbon material subjected to pulverization, as necessary, by using ball type kneading apparatuses such as a ball mill, a vibration mill, a sand mill and a roll mill, or a nanocarbon material subjected to cutting to have a short length by a chemical or physical treatment can also be used.

The size of the nano conductive material to be used in the present invention is not particularly limited as long as it is nanometer-sized. When the nano conductive material is a carbon nanotube, a carbon nanohorn, a carbon nanofiber, a carbon nanofilament, a carbon nanocoil, vapor grown carbon fiber (VGCF), a cup-shaped nanocarbon substance, or the like, particularly, when the nano conductive material is the CNT, an average length is not particularly limited, but is preferably 0.01 to 1,000 μm and more preferably 0.1 to 100 μm from the viewpoint of ease of production, film-forming property, and electrical conductivity. Further, a average diameter of the CNT used in the present invention is not particularly limited, but from viewpoints of durability, transparency, film-forming property, electrical conductivity, or the like, the average diameter is preferably 0.4 nm or more to 100 nm or less, more preferably 50 nm or less, and further preferably 15 nm or less.

Among the nanocarbon materials described above, a carbon nanotube, a carbon nanofiber, graphite, graphene, and carbon nanoparticles are preferable, and a carbon nanotube is particularly preferable.

Hereinafter, explanation will be made as to the carbon nanotube. The CNT includes a single-walled CNT in which one sheet of carbon film (graphene sheet) is cylindrically wound, a double-walled CNT in which two graphene sheets are concentrically wound, and a multi-walled CNT in which a plurality of graphene sheets are concentrically wound. In the present invention, the single-walled CNT, the double-walled CNT, and the multi-walled CNT may be used alone, or in combination with two or more kinds. A single-walled CNT and a double-walled CNT have excellent properties in the electrical conductivity and the semiconductor characteristics, and therefore a single-walled CNT and a double-walled CNT are preferably used, and a single-walled CNT is more preferably used.

For a single-walled CNT, the symmetry of the spiral structure based on the direction of hexagon of graphene of a graphene sheet is referred to as axial chirality, and a two-dimensional lattice vector from a reference point of a 6-membered ring on graphene is referred to as a chiral vector. (n, m) obtained by the indexation of this chiral vector is referred to as a chiral index, and metallic CNT and semiconductive CNT can be classified by this chiral index. Specifically, the CNT that has n-m of a multiple of 3 is metallic, while the CNT that does not have n-m of a multiple of 3 is semiconductive.

The single-walled CNT to be used in the present invention may be used in the form of a semiconductive one or a metallic one, or both in combination with the semiconductive one and the metallic one. Moreover, the CNT may include a metal therein, or one including a molecule of fullerene or the like therein (particularly the one including fullerlene is referred to as peapod) may also be used.

The CNT can be produced by an arc discharge process, a chemical vapor deposition process (hereinafter, referred to as a CVD process), a laser ablation process, or the like. The CNT used in the present invention may be obtained by any method, but preferably by the arc discharge process and the CVD process.

Upon producing the CNT, fullerene, graphite, or amorphous carbon is simultaneously formed as a by-product. In order to remove these impurities, purification is preferably performed. A method of purification of the CNT is not particularly limited, but acid treatment by nitric acid, sulfuric acid, or the like, or ultrasonication is effective in removal of the impurities. In addition thereto, separation and removal using a filter is also preferably performed from the viewpoint of purity.

After purification, the CNT obtained can also be directly used. Moreover, the CNT is generally produced in the form of strings, and therefore may be cut into a desired length according to a use. The CNT can be cut in the form of short fibers by acid treatment by nitric acid or sulfuric acid, ultrasonication, a freeze mill process, or the like. Moreover, in addition thereto, separation using the filter is also preferred from the viewpoint of an improvement of purity.

In the present invention, not only a cut CNT, but also a CNT previously prepared in the form of short fibers can be used. Such a CNT in the form of short fibers can be obtained, for example, by forming on a substrate a catalyst metal such as iron and cobalt, and according to the CVD method, allowing on the surface thereof vapor deposition of the CNT by thermally decomposing a carbon compound at 700 to 900° C., thereby obtaining the CNT in the shape of alignment on a substrate surface in a vertical direction. The thus prepared CNT in the form of short fibers can be taken out from the substrate by a method of stripping off the CNT, or the like. Moreover, the CNT in the form of short fibers can also be obtained by supporting a catalyst metal on a porous support such as porous silicon or on an anodized film of alumina to allow on a surface thereof vapor deposition of a CNT according to the CVD process. The CNT in the form of aligned short fibers can also be prepared according to a method in which a molecule such as iron phthalocyanine containing a catalyst metal in the molecule is used as a raw material, and a CNT is prepared on a substrate by performing CVD in a gas flow of argon/hydrogen. Furthermore, the CNT in the form of aligned short fibers can also be obtained on a SiC single crystal surface according to an epitaxial growth process.

2. Nano-Metal Material

The nano-metal material is, for example, a fibrous or particulate metal material having a nano-meter size, and specific examples thereof include a fibrous metal material (also referred to as a metal fiber) and a particulate metal material (also referred to as metal nanoparticles). As the nano-metal material, metal nanowires to be described later are preferable.

The metal fiber is preferably in the form of solid fibers or hollow fibers. A metal fiber having a solid structure which has an average short axis length of 1 to 1,000 nm and an average long axis length of 1 to 100 μm is referred to as a metal nanowire. A metal fiber having a hollow structure which has an average short axis length of 1 to 1,000 nm and an average long axis length of 0.1 to 1,000 μm is referred to as a metal nanotube.

The material of the metal fiber may be a metal having electrical conductivity, and can be appropriately selected depending on the purposes. For example, as the material, at least one metal element selected from the group consisting of the metals of the 4th period, the 5th period and the 6th period of the Long Periodic Table (IUPAC 1991) is preferred; at least one metal element selected from the group consisting of Group 2 to Group 14 is more preferred; and at least one metal element selected from the group consisting of Group 2, Group 8, Group 9, Group 10, Group 11, Group 12, Group 13 and Group 14 is further preferred.

Specific examples of the metal include copper, silver, gold, platinum, palladium, nickel, tin, cobalt, rhodium, iridium, iron, ruthenium, osmium, manganese, molybdenum, tungsten, niobium, tantalum, titanium, bismuth, antimony, lead, and alloys thereof. Among these, silver or an alloy containing silver is preferred from the viewpoint of being excellent in electrical conductivity. Examples of a metal to be used for alloy containing silver include platinum, osmium, palladium, and iridium. One kind thereof may be used alone or two or more kinds thereof may be used in combination.

The shape of the metal nanowires is not particularly limited as long as the metal nanowires are formed by the above-described metal and have a hollow structure, and the shape thereof can be appropriately selected depending on the purposes. For example, it is possible to take an arbitrary shape such as a cylindrical shape, a rectangular parallelepiped shape, or a columnar shape with a polygonal cross-section. However, a cylindrical shape or a cross-sectional shape with a polygonal cross-section with rounded corners is preferred from the viewpoint of increasing transparency of the thermoelectric conversion layer. The cross-sectional shape of the metal nanowires can be examined by observing the cross-section using a transmission electron microscope (TEM).

The average short axis length (referred to as "an average short axis diameter" or "an average diameter" in some cases) of the metal nanowires is preferably 50 nm or less, more preferably 1 to 50 nm, even more preferably 10 to 40 nm, and particularly preferably 15 to 35 nm, from the same viewpoint as in the nano conductive material described above. The average short axis length is determined from the average value of measured short axis lengths obtained by observing 300 metal nanowires with a transmission electron microscope (TEM; JEM-2000FX manufactured by JEOL Ltd.). In cases where the short axis of the metal nanowires is not circular, the maximum length is used as the short axis length.

Similarly, the average long axis length (referred to as an average length in some cases) of the metal nanowires is preferably 1 μm or more, more preferably 1 to 40 μm, even more preferably 3 to 35 μm, and particularly preferably 5 to 30 μm. The average long axis length of the metal nanowires is, for example, determined from the average value of measured long axis lengths obtained by observing 300 metal nanowires with a transmission electron microscope (TEM; JEM-2000FX manufactured by JEOL Ltd.). When a metal nanowire is curved, a circle having the arc of the metal nanowire is taken into account and the value calculated from the radius and the curvature of the circle is used as the long axis length.

The metal nanowire may be produced by any method. The metal nanowire is preferably produced by reducing metal ions while heating in a solvent in which a halogen compound and a dispersing additive are dissolved, as described in JP-A-2012-230881. Detailed description of the halogen compound, the dispersing additive, the solvent, heating conditions, or the like is described in JP-A-2012-230881. In addition to the above-described production methods, the methods described in JP-A-2009-215594, JP-A-2009-242880, JP-A-2009-299162, JP-A-2010-84173, JP-A-2010-86714 or the like may be used to manufacture the metal nanowires.

The shape of the metal nanotubes is not particularly limited as long as the metal nanotubes are formed by the above-described metal and have a hollow structure. The metal nanotubes may have a single-walled structure or a multi-walled structure. From the viewpoint having excellent electrical conductivity and thermal conductivity, the metal nanotubes preferably have a single-walled structure.

The thickness (difference between the outer diameter and the inner diameter) of the metal nanotube is preferably from 3 nm to 80 nm, and more preferably from 3 nm to 30 nm, from the viewpoint of durability, transparency, film-forming properties, and electrical conductivity. The average long axis length of the metal nanotubes is preferably 1 to 40 μm, more preferably 3 to 35 μm, and even more preferably 5 to 30 μm, from the same viewpoint as in the nano conductive material described above. It is preferable that the average short axis length of the metal nanotubes be the same as the average short axis length of the metal nanowires.

The metal nanotubes may be produced by any method. For example, the method described in US 2005/0056118 or the like can be used to produce the metal nanotubes.

The metal nanoparticles may be metal fine particles having a particulate shape or a powder shape which are formed by the above-described metal, may also be metal fine particles or metal fine particles of which surfaces are covered with a protection agent, or may also be those obtained by dispersing, in a dispersion medium body, the metal fine particles of which surfaces are covered with a protection agent. As a metal to be used in metal nanoparticles, among the above-described metals, silver, copper, gold, palladium, nickel, or rhodium is preferably exemplified. In addition, an alloy made of at least two or more kinds of these or an alloy made of iron and at least one kind of these can also be used. Examples of the alloy made of two kinds include a platinum-gold alloy, a platinum-palladium alloy, a gold-silver alloy, a silver-palladium alloy, a palladium-gold alloy, a platinum-gold alloy, a rhodium-palladium alloy, a silver-rhodium alloy, a copper-palladium alloy, and a nickel-palladium alloy. Further, examples of the alloy with iron include an iron-platinum alloy, an iron-platinum-copper alloy, an iron-platinum-tin alloy, an iron-platinum-bismuth alloy, and an iron-platinum-lead alloy. These metals or alloys can be used alone or two or more kinds thereof can be used in combination.

The average particle diameter (dynamic light scattering method) of the metal nanoparticles is preferably 1 to 150 nm from the viewpoint of excellent electrical conductivity.

As the protecting agent of the metal fine particles, for example, a protecting agent described in JP-A-2012-222055 is preferably exemplified. Moreover, a protecting agent having a linear or branched alkyl chain with 10 to 20 carbon atoms, particularly, aliphatic acids or aliphatic amines, aliphatic thiols or aliphatic alcohols, and the like are further exemplified preferably. Here, when the number of carbon atoms is 10 to 20, storage stability of metal nanoparticles is high and electrical conductivity is also excellent. Aliphatic acids, aliphatic amines, aliphatic thiols, and aliphatic alcohols described in JP-A-2012-222055 are preferable.

The metal nanoparticles may be produced by any production method, and examples of the production method include an in-gas evaporation method, a sputtering method, a metal vapor synthesis method, a colloid method, an alkoxide method, a co-precipitation method, a homogeneous precipitation method, a thermal decomposition method, a chemical reduction method, an amine reduction method, and a solvent evaporation method. These production methods each have idiosyncratic features, but particularly, for the purpose of mass production, a chemical reduction method and an amine reduction method are preferably used. When these production methods are performed, as well as selecting and using the above-described protecting agent as necessary, a well-known reducing agent or the like can be appropriately used.

<Low Band Gap Material>

The thermoelectric conversion material of the present invention contains a low band gap material together with the nano conductive material described above. The low band gap material in the present invention indicates a material having an optical band gap of 0.1 eV or more and 1.1 eV or less.

Here, the band gap indicates a forbidden band and is an energy level and an energy difference from the top of the valence band (the highest energy band occupied with electrons in the band structure) to the bottom of the conduction band (the lowest energy band with no electrons).

The optical band gap in the present invention is defined by an absorption end at the long wavelength side in the absorption spectrum of the material, and specifically, is obtained by the following Equation (B).

$$\text{Optical band gap (eV)} = 1240/\text{absorption long wavelength end (nm)} \qquad \text{Equation (B)}$$

In Equation (B), the absorption long wavelength end indicates a wavelength (nm) of the absorption end at the long wavelength side in the absorption spectrum of the material. The absorption spectrum of the material can be measured by a spectrophotometer.

Specifically, the material is dissolved in a soluble organic solvent and is applied onto a quartz substrate to form a film. The absorption spectrum of this coating film is measured by a spectrophotometer. The wavelength $\lambda 5$ (unit: nm) of the absorption end at the long wavelength side in which the absorbance becomes 5% relative to the maximum value ($\lambda \max$) of the absorbance is obtained. The obtained $\lambda 5$ is set as the absorption long wavelength end and then the optical band gap (unit: eV) is calculated by Equation (B). As the spectrophotometer, an ultraviolet visible near infrared (UV-Vis-NIR) spectrophotometer or the like can be used.

The low band gap material for use in the present invention has an optical band gap of preferably 0.1 eV or more and 1.0 eV or less, more preferably 0.1 eV or more and 0.9 eV or less.

When such a low band gap material is used together with the nano conductive material in the thermoelectric conversion material, the thermoelectric conversion performance is enhanced.

For the enhancement of the thermoelectric conversion performance, it is effective to enhance the thermal excitation probability and to increase the generation amount of the thermal exciton. However, since heat energy to be used in thermoelectric conversion is smaller than light energy, the generation amount of thermal exciton is not sufficient in some cases. It is speculated that, since a material having a small band gap is used in the thermoelectric conversion material of the present invention, the thermal excitation probability is enhanced, and as a result, the generation amount of thermal exciton at a high temperature side of the thermoelectric conversion element is increased, the thermopower (Seebeck coefficient of the material) is increased, and thus the thermoelectric conversion performance is enhanced.

In addition, the carrier transportation path is formed in the material by the nano conductive material and thus the electrical conductivity is also improved. It is considered that, when the low band gap material is used together with the nano conductive material, the thermopower and the electrical conductivity are enhanced, and as a result, the thermoelectric conversion performance is further enhanced.

The content of the low band gap material in the thermoelectric conversion material is preferably 5 to 500 parts by mass and more preferably 20 to 200 parts by mass relative to 100 parts by mass of the nano conductive material, in terms of the thermoelectric conversion performance.

In the thermoelectric conversion material of the present invention, one kind of the low band gap material may be used alone or two or more kinds thereof may be used in combination.

As the low band gap material, preferably, the following charge-transfer complex, metal complex, and arylamine compound are exemplified.

1. Charge-Transfer Complex

A charge-transfer complex is exemplified as a first low band gap material.

The charge-transfer complex in the present invention is an intermolecular compound composed of an electron-donating molecule (electron donor) and an electron-withdrawing molecule (electron acceptor) and has charge-transfer interaction.

The charge-transfer theory based on the molecular orbital theory is defined by R. S. Mulliken. When the charge-transfer amount of complexes D . . . A consisting of the electron donor D (electron donor) and the electron acceptor A (electron acceptor) is denoted as δ, the following equation is established and a new absorption band (charge-transfer absorption band), which does not appear in the case of only one of the electron donor and the electron acceptor, appears at the long wavelength side. Further, as the electron affinity of the electron acceptor increases, the absorption maximum wavelength is shifted toward the long wavelength side.

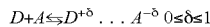

$$D+A \rightleftarrows D^{+\delta} \ldots A^{-\delta}\ 0 \leq \delta \leq 1$$

The charge-transfer complex to be used in the present invention is an organic charge-transfer complex composed of an organic electron donor and an organic electron acceptor. Both of the organic electron donor and the organic electron acceptor are not ionized or not partially ionized before the complex is formed, and are a neutral compound. If the organic electron donor and the organic electron acceptor are mixed with each other so that molecules thereof come into close contact with each other, the charge transfer only occurs so as to form the complex.

Further, in the charge-transfer complex in the present invention, it is preferable that a covalent bond in the molecules (any covalent bond in the electron donor D or any covalent bond in the electron acceptor A) be not broken, that is, be not decomposed even in the case of irradiation of an active energy ray (for example, light or heat). Here, the state where the covalent bond in the molecules is not broken means the state where the absorption maximum value of the absorption spectrum (absorption maximum of charge-transfer absorption band) is not changed in the case of irradiation of an active energy ray of 0.5 J/cm² or more and 3.0 J/cm² or less, or the state where, even if the absorption maximum value is changed, the changed value reversibly returns to the original value due to other external stimulus (for example, changes without the breakage of the covalent bond, such as cis-trans sterical isomerization, phase transition, or pair salt exchange).

An onium salt compound as one example of dopants to be described later is different from the charge-transfer complex in that both of the electron donor and the electron acceptor are ionized before a salt is formed, and are charged. Further, regarding the onium salt, the covalent bond in the molecules is irreversibly broken by irradiation of an active energy ray and this is associated with chemical decomposition. For example, regarding a sulfonium salt, the covalent bond between a sulfur atom and a carbon atom constituting a sulfonium cation is broken by irradiation of light, and radical is generated. The state where the covalent bond in the molecules is irreversibly broken means the state where the absorption maximum value of the absorption spectrum is irreversibly changed in the case of irradiation of an active energy ray of 0.5 J/cm² or more and 3.0 J/cm² or less, and the changed value does not return to the original value.

Since the charge-transfer complex to be used in the present invention has a specific optical band gap, when the charge-transfer complex is used together with the nano conductive material as described above, the performance of the thermoelectric conversion element can be enhanced. In addition, it is speculated that the configuration unique to the charge-transfer complex is also contributed to the performance enhancement of the thermoelectric conversion element.

In order to realize high thermoelectric conversion performance, it is desired to smoothly perform charge transfer between nano conductive materials in the thermoelectric conversion material. When a charge-transfer complex is used as the low band gap material, electronic interaction (π-π interaction or cation-π interaction) occurs on the surfaces of the charge-transfer complex and the nano conductive material, and the charge-transfer complex is electronically adsorbed to the surface of the nano conductive material. The charge-transfer complex adsorbed to the surface of the nano conductive material and another charge-transfer complex or nano conductive material are stacked in layers by further electronic interaction, and a carrier path can be established between the molecules of the nano conductive material. It is considered that the charge transfer between the molecules of the nano conductive material is assisted by this carrier path, the charge diffusion is accelerated, and as a result, the thermoelectric conversion performance is enhanced. Further, it is also considered that the generation amount of thermal excitation carrier is increased due to physical properties unique to the charge-transfer complex, that is, physical properties in which the charge-transfer complex is stable to heat and has ionicity, and thus the temperature gradient in the carrier distribution is increased, thereby achieving the enhancement of the thermoelectric conversion performance.

Further, when a charge-transfer complex is used as the low band gap material, it is possible to obtain a thermoelectric conversion element with excellent temporal stability.

Since the thermoelectric conversion element is used in a power supply for a wrist watch, a power supply for remote districts, a space power supply, or the like as described above, it is assumed that the thermoelectric conversion element is used under the condition at high temperature and high humidity over a long period of time. For this reason, the thermoelectric conversion element has excellent thermoelectric conversion performance at the initial stage, and in addition thereto, it is desirable that the thermoelectric conversion performance at the initial stage can be maintained over a long period of time even under high temperature and high humidity. When the charge-transfer complex is used together with the nano conductive material, it is possible to obtain an element with excellent temporal stability under high temperature and high humidity as well as high thermoelectric conversion performance. The mechanism thereof has not been completely elucidated, but is speculated as follows.

Since the electronic interaction between the charge-transfer complex and the nano conductive material is strong, this electronic bonding state is less likely to be broken even under high temperature and high humidity. Further, the bonding in the molecules of the charge-transfer complex itself is also less likely to be broken. For these reasons, when the thermoelectric conversion element is used, it is possible to suppress cracks occurring in the thermoelectric conversion layer or incorporation of impurities in air into the thermoelectric conversion layer. As a result, the thermoelectric conversion element, which can maintain the thermoelectric conversion performance at the initial stage and is excellent in the temporal stability even when the thermoelectric conversion element is used under high temperature and high humidity over a long period of time, is obtained.

Incidentally, high temperature and high humidity in the present invention indicate, for example, a temperature of 50 to 200° C. and a relative humidity of 70 to 100%.

The content of the charge-transfer complex in the thermoelectric conversion element is, from the viewpoint of thermoelectric conversion performance, relative to 100 parts by mass of the nano conductive material, preferably 5 to 500 parts by mass, more preferably 20 to 200 parts by mass. In the thermoelectric conversion material of the present invention, the charge-transfer complex may be used in one kind alone, or tow kinds or more of the charge-transfer complex may be used in combination.

The charge-transfer complex and the electron donor and electron acceptor constituting the complex to be used in the present invention may be any one of a low-molecular compound and a polymer compound, and is preferably a low-molecular compound. The weight average molecular weight of the charge-transfer complex is preferably 250 to 100,000 and more preferably 450 to 50,000. Further, the weight average molecular weight of the electron donor is preferably 150 to 100,000 and more preferably 250 to 50,000. The weight average molecular weight of the electron acceptor is preferably 100 to 1,200 and more preferably 120 to 800.

A weight average molecular weight can be measured by Gel Permeation Chromatography (GPC). For example, the average molecular weight can be obtained by performing the GPC under the configurations and conditions of Apparatus: "Alliance GPC2000 (manufactured by Waters), Column: TSKgel GMH6-HT×2+TSKgel GMH6-HTL×2 (all manufactured by Tosoh Corporation, 7.5 mm I.D.×30 cm), Column temperature: 140° C., Detector: Differential refractive index detector, Mobile phase: Solvent (for example, o-dichlorobenzene) and using standard polystyrene as the molecular weight configuration.

The electron donor constituting the charge-transfer complex of the present invention is an electron-donating organic compound and does not contain a metal atom.

The organic electron donor is preferably a compound having an aromatic ring structure. The aromatic ring structure may be an aromatic hydrocarbon ring or an aromatic heterocycle, and is preferably an aromatic heterocycle.

Here, a monocyclic heterocycle having aromaticity may be used as the aromatic hydrocarbon ring, but as a basic ring thereof, a benzene ring is exemplified.

The aromatic heterocycle is not particularly limited as long as it is a monocyclic heterocycle having aromaticity, but a 5-membered aromatic heterocycle or a 6-membered aromatic heterocycle is preferably exemplified. Examples of the hetero atom for forming the heterocycle include a sulfur atom, a nitrogen atom, an oxygen atom, a silicon atom, and a selenium atom. Among these, a sulfur atom and a nitrogen atom are preferred, and a sulfur atom is more preferred. Examples of the 5-membered aromatic heterocycle include a thiophene ring, a furan ring, a pyrrole ring, a selenophene ring, a silole ring, an imidazole ring, a pyrazole ring, an oxazole ring, an isoxazole ring, a thiazole ring, an isothiazole ring, and a triazole ring. Examples of the 6-membered aromatic heterocycle include a pyridine ring, a pyrimidine ring, a pyridazine ring, a pyrazine ring, and a triazine ring. Among them, in terms of the thermoelectric conversion performance, a 5-membered aromatic heterocycle is more preferred, a thiophene ring, a furan ring, or a pyrrole ring is further preferred, and a thiophene ring is particularly preferred.

The organic electron donor preferably contains a condensed ring structure. A ring forming the condensed ring may be an aliphatic ring or an aromatic ring, or may be a hydrocarbon ring or a heterocycle. Among these, a condensed ring having an aromatic ring structure is preferred, a condensed ring having an aromatic heterocyclic structure is more preferred, and a condensed ring of an aromatic heterocycle or a condensed ring of an aromatic hydrocarbon ring and an aromatic heterocycle is further preferred. Examples of the aromatic hydrocarbon ring and the aromatic heterocycle forming the condensed ring include the aromatic ring and the aromatic heterocycle described above and a preferable range thereof is also the same.

The condensed ring has preferably a condensed polycyclic structure in which three or more rings are condensed, more preferably a structure in which three or more rings including an aromatic ring are condensed, and further preferably a structure in which three or more rings selected from aromatic hydrocarbon rings and aromatic heterocycles are condensed.

A carbazole structure or a fluorene structure is more preferable as the condensed ring structure.

The ring structure included in the electron donor described above may have a substituent. Examples of the substituent include an alkyl group, an alkenyl group, an alkynyl group, an alkoxy group, an alkylthio group, and an amino group (including an alkylamino group and an arylamino). Among these, an alkyl group or an alkoxy group is preferred.

The alkyl group may be linear, branched, or cyclic, and a linear alkyl group is preferred. The number of carbon atoms of the alkyl group is preferably 1 to 20 and more preferably 1 to 10.

The alkyl part of the alkoxy group has the same meaning as the above-described alkyl group, and a preferable range thereof is also the same.

The alkyl part of the alkylthio group has the same meaning as the above-described alkyl group, and a preferable range thereof is also the same.

The amino group is preferably a mono- or di-alkylamino group. The alkyl part of the alkylamino group has the same meaning as the above-described alkyl group, and a preferable range thereof is also the same.

The organic electron donor that can be used in the present invention is preferably a compound having a structure represented by Formula (1A) or (1B).

Formula (1A)

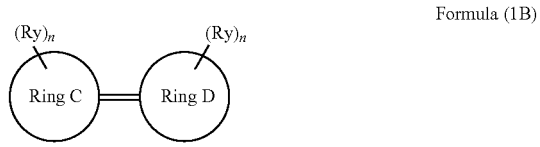

Formula (1B)

In Formulas (1A) and (1B), the ring A represents an aromatic ring; and the ring B represents an aromatic ring, a non-aromatic heterocycle, or a non-aromatic hydrocarbon ring. The ring C and the ring D each represent a non-aromatic heterocycle or a non-aromatic hydrocarbon ring. Ry represents a substituent, and n represents an integer of 0 or more.

The rings A to D may be further condensed with an aromatic ring, a non-aromatic heterocycle, or a non-aromatic hydrocarbon ring.

The aromatic rings in the rings A and B have the same meaning as the aromatic ring (the aromatic hydrocarbon ring and the aromatic heterocycle) described above, and preferable ranges thereof are also the same.

The non-aromatic heterocycles in the rings B to D are preferably a 5- to 7-membered ring. Further, the hetero atom for forming the ring is preferably a sulfur atom, a nitrogen atom, an oxygen atom, a silicon atom, or a selenium atom and may be a saturated ring or an unsaturated ring (but is not an aromatic ring).

The non-aromatic hydrocarbon rings in the rings B to D are preferably a 5- to 7-membered ring, and may be a saturated ring or an unsaturated ring (but is not an aromatic ring).

The rings A to D are preferably a heterocycle or a ring in which a heterocycle is condensed.

When there is a plurality of Rys, the plurality of Rys may be identical with or different from each other.

Ry is preferably an aromatic group (e.g., an aromatic hydrocarbon ring group, and an aromatic heterocyclic group), an alkyl group, an alkenyl group, an alkynyl group, an alkoxy group, an alkylthio group, or an amino group (including an alkylamino group and an arylamino). The aromatic group represented by Ry may be further substituted with an alkyl group, an alkenyl group, an alkynyl group, an alkoxy group, an alkylthio group, or an amino group (including an alkylamino group and an arylamino).

The structure represented by Formula (1B) is further preferably a structure represented by Formula (1B-1) or (1B-2).

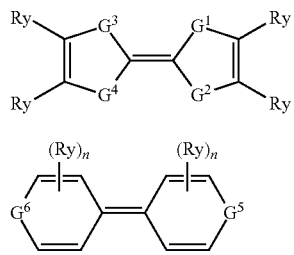

Formula (1B-1)

Formula (1B-2)

In Formulas (1B-1) and (1B-2), $G^1$ to $G^4$ each independently represent —S— or —Se—; and $G^7$ and $G^6$ each independently represent —S—, —N(Rx)—, or —CH=CH—. Rx represents a hydrogen atom or a substituent. Examples of the substituent include an alkyl group, an alkenyl group, an alkynyl group, and an alkoxy group. Rx is preferably a hydrogen atom.

In Formulas (1B-1) and (1B-2), Ry and n each have the same meaning as Ry and n in Formulas (1A) and (1B), and preferable ranges thereof are also the same.

Specific examples of the organic electron donor that can be used in the present invention are shown below, but the present invention is not limited thereto. Meanwhile, in the following specific examples, symbol * represents a linking site of the repeating unit.

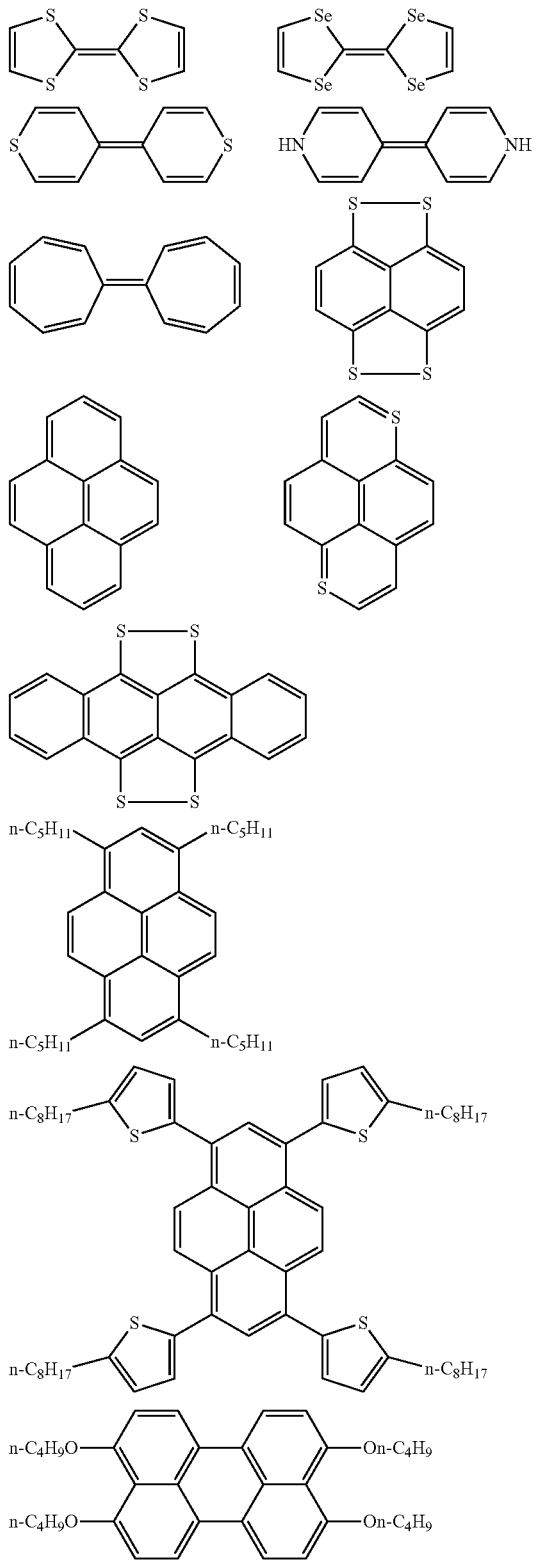

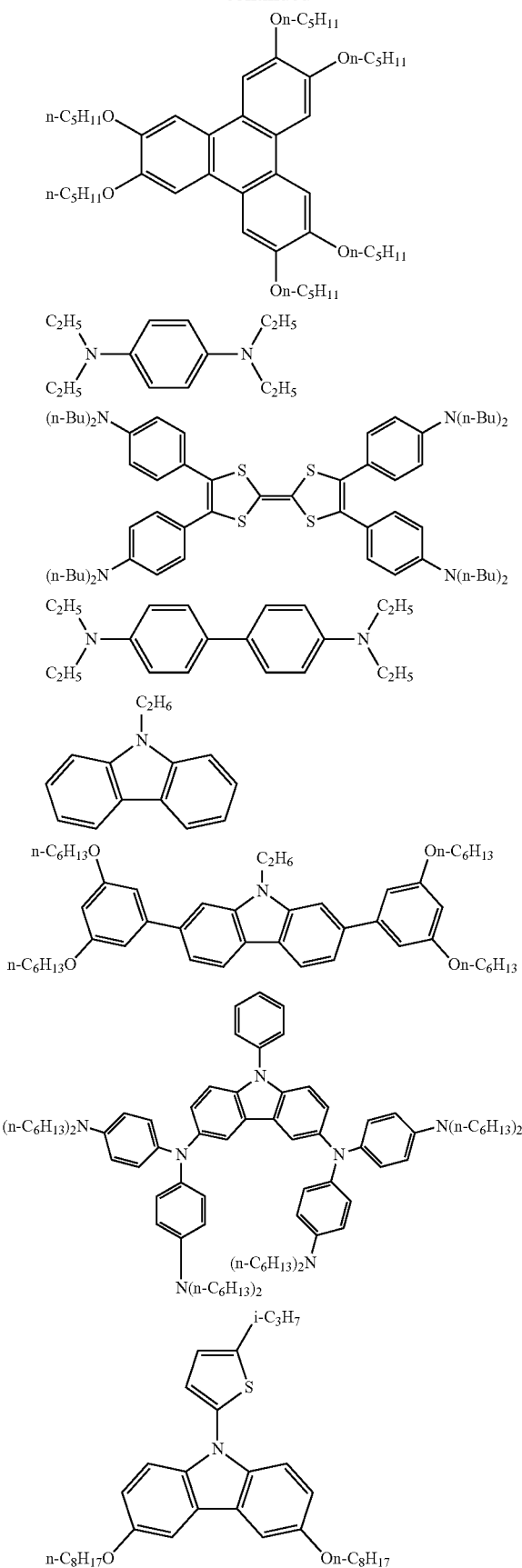
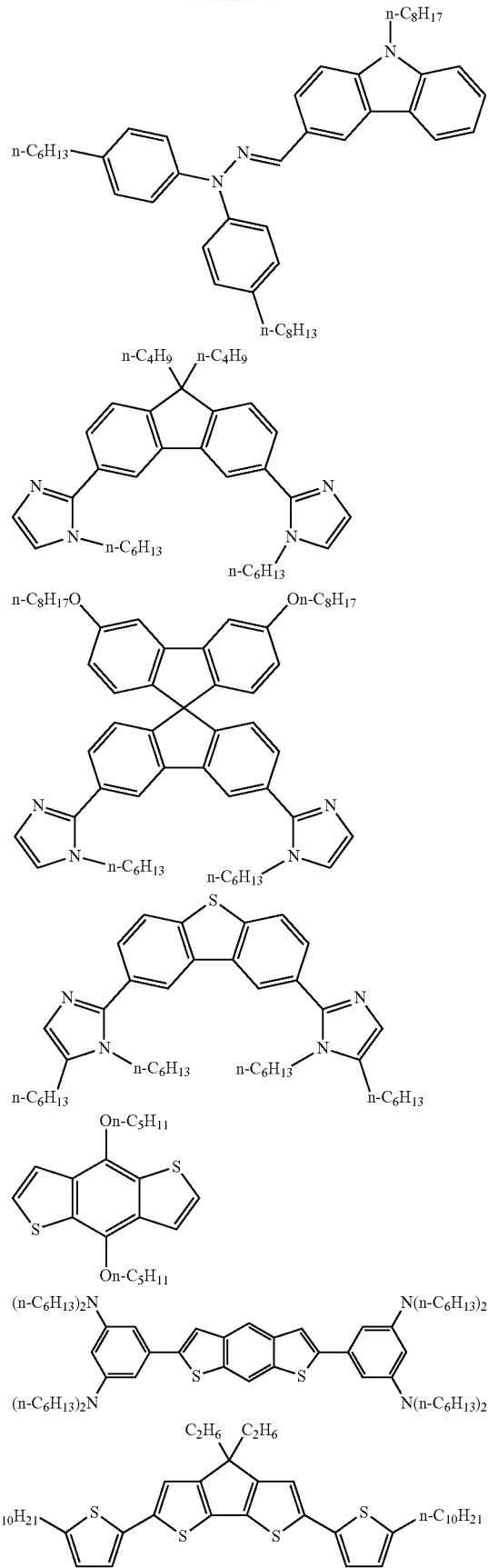

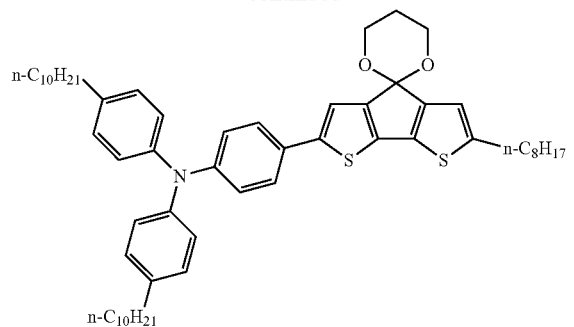
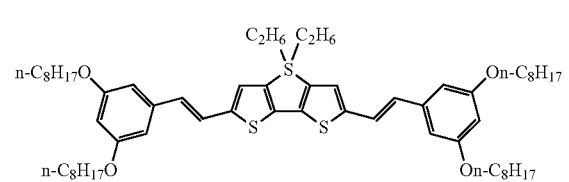
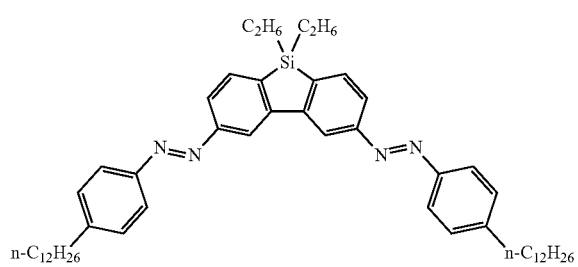
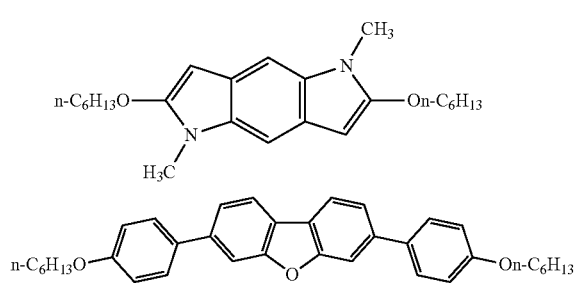
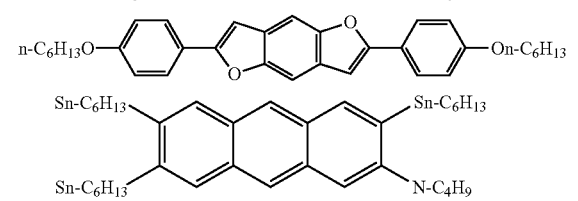
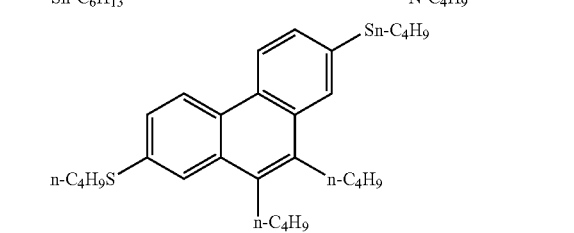
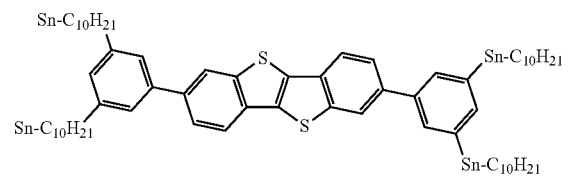
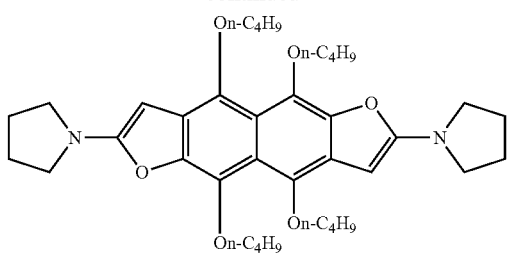
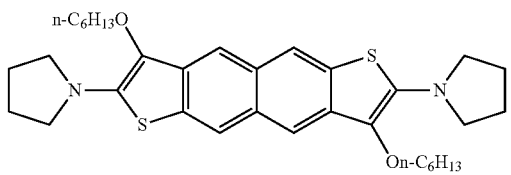
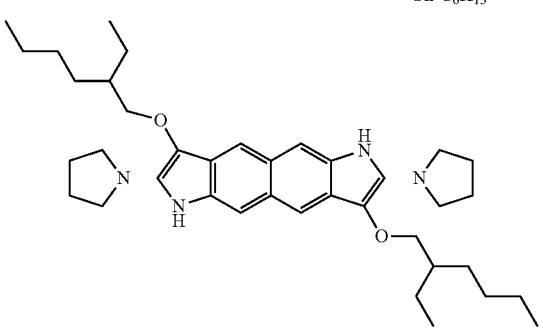
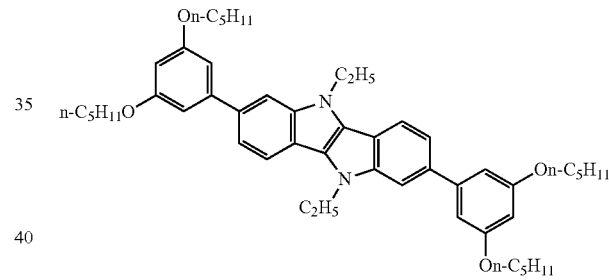
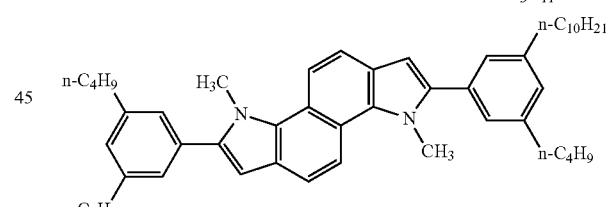
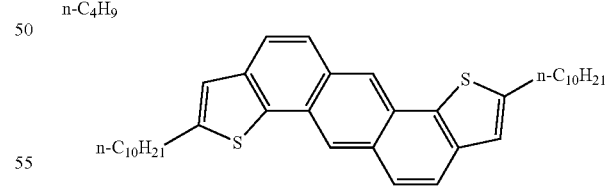
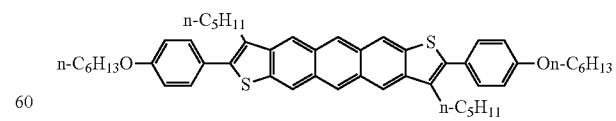
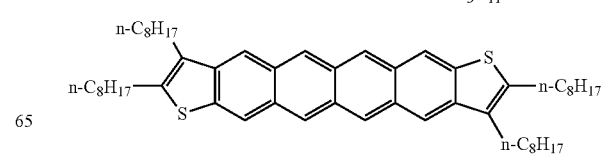

23
-continued
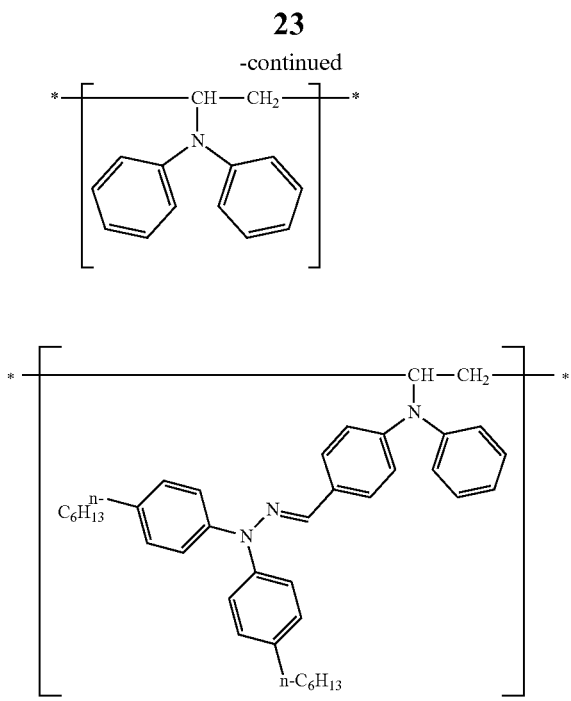
24
-continued
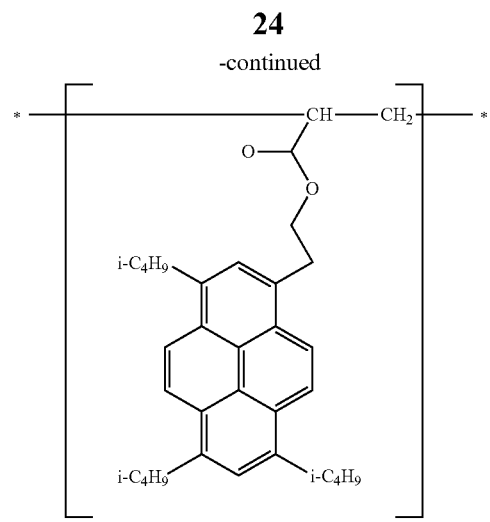
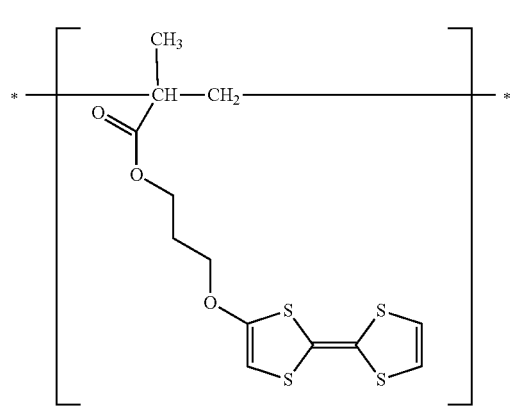
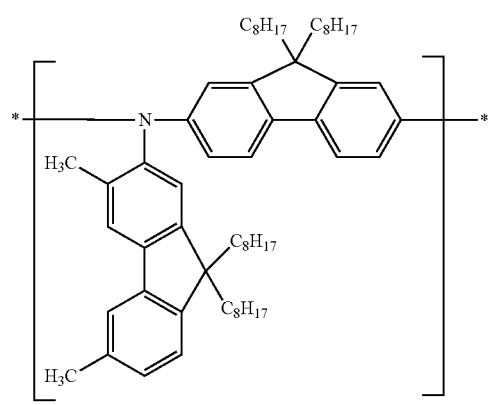
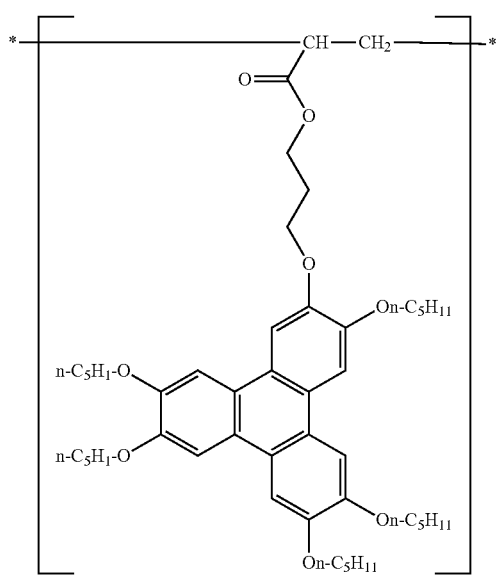
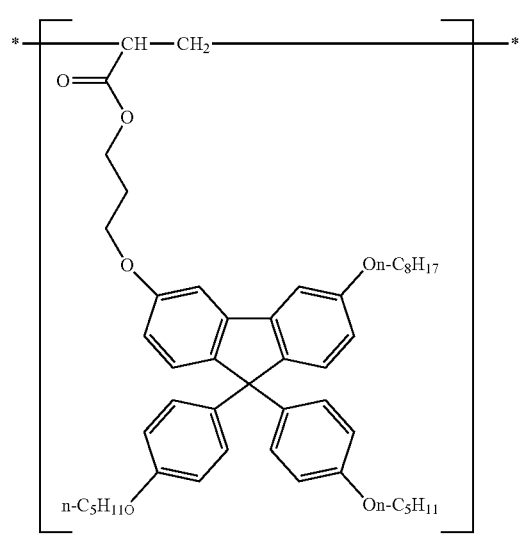

25
-continued
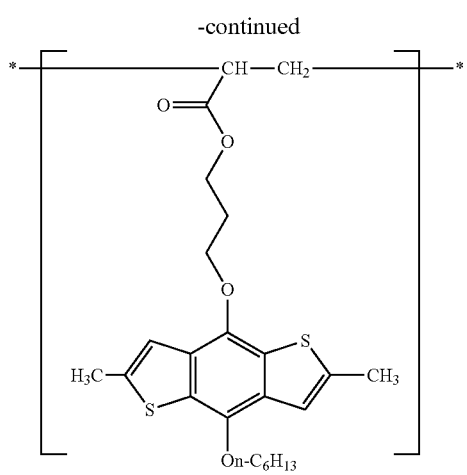
26
-continued
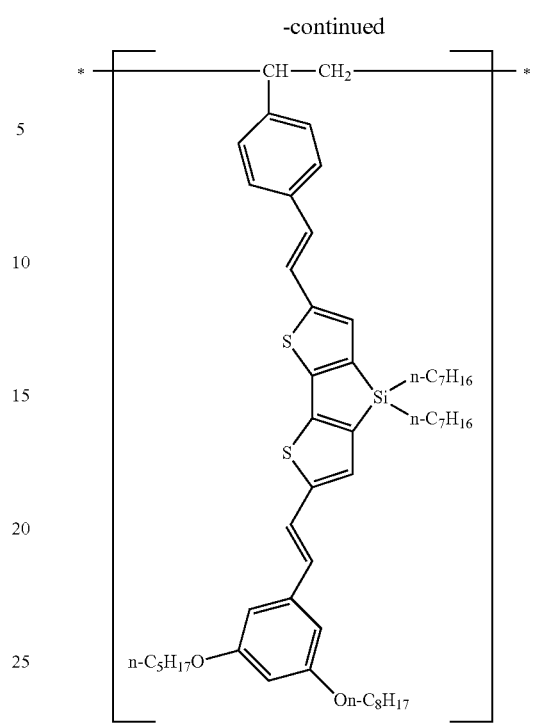
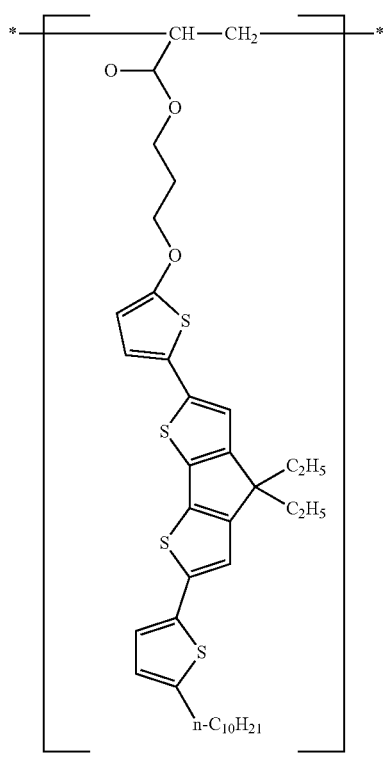
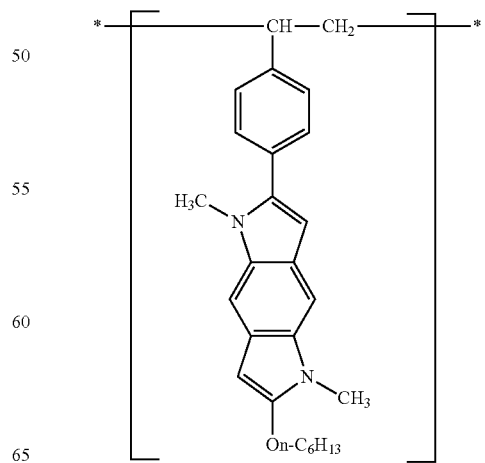

27

-continued

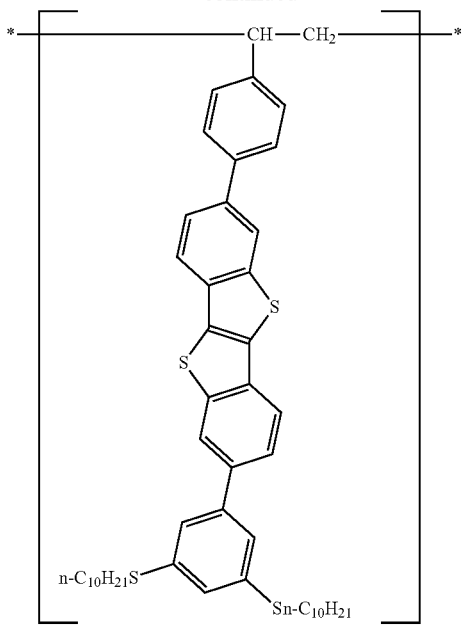

28

-continued

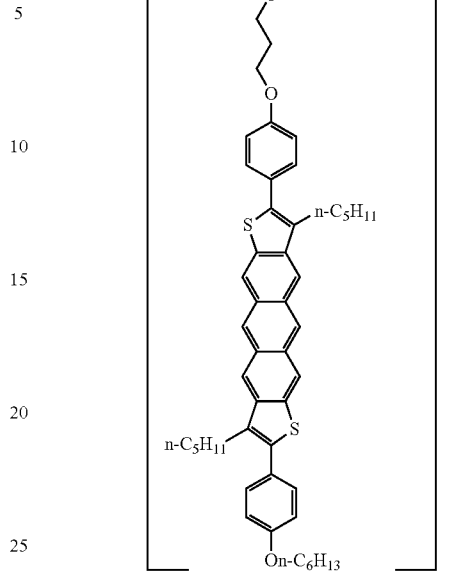

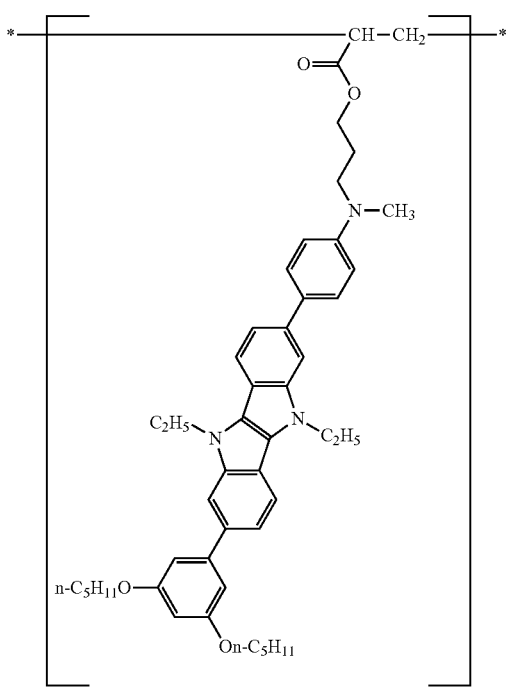

The electron acceptor constituting the charge-transfer complex of the present invention is an electron-withdrawing organic compound and does not contain a metal atom.

It is preferable that the organic electron acceptor be a compound having at least one electron-withdrawing group.

The electron-withdrawing group in the present invention means a substituent having a Hammett substituent constant $\sigma_p$ value of more than 0.

The expression "Hammett substituent constant $\sigma_p$ value" used herein will be described. The Hammett's Rule is an empirical rule proposed by L. P. Hammett in 1935 to discuss quantitatively the influence of substituents on the reaction or equilibrium of benzene derivatives, and its validity is approved widely nowadays. The substituent constant determined with the Hammett's Rule includes $\sigma_p$ value and $\sigma_m$ value, and these values can be found in many general literatures and books. For example, such values are described in detail in "Lange's Handbook of Chemistry", 12th edition (1979), edited by J. A. Dean (McGraw-Hill); and "Kagaku No Ryoiki" ("Region of Chemistry"), extra edition, No. 122, pp. 96-103 (1979) (Nankodo). Meanwhile, in the present specification, various substituents will be defined or described based on the Hammett substituent constant $\sigma_p$; however, this does not imply that the substituents are limited only to the substituents having values that exist in the literature, which are found in the textbooks described above. It is needless to say that the substituents include those substituents having constant values such that even if the values are not known in the literature, the values will be included in the range when measured based on Hammett's Rule. The organic electron acceptor that can be used in the present invention include a compound which is not a benzene derivative, but, as a scale for indicating the electron effect of the substituent, the $\sigma_p$ value is used irrespective of the substitution position. In the present invention, the $\sigma_p$ value will be used as the aforementioned meaning.

Examples of the electron-withdrawing group having the Hammett substituent constant $\sigma_p$ value of 0.60 or more include a cyano group, a nitro group, an alkylsulfonyl group (e.g., a methanesulphonyl group), and an arylsulfonyl group (e.g., a benzenesulphonyl group).

Examples of the electron-withdrawing group having the Hammett substituent constant $\sigma_p$ value of 0.45 or more include, in addition to the above-described electron-withdrawing group, an acyl group (e.g., an acetyl group), an alkoxycarbonyl group (e.g., a dodecyloxycarbonyl group), an aryloxycarbonyl group (e.g., a m-chlorophenoxycarbonyl group), an alkylsulfinyl group (e.g., a n-propylsulfinyl group), an arylsulfinyl group (e.g., a phenylsulfinyl group), a sulfamoyl group (e.g., a N-ethylsulfamoyl group, and a N,N-dimethylsulfamoyl group), an alkyl halide group (e.g., a trifluoromethyl group), an ester group, a carbonyl group, and an amide group.

Examples of the electron-withdrawing group having the Hammett substituent constant $\sigma_p$ value of 0.30 or more include, in addition to the above-described electron-withdrawing group, an acyloxy group (e.g., an acetoxy group), a carbamoyl group (e.g., a N-ethylcarbamoyl group, and N,N-dibutylcarbamoyl group), an alkoxy halide group (e.g., a trifluoromethyloxy group), an aryloxy halide group (e.g., a pentafluorophenyloxy group), a sulfonyloxy group (e.g., a methylsulfonyloxy group), an alkylthio halide group (e.g., a difluoromethylthio group), an aryl group substituted with two or more electron-withdrawing groups having the Hammett substituent constant $\sigma_p$ value of 0.15 or more (e.g., a 2,4-dinitrophenyl group, a pentachlorophenyl group), and a heterocyclic group (e.g., a 2-benzoxazoyl group, a 2-benzothiazolyl group, and a 1-phenyl-2-benzimidazolyl group).

Examples of the electron-withdrawing group having the Hammett substituent constant $\sigma_p$ value of 0.20 or more include, in addition to the above-described electron-withdrawing group, a halogen atom and the like.

In the present invention, the electron-withdrawing group is preferably an electron-withdrawing group having the Hammett substituent constant $\sigma_p$ value of 0.20 or more. Among these, a cyano group, a nitro group, an alkylsulfonyl group, an arylsulfonyl group, an acyl group, an alkylsulfinyl group, an arylsulfinyl group, a sulfamoyl group, an alkyl halide group, an alkoxycarbonyl group, an aryloxycarbonyl group, a halogen atom, and an amide group are preferred; and a cyano group, a nitro group, an alkylsulfonyl group, an arylsulfonyl group, an acyl group, an alkyl halide group, an alkoxycarbonyl group, a halogen atom, and an amide group are more preferred.

The organic electron acceptor is preferably a compound represented by Formula (2). Incidentally, when the electron acceptor is a polymer compound, a polymer having, as a repeating unit, a constituent corresponding to a compound represented by the following Formula (2) is preferred.

   Formula (2)

In Formula (2), X represents a na-valent organic group. EWG represents an electron-withdrawing group. na represents an integer of 1 or more.

In Formula (2), the electron-withdrawing group of EWG has the same meaning as the above-described electron-withdrawing group, and a preferable range thereof is also the same.

In Formula (2), X is preferably a na-valent group corresponding to a conjugated aliphatic group having two or more carbon atoms, aromatic group, or a combination group thereof.

The conjugated aliphatic group is an aliphatic group having a conjugated structure formed by an unsaturated bond, and may be linear, branched, or cyclic. Further, the conjugated aliphatic group may have a hetero atom. Specific examples of the aliphatic group include aliphatic groups corresponding to ethylene, butadiene, benzoquinone, cyclohexadiene, quinodimethane, cyclohexene, and the like. Aliphatic groups corresponding to benzoquinone, cyclohexadiene, and quinodimethane are preferred.

The aromatic group may be an aromatic hydrocarbon ring group or an aromatic heterocyclic group.

The aromatic hydrocarbon ring group may be a monocyclic hydrocarbon ring group having aromaticity, but as a basic ring thereof, benzene ring is exemplified.

The aromatic heterocyclic group is not particularly limited as long as it is a monocyclic heterocycle having aromaticity, but 5-membered aromatic heterocycle or 6-membered heterocycle is preferably exemplified. Examples of the hetero atom for forming the heterocycle include a sulfur atom, a nitrogen atom, and an oxygen atom. Among these, a sulfur atom and a nitrogen atom are preferred. Examples of the 5-membered aromatic heterocycle include a thiophene ring, a furan ring, a pyrrole ring, an imidazole ring, a pyrazole ring, an oxazole ring, an isoxazole ring, a thiazole ring, an isothiazole ring, a triazole ring, and a thiadiazole ring. Examples of the 6-membered aromatic heterocycle include a pyridine ring, a pyrimidine ring, a pyridazine ring, a pyrazine ring, and a triazine ring. Among these, a 5-membered aromatic heterocycle is more preferred; and a thiophene ring, a pyrrole ring, a thiazole ring, and a thiadiazole ring are further preferred.

These aliphatic groups or aromatic groups may have a substituent other than the electron-withdrawing group EWG described above, but it is preferable that these groups do not have the substituent.

na represents an integer of 1 or more, preferably an integer of 4 or more.

The organic electron acceptor that can be used in the present invention is preferably a compound having a structure represented by any one of Formulas (2A) to (2C).

In Formulas (2A) to (2C), Rz represents a substituent. Plural Rzs may be the same as or different from each other. Y represents an oxygen atom, or a carbon atom substituted with two electron-withdrawing groups. n represents an integer of 0 or more. Two Rzs adjacent to each other may be bonded to each other to form a ring.

The substituent in Rz is preferably an electron-withdrawing group except for a group as a pendant to be incorporated into a polymer. Incidentally, as the electron-withdrawing group, the above-described electron-withdrawing group is exemplified, and a preferable range is the same.

In Formula (2A), Rz is preferably a cyano group. In Formula (2B), Rz is preferably a halogen atom, or a cyano group; more preferably a halogen atom. In Formula (2C), Rz is preferably a halogen atom, an alkyl group, an alkenyl group, an alkynyl group, an alkoxycarbonyl group, an acyl group, a carbamoyl group, a sulfamoyl group, an alkyl- or aryl-sulfonyl group, a perfluoroalkyl group, a cyano group, or a nitro group.

In a case where Y is a carbon atom substituted with two electron-withdrawing groups, the electron-withdrawing group is preferably a cyano group or an acyl group.

The ring E is preferably a 5- or 6-membered ring, and more preferably a 6-membered ring. Further, a saturated hydrocarbon ring or an unsaturated hydrocarbon ring is preferred, and an aromatic ring, a non-aromatic heterocycle, or a non-aromatic hydrocarbon ring may be condensed to these rings. The aromatic ring, the non-aromatic heterocycle, or the non-aromatic hydrocarbon ring is preferably rings exemplified in the above Formulas (1A) and (1B).

The ring E is preferably a 6-membered ring of a quinoid structure (2,5-cyclopentadienyl-1,4-diylidene).

The rings F and G are preferably a 5- or 6-membered ring, and may be an aromatic ring, a non-aromatic heterocycle, or a non-aromatic hydrocarbon ring. The aromatic ring, the non-aromatic heterocycle, or the non-aromatic hydrocarbon ring is preferably rings exemplified in the above Formulas (1A) and (1B). Further, the aromatic ring, the non-aromatic heterocycle, or the non-aromatic hydrocarbon ring may be condensed.

The rings F and G each are preferably a ring selected from the group consisting of a benzene ring, a naphthalene ring, a pyridine ring, a thiophene ring, a thiadiazole ring, an imidazolidinone ring, a thiazole ring, a 2H-imidazole ring, a pyrazolone ring, a pyrrolidinedione ring, and a cyclopentadienone ring.

Specific examples of the organic electron acceptor that can be used in the present invention are shown below, but the present invention is not limited thereto. Meanwhile, in the following specific examples, symbol * represents a linking site of the repeating unit.

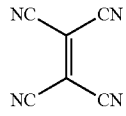
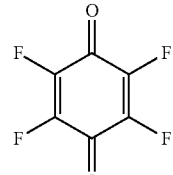
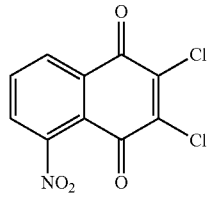
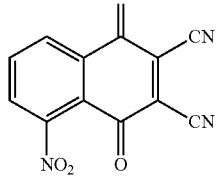

-continued

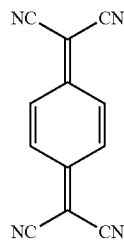
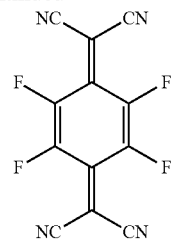
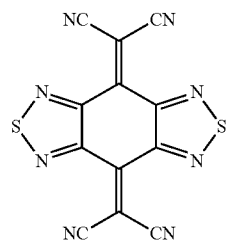
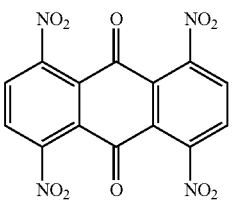
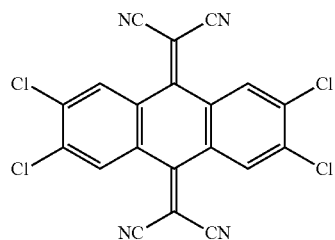
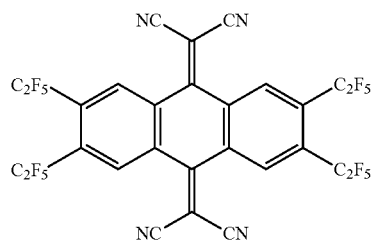
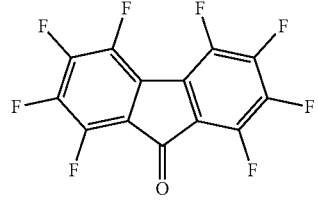
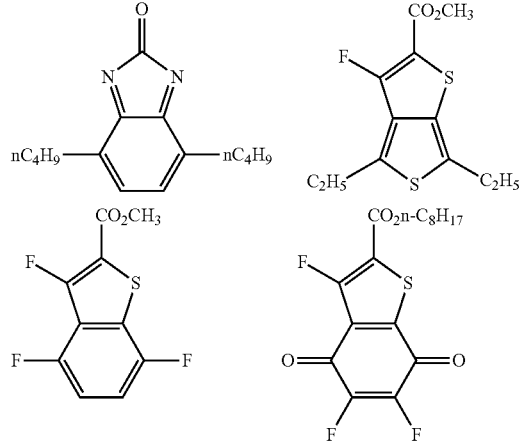

33
-continued
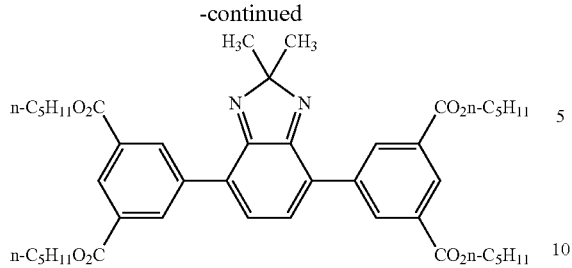
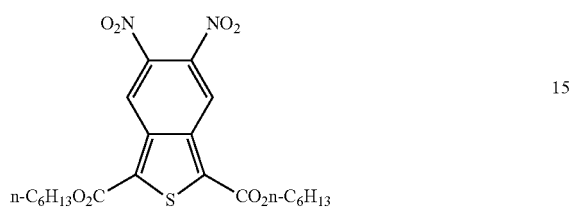
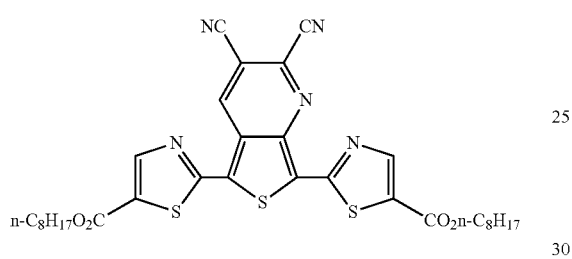
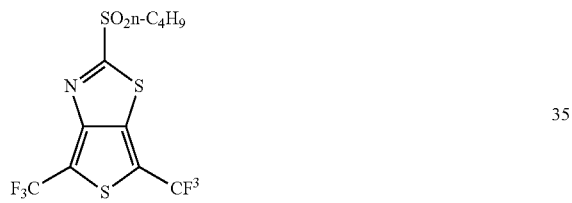
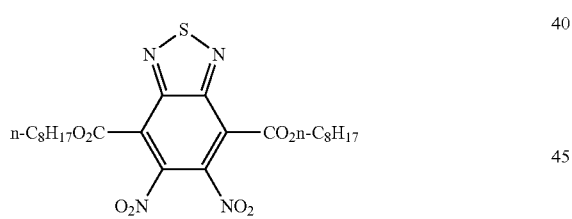
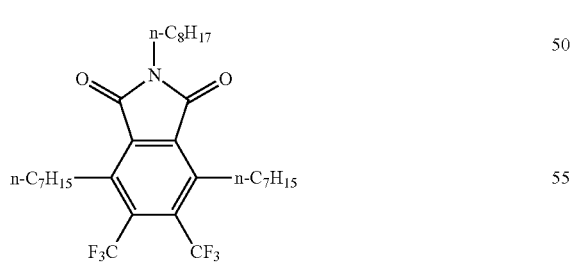
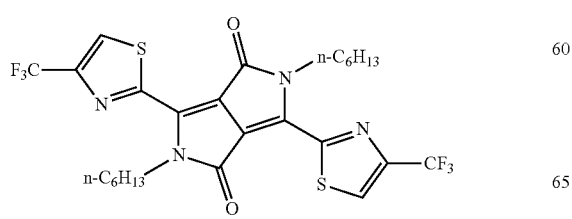
34
-continued
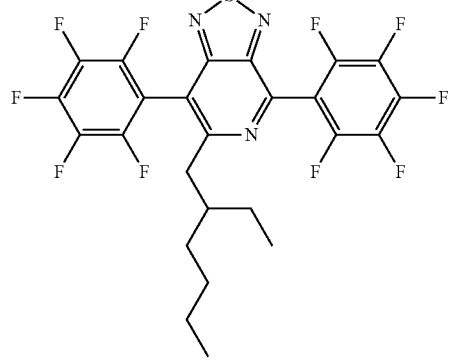
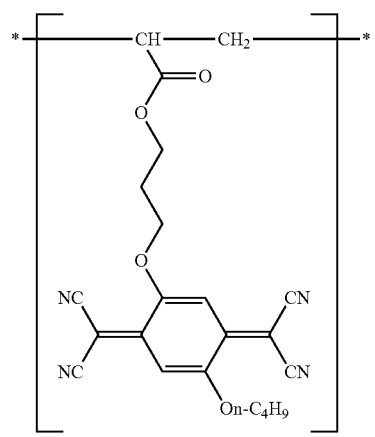
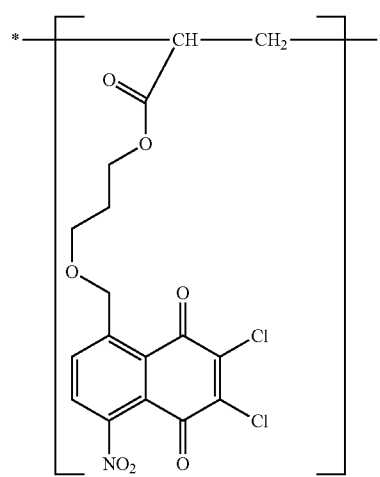
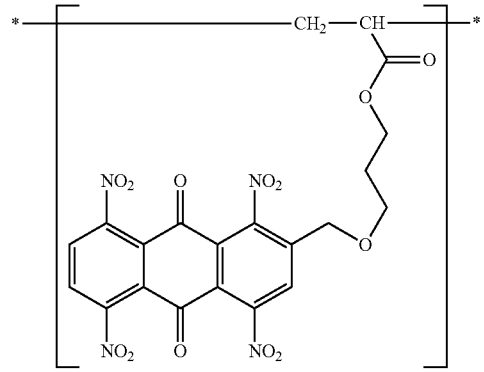

-continued

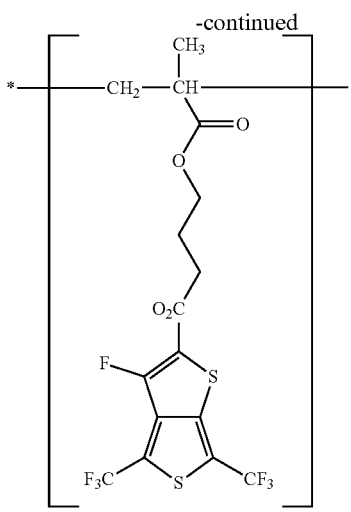

Commercially available products can also be used as the charge-transfer complex to be used in the present invention, and the charge-transfer complex may be appropriately synthesized as in Examples described later.

2. Metal Complex

A metal complex is exemplified as a second low band gap material. Since the metal complex to be used in the present invention has a specific optical band gap, when the metal complex is used together with the nano conductive material as described above, it is possible to enhance the performance of the thermoelectric conversion element.

The content of the metal complex in the thermoelectric conversion material is preferably 5 to 500 parts by mass and more preferably 20 to 200 parts by mass relative to 100 parts by mass of the nano conductive material, in terms of the thermoelectric conversion performance.

In the thermoelectric conversion material of the present invention, one kind of the metal complex may be used alone or two or more kinds thereof may be used in combination.

The central metal of the metal complex is preferably a metal atom selected from the group consisting of Ni, Fe, Cu and Sn, or a metal ion thereof.

The atom that coordinates to the central metal is preferably a hetero atom, and more preferably a sulfur atom, an oxygen atom, or a nitrogen atom. Further, among the atoms that coordinate to the central metal, at least one atom is preferably a sulfur atom or an oxygen atom.

The metal complex that can be used in the present invention is preferably metal complex represented by Formula (3).

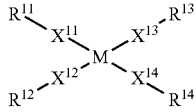

Formula (3)

In Formula (3), M represents a metal atom selected from the group consisting of Ni, Fe, Cu and Sn, or a metal ion thereof. When M is a metal ion, the compound represented by Formula (3) may have an arbitrary counter ion. $X^{11}$, $X^{12}$, $X^{13}$ and $X^{14}$ each independently represent a hetero atom; and at least one of $X^{11}$ to $X^{14}$ is a sulfur atom or an oxygen atom. $R^{11}$, $R^{12}$, $R^{13}$ and $R^{14}$ each independently represent a substituent. $R^{11}$ and $R^{12}$ may be bonded to each other, and $R^{13}$ and $R^{14}$ may be bonded to each other.

The hetero atom represented by $X^{11}$ to $X^{14}$ is preferably a sulfur atom, an oxygen atom, or a nitrogen atom.

Examples of the substituent represented by $R^{11}$ to $R^{14}$ include an alkyl group (e.g., a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group), a cycloalkyl group (e.g., a cyclopentyl group, and a cyclohexyl group), an alkenyl group (e.g., a vinyl group, and an allyl group), an alkynyl group (e.g., an ethinyl group, and a propargyl group), an aromatic hydrocarbon ring group (also referred to as "aromatic carbon ring group" or "aryl group", e.g., a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, and a biphenylyl group), an aromatic heterocyclic group (preferably a 5- or 6-membered aromatic heterocyclic group, and the hetero atom for forming the ring being preferably a sulfur atom, a nitrogen atom, an oxygen atom, a silicon atom, a boron atom, and a selenium atom, e.g., a pyridyl group, a pyrimidinyl group, a furyl group, a pyrrolyl group, an imidazolyl group, a benzimidazolyl group, a pyrazolyl group, a pyrazinyl group, a triazolyl group (e.g., a 1,2,4-triazole-1-yl group, and a 1,2,3-triazole-1-yl group), an oxazolyl group, a benzoxazolyl group, a thiazolyl group, an isoxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (which is a group in which one carbon atom for forming the carboline ring of the above-described carbolinyl group is substituted with a nitrogen atom), a quinoxalinyl group, a pyridazinyl group, a triazinyl group, a quinazolinyl group, a phthalazinyl group, a borole group, and an azaborine group), a heterocyclic group (which is an non-aromatic heterocyclic group and may be a saturated ring or unsaturated ring, preferably a 5- or 6-membered heterocyclic group, and the hetero atom for forming the ring being preferably a sulfur atom, a nitrogen atom, an oxygen atom, a silicon atom, and a selenium atom, e.g., a pyrrolidyl group, an imidazolidyl group, a morpholy group, and an oxazolyl group), an alkoxy group (e.g., a methoxy group, an ethoxy group, a propyloxy group, a pentyloxy group, a hexyloxy group, an octyloxy group, and a dodecyloxy group), a cycloalkoxy group (e.g., a cyclopentyloxy group, and a cyclohexyloxy group), an aryloxy group (e.g., a phenoxy group, and a naphthyloxy group), an alkylthio group (e.g., a methylthio group, an ethylthio group, a propylthio group, a pentylthio group, a hexylthio group, an octylthio group, and a dodecylthio group), a cycloalkylthio group (e.g., a cyclopentylthio group, and a cyclohexylthio group), an arylthio group (e.g., a phenylthio group, and a naphthylthio group), an alkoxycarbonyl group (e.g., a methyloxycarbonyl group, an ethyloxycarbonyl group, a butyloxycarbonyl group, an octyloxycarbonyl group, and a dodecyloxycarbonyl group), an aryloxycarbonyl group (e.g., a phenyloxycarbonyl group, and a naphthyloxycarbonyl group), a sulfamoyl group (e.g., an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group), an acyl group (e.g., an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, an acryloyl group, a methacryloyl group, a pheynylcarbonyl group, a naphthylcarbonyl group, and a pyridylcarbonyl group), an acyloxy group (e.g., an acetyloxy group, an ethylcarbonyloxy group, a butylcarbonyloxy group, an octyl carbonyloxy group, a dodecyl carbonyloxy group, and a phenylcarbonyloxy group), an amide group (e.g., a methylcarbonylamino group, an ethyl carbonyl amino group, a dimethyl carbonyl amino group, a propyl carbonyl amino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), a carbamoyl group (e.g., an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), an ureido group (e.g., a methylureido group, an ethylureido group, a pentylureido group, a cyclohexylureido group, an octylureido group, a dodecylureido group, a phenylureido group, a naphthylureido group, and a 2-pyridylaminoureido group), a sulfinyl group (e.g., a methylsulfinyl group, an ethylsulfinyl group, a butylsulfinyl group, a cyclohexylsulfinyl group, 2-ethylhexylsulfinyl group, a dodecylsulfinyl group, a phenylsulfinyl group, a naphthylsulfinyl group, and a 2-pyridylsulfinyl group), an alkylsulfonyl group (e.g., a methylsulfonyl group, an ethylsulfonyl group, a butylsulfonyl group, a cyclohexylsulfonyl group, a 2-ethylhexylsulfonyl group, and a dodecylsulfonyl group), an arylsulfonyl group or a heteroarylsulfonyl group (e.g., a phenylsulfonyl group, a naphthylsulfonyl group, and a 2-pyridylsulfonyl group), an amino group (including an amino group, an alkylamino group, an arylamino group and a heterocyclic amino group, e.g., an amino group, an ethylamino group, a dimethylamino group, a butylamino group, a cyclopentylamino group, a 2-ethylhexylamino group, a dodecyl amino group, an anilino group, a naphthylamino group, and a 2-pyridylamino group), a cyano group, a nitro group, a hydroxyl group, a mercapto group, and a silyl group (e.g., a trimethylsilyl group, a triisopropylsilyl group, a triphenylsilyl group, a phenyldiethylsilyl group).

Among these, preferred examples thereof include an aromatic hydrocarbon ring group, an aromatic heterocyclic group, a heterocyclic group, an aryloxy group, an arylthio group, an aryloxycarbonyl group, a sulfamoyl group, an acyl group, an acyloxy group, an amide group, and a carbamoyl group.

The metal complex represented by Formula (3) is preferably a metal complex represented by any one of Formulas (3A) to (3D).

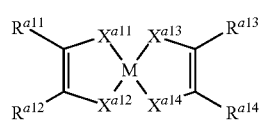

Formula (3A)

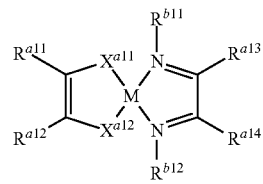

Formula (3B)

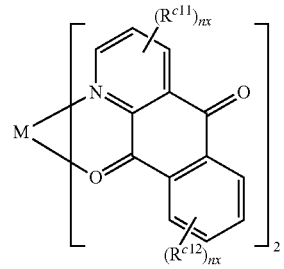

Formula (3C)

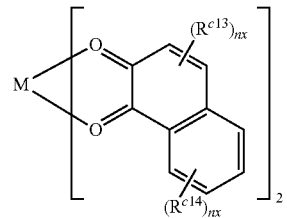

Formula (3D)

In Formulas (3A) to (3D), M has the same meaning as M in Formula (3), and a preferable range thereof is also the same. When M is a metal ion, the compound represented by any one of Formulas (3A) to (3D) may have an arbitrary counter ion. $X^{a11}$ to $X^{a14}$ each independently represent —S— or —O—. $R^{a11}$ to $R^{a14}$, $R^{b11}$ and $R^{b12}$ each independently represent a hydrogen atom or a substituent. $R^{c11}$ to $R^{c14}$ each independently represent a substituent. In $R^{a11}$ to $R^{a14}$, $R^{b11}$, $R^{b12}$, and $R^{c11}$ to $R^{c12}$, two groups adjacent to each other may be bonded to each other to form a ring. nx represents an integer of 0 or more.

Examples of the substituent represented by $R^{a11}$ to $R^{a14}$, $R^{b11}$, $R^{b12}$ and $R^{c12}$ to $R^{c14}$ include the substituent exemplified as $R^{11}$ to $R^{14}$ described above. $R^{b11}$ and $R^{b12}$ each are preferably a hydrogen atom, an alkyl group or an aryl group.

Specific examples of the metal complex are shown below, but the present invention is not limited thereto.

Metal complex 1

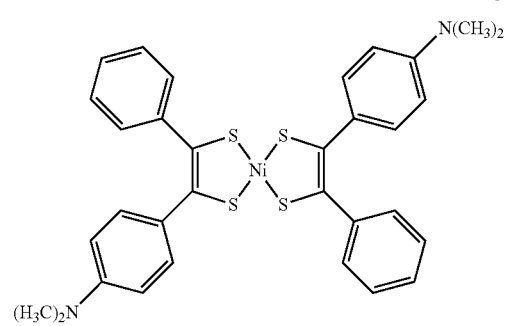

Metal complex 2

Metal complex 3
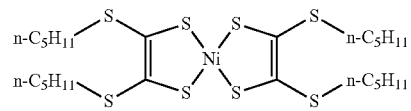
Metal complex 4
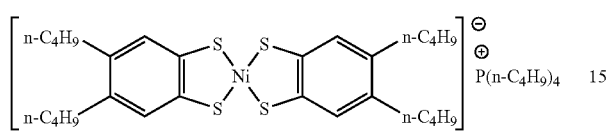
Metal complex 5
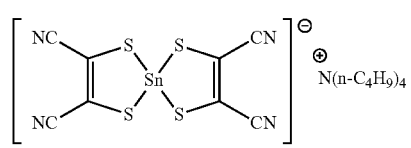
Metal complex 6
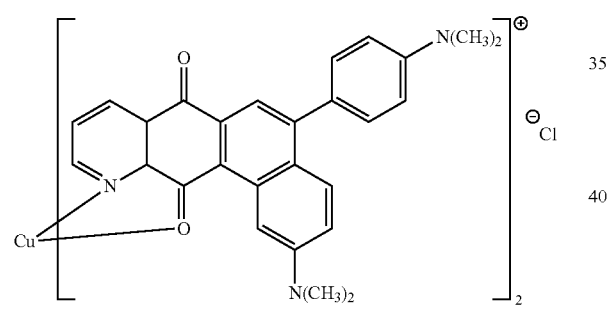
Metal complex 7
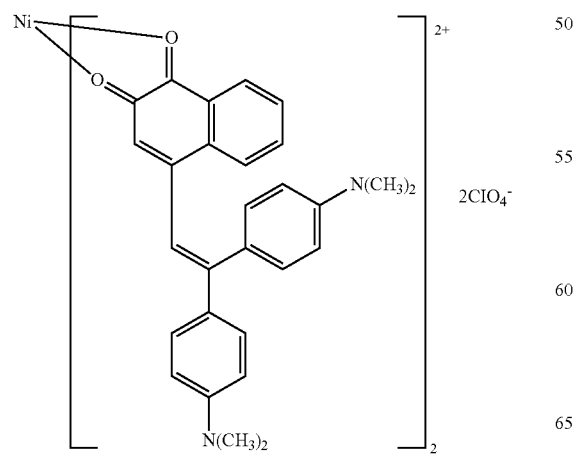
Metal complex 7
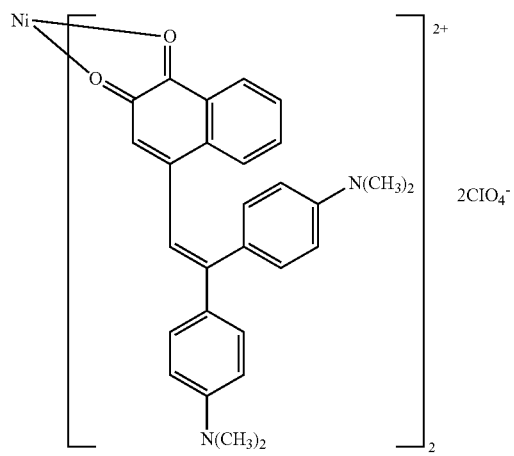
Metal complex 8
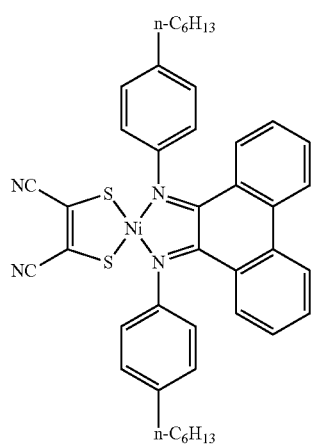
Metal complex 9
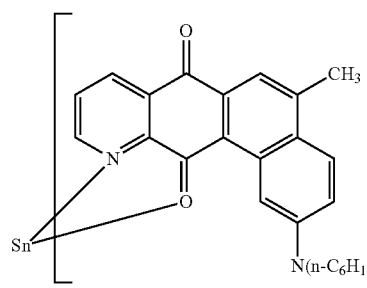
Metal complex 10
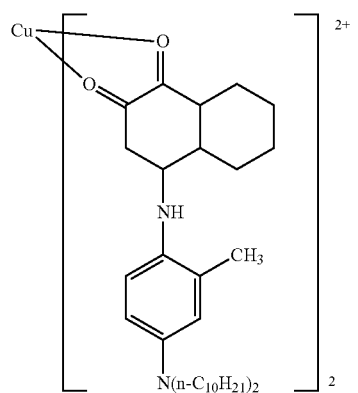

-continued

Metal complex 11

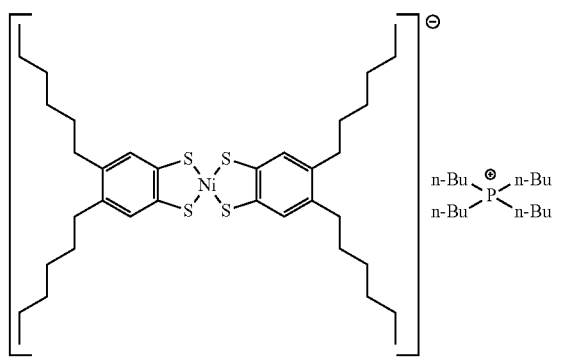

Commercially available products can also be used as the metal complex to be used in the present invention and the metal complex may be chemically synthesized.

3. Arylamine Compound

An arylamine compound is exemplified as a third low band gap material. Since the arylamine compound to be used in the present invention has a specific optical band gap, when the arylamine compound is used together with the nano conductive material as described above, it is possible to enhance the performance of the thermoelectric conversion element.

The content of the arylamine compound in the thermoelectric conversion material is preferably 5 to 500 parts by mass and more preferably 20 to 200 parts by mass relative to 100 parts by mass of the nano conductive material, in terms of the thermoelectric conversion performance.

In the thermoelectric conversion material of the present invention, one kind of the arylamine compound may be used alone or two or more kinds thereof may be used in combination.

The arylamine compound that can be used in the present invention is preferably a one-electron oxidized derivative of an arylamine compound represented by Formula (4A), or a two-electron oxidized derivative of an aryl amine compound represented by Formula (4B).

Formula (4A)

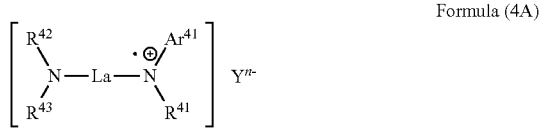

In Formula (4A), La represents an arylene group, a heteroarylene group, or a combination group thereof. $Ar^{41}$ represents an aromatic hydrocarbon ring group or an aromatic heterocyclic group. $R^{41}$ to $R^{43}$ each independently represent an aromatic hydrocarbon ring group, an aromatic heterocyclic group, an alkyl group, an aryl group, or a cycloalkyl group. Y represents an arbitrary counter anion. n of $n^-$ represents an integer of 1 or more.

Here, when n is 2 or more, any one of $Ar^{41}$ and $R^{41}$ to $R^{43}$ has a cationic substituent or a partial structure (preferably radical cation of another nitrogen atom), but does not have a nitrogen atom subjected to one-electron oxidation at a position where π-conjugation with the nitrogen atom subjected to one-electron oxidation is carried out. It is necessary to break the conjugation in an alkylene group or the like. If a nitrogen atom subjected to one-electron oxidation is present at the conjugated position, a quinoid structure is adopted.

The oxidation state of a two or more electron oxidized derivative is unstable and n is preferably 2.

The arylene group in La is preferably a phenylene group. The heterocycle of the heteroarylene group in La is preferably a 5- or 6-membered ring, or a benzene ring and a heterocycle may be condensed. For example, a thiophene ring, a thiazole ring, a pyridine ring, or the like is exemplified. Specific examples thereof include thiophene-2,5-diyl and benzo[1,2-b:4,5-b']dithiophene-2,6-diyl. Further, as the combination group thereof, a biphenylene group is exemplified.

The one-electron oxidized derivative of the arylamine compound represented by Formula (4A) is preferably a one-electron oxidized derivative represented by Formula (4A-1).

Formula (4A-1)

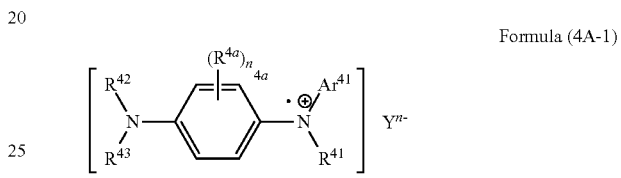

In Formula (4A-1), $Ar^{41}$, $R^{41}$ to $R^{43}$, Y and $n^-$ each have the same meaning as $Ar^{41}$, $R^{41}$ to $R^{43}$, Y and $n^-$ in Formula (4A), and preferable ranges thereof are also the same. $R^{4a}$ represents a substituent. $n_{4a}$ represents an integer of 0 to 4.

The substituent represented by $R^{4a}$ is preferably an alkyl group or a halogen atom.

On the other hand, the two-electron oxidized derivative has a quinoid structure (quinonediimine structure).

Formula (4B)

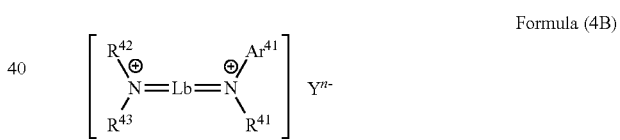

In Formula (4B), Lb represents a group having a quinoid structure of an aromatic hydrocarbon ring, a group having a quinoid structure of an aromatic heterocycle, or a combination group thereof. $Ar^{41}$, $R^{41}$ to $R^{43}$, Y and $n^-$ each have the same meaning as $Ar^{41}$, $R^{41}$ to $R^{43}$, Y and $n^-$ in Formula (4A), and preferable ranges thereof are also the same. "n" in $n^-$ represents an integer of 2 or more.

Here, when n is 3 or more, that is, in the case where any one of $Ar^{41}$ and $R^{41}$ to $R^{43}$ has a cationic substituent or a partial structure, oxidation state of two or more electron oxidized derivative is unstable, and thus n is preferably 2.

The group having a quinoid structure of an aromatic hydrocarbon ring in Lb is preferably a group having a quinoid structure of a benzene ring (2,5-cyclohexadienyl-1,4-diylidene). The aromatic heterocycle in the group having the quinoid structure of the aromatic heterocycle in Lb is preferably a 5- or 6-membered ring, a benzene ring and a heterocycle may be condensed, and for example, a thiophene ring, a thiazole ring, a pyridine ring, or the like is exemplified. Specific examples thereof include thiophenyl-2,5-diylidene and benzo[1,2-b:4,5-b']dithiophenyl-2,6-diylidene. Further, as the combination group thereof, a group having a quinoid structure of a biphenylene group is exemplified.

The two-electron oxidized derivative of the arylamine compound represented by Formula (4B) is preferably a two-electron oxidized derivative represented by Formula (4B-1).

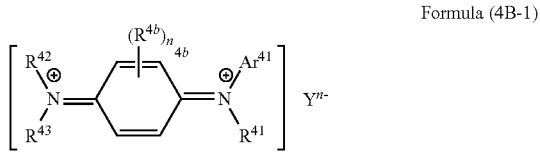

Formula (4B-1)

In Formula (4B-1), $Ar^{41}$, $R^{41}$ to $R^{43}$, Y and $n^-$ each have the same meaning as $Ar^{41}$, $R^{41}$ to $R^{43}$, Y and $n^-$ in Formula (4B), and preferable ranges thereof are also the same. $R^{4b}$ represents a substituent. $n_{4b}$ represents an integer of 0 to 4.

The substituent represented by $R^{4b}$ is preferably an alkyl group or a halogen atom.

The arylamine compound that can be used in the present invention is preferably a compound represented by Formula (5), or a one- or two-electron oxidized derivative of the compound represented by Formula (5). The one- or two-electron oxidized derivative of the arylamine compound represented by Formula (5) may have an arbitrary counter anion.

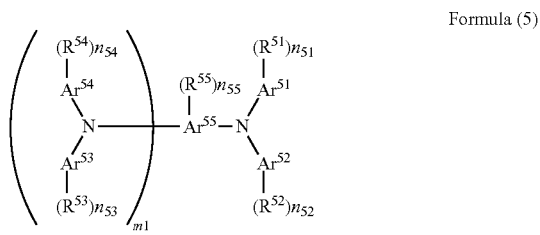

Formula (5)

In Formula (5), $Ar^{51}$ to $Ar^{55}$ each independently represent an aromatic hydrocarbon ring, an aromatic heterocycle, a single bond, or an alkylene group, proviso that at least one of $Ar^{51}$ and $Ar^{52}$ is an aromatic hydrocarbon ring and at least one of $Ar^{53}$ and $Ar^{54}$ is an aromatic hydrocarbon ring. $R^{51}$ to $R^{55}$ each independently represent a substituent. $n_{51}$ to $n_{55}$ each independently represent an integer of 0 to 3. m1 represents 0 or 1.

Examples of the aromatic hydrocarbon ring represented by $Ar^{51}$ to $Ar^{55}$ include a benzene ring and a naphthalene ring. Among these, a benzene ring is preferred.

Examples of the aromatic heterocycle represented by $Ar^{51}$ to $Ar^{55}$ include a pyrrole ring, a thiophene ring, a furan ring, an imidazole ring, a pyrazole ring, an oxazole ring, an isoxazole ring, a thiazole ring, an isothiazole ring, a silole ring, a selenophene ring, a tellurophene ring, a benzoquinone ring, a cyclopentadiene ring, a pyridine ring, a pyridone-2-one ring, a pyrimidine ring, a pyridazine ring, a pyrazine ring, and a triazine ring. Among these, a thiophene ring, a furan ring and a pyridine ring are preferred.

As the alkylene group of $Ar^{51}$ to $Ar^{55}$, an alkylene group having 2 to 14 carbon atoms is exemplified, and an alkylene group having 2 to 8 carbon atoms is preferred.

Examples of the substituent represented by $R^{51}$ to $R^{55}$ include an alkyl group, an alkenyl group, an alkynyl group, an amino group, a dialkylamino group, a diarylamino group, N-alkyl-N-arylamino group, an alkoxy group, an aryloxy group, an alkylthio group, an arylthio group, and a halogen atom. These groups may be further substituted. For example, an aryl part of a diarylamino group may be further substituted with a dialkylamino group or a diarylamino group. Further, a hydrogen atom in an alkyl part of these groups may be substituted with a halogen atom. $R^{51}$ to $R^{55}$ each are preferably a dialkylamino group, a diarylamino group, or an alkoxy group; and more preferably an alkylamino group.

The one-electron oxidized derivative of the compound represented by Formula (5) is a derivative in which a nitrogen atom (>N—) with which at least one aromatic ring included in the above Formula (5) is substituted becomes a radical cation (>N.$^+$—).

Incidentally, in the present specification, the one-electron oxidized derivative means an oxidation state on one nitrogen atom, and includes a derivative in which another nitrogen atom present at a position at which a quinoid structure cannot be formed is subjected to one-electron oxidation so as to have two or more radical cationic nitrogen atoms in total.

Specific examples of the arylamine compound that can be used in the present invention are shown below, but the present invention is not limited thereto. Further, these compounds may have an arbitrary counter anion.

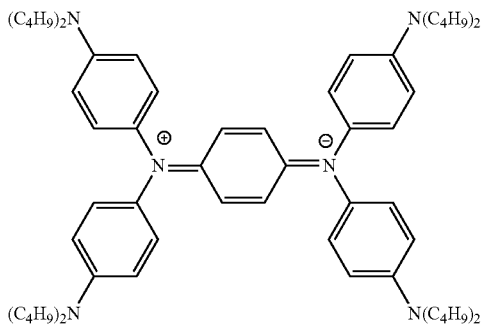

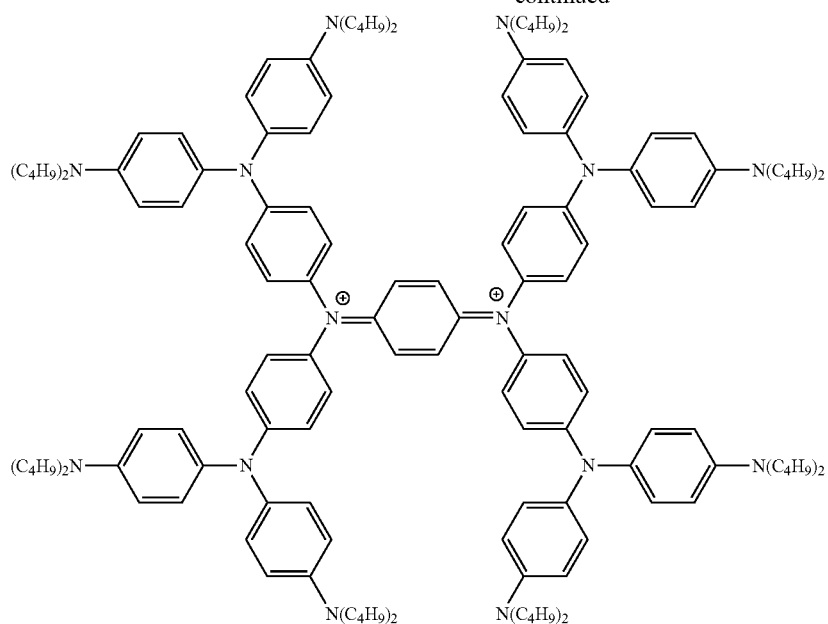
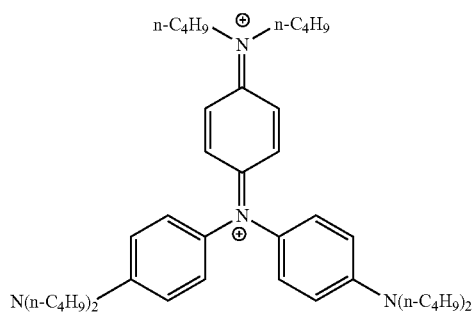
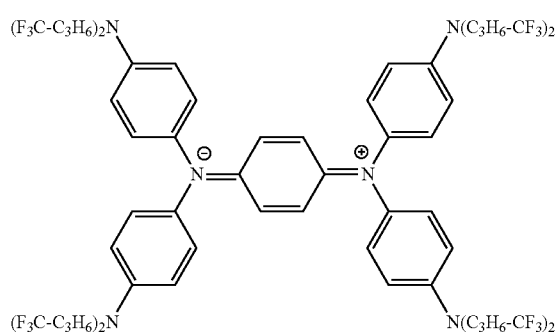
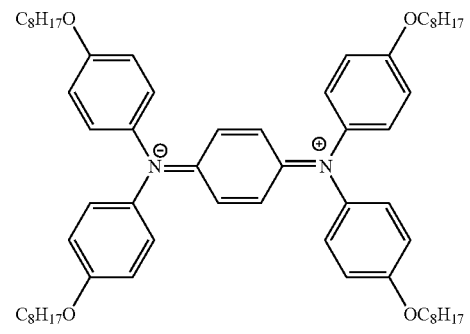

-continued
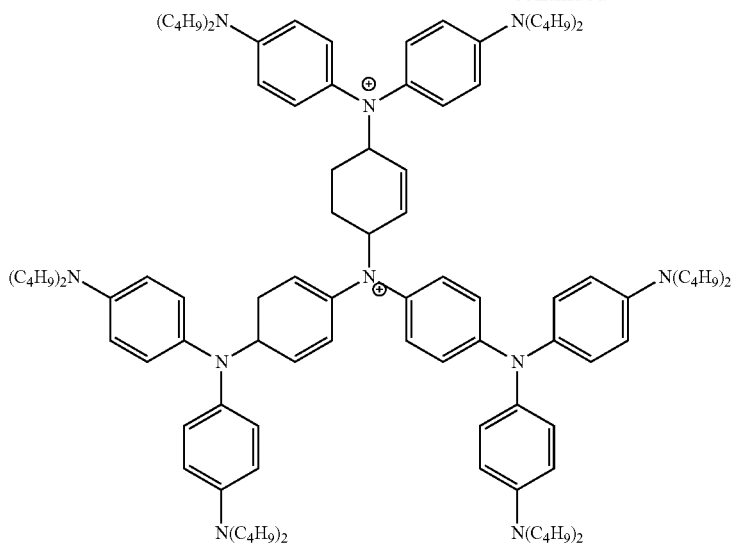
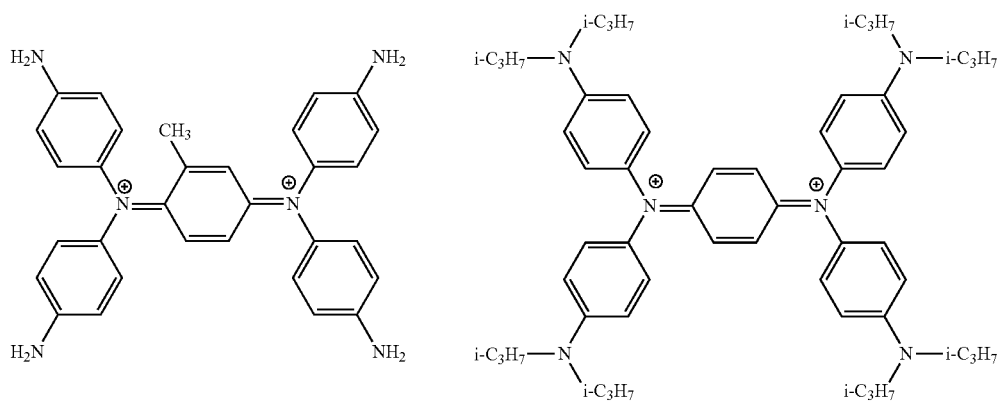
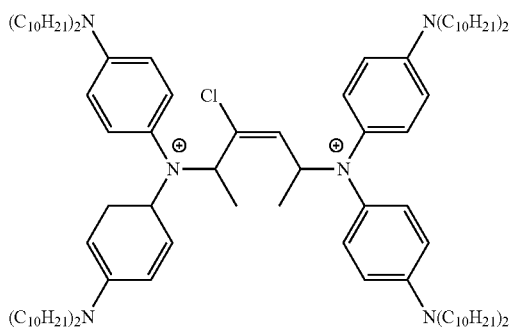
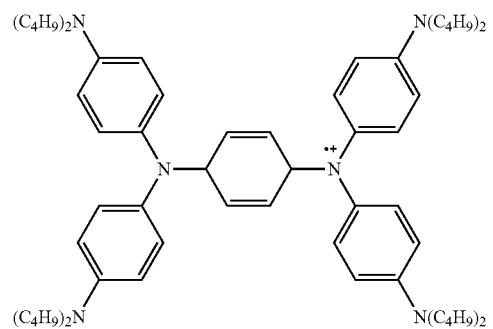

-continued
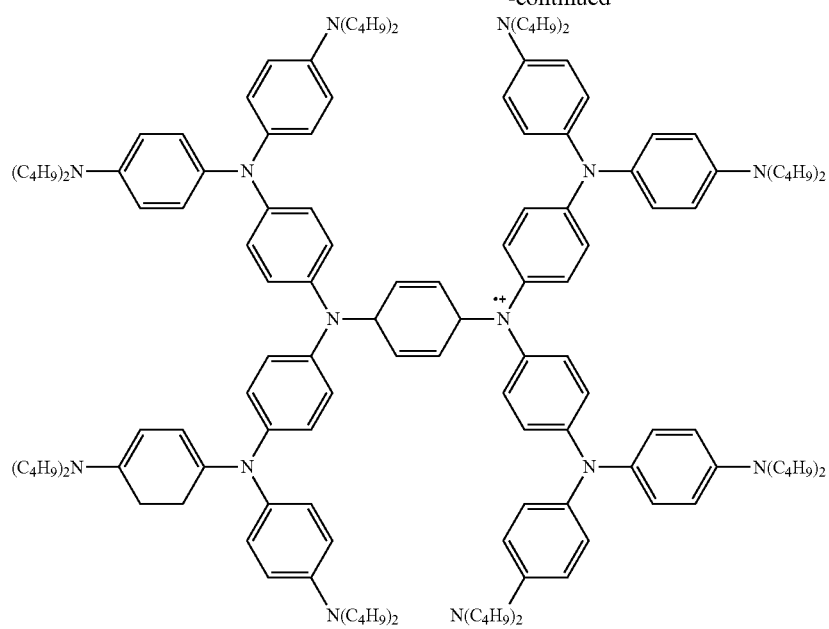
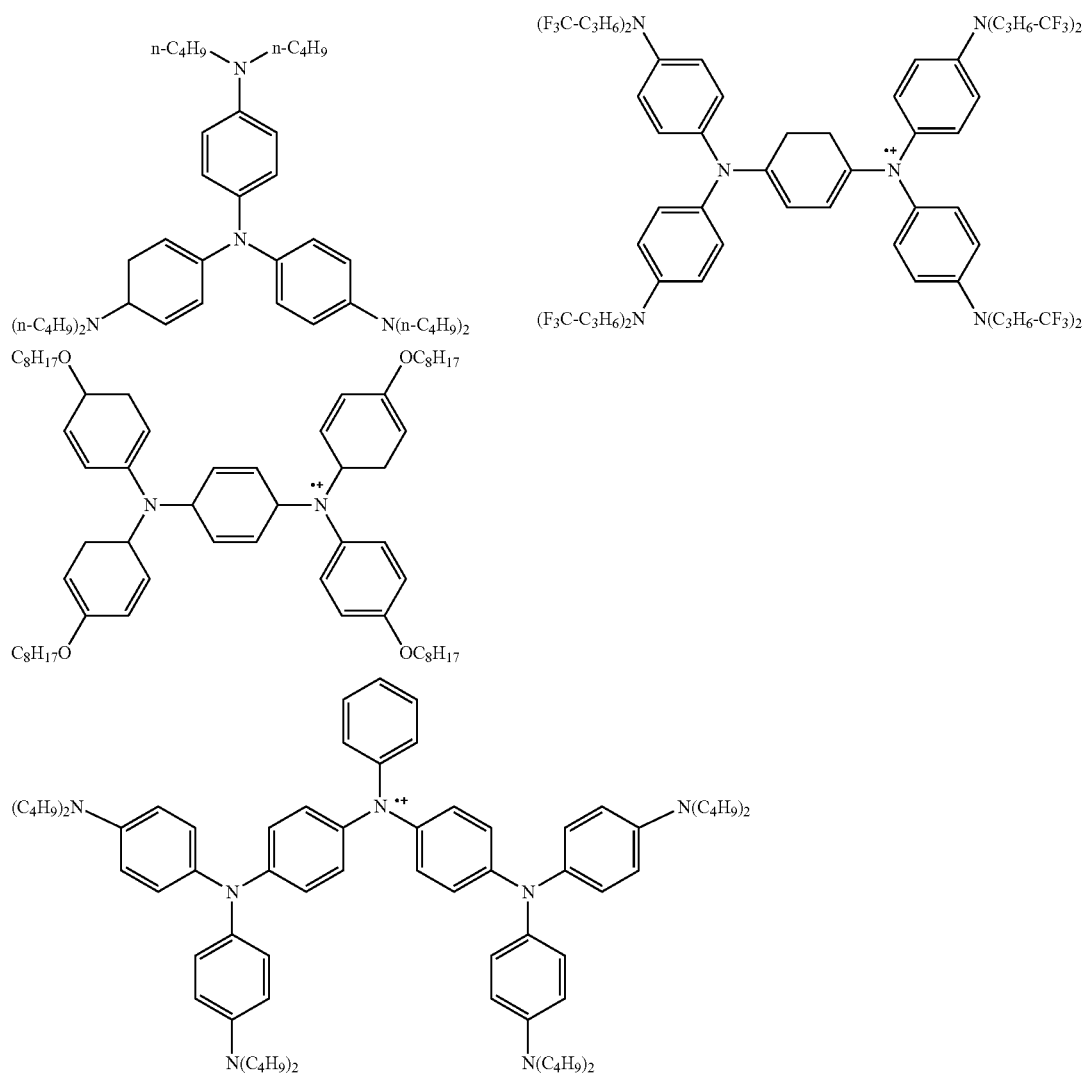

51
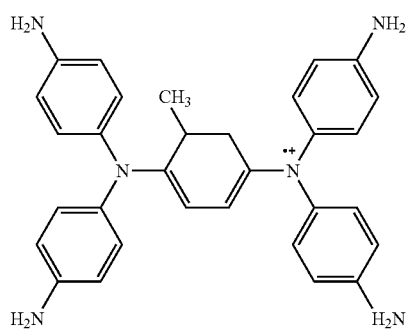
52
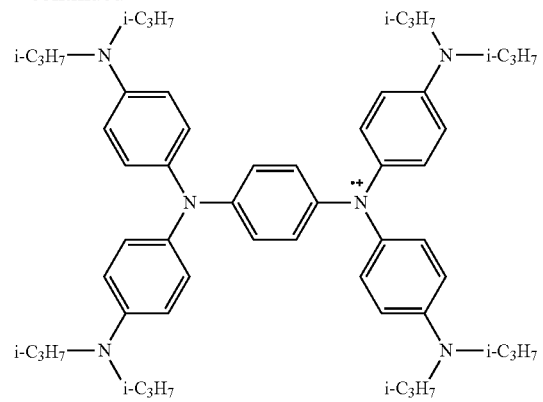
-continued
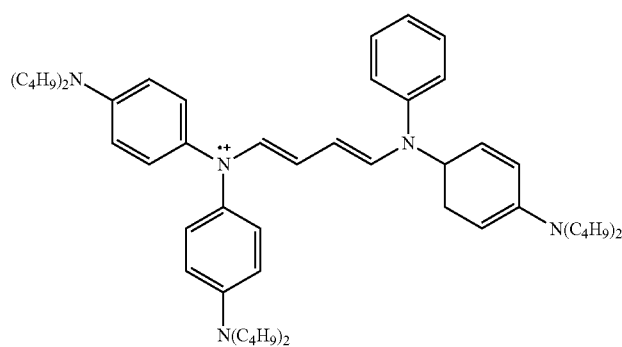
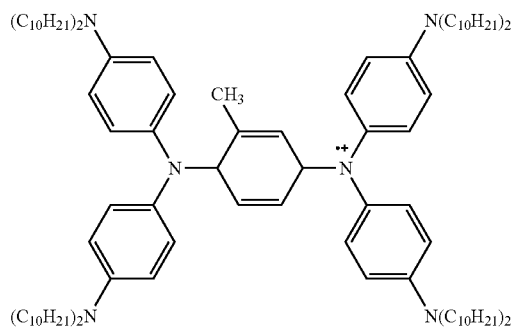
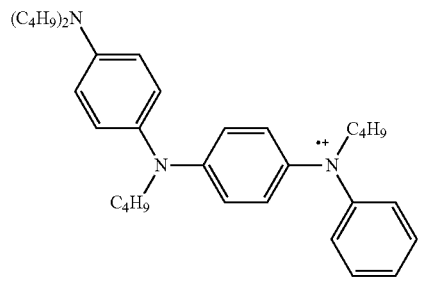
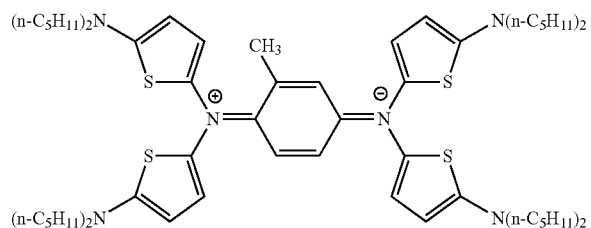
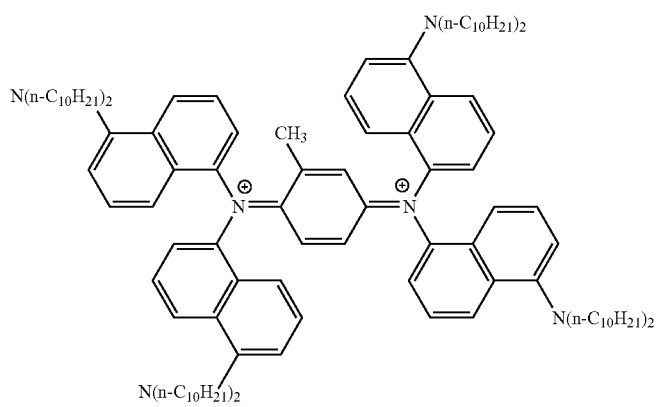

-continued

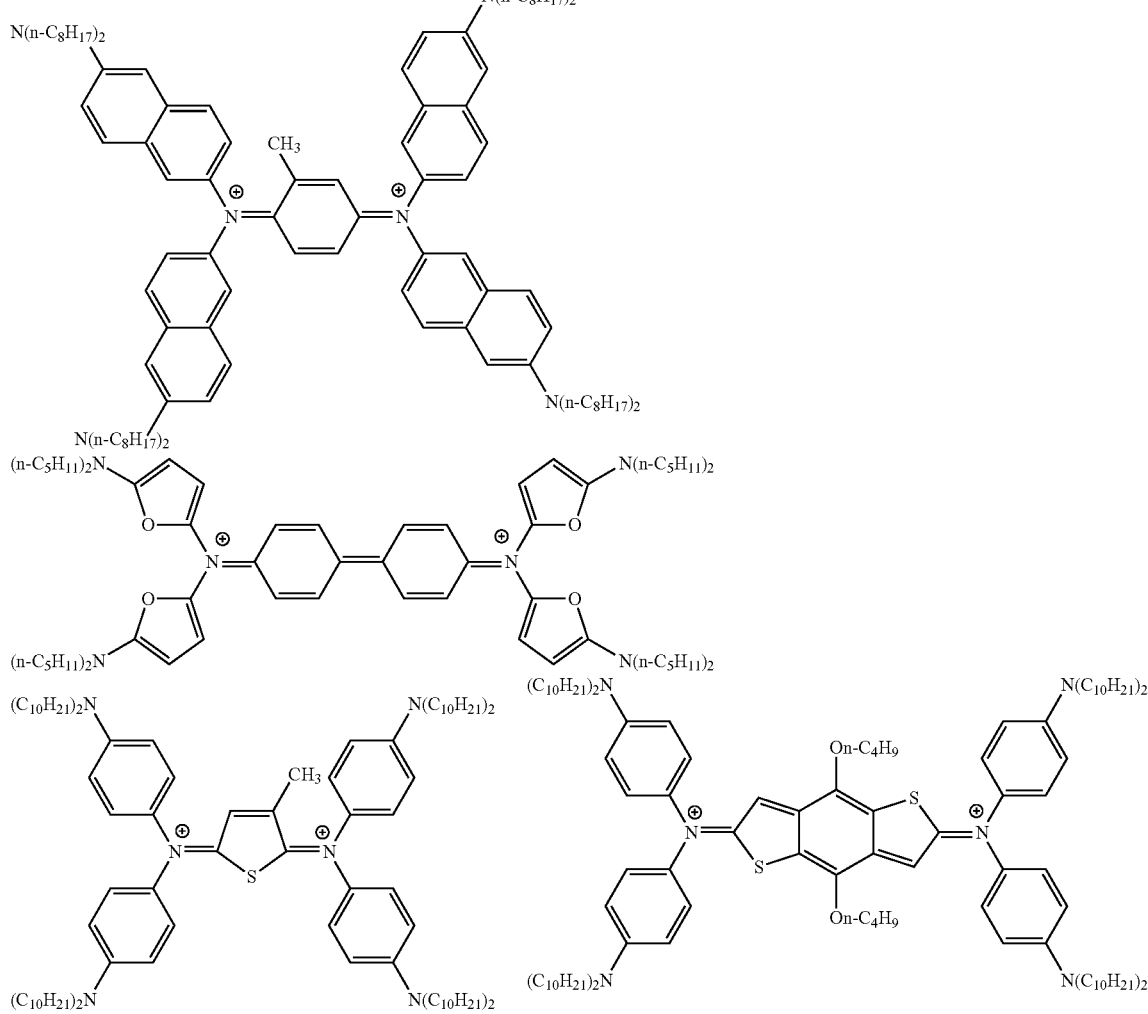

Commercially available products can also be used as the arylamine compound to be used in the present invention and the arylamine compound may be chemically synthesized.

<Polymer Compound>

The thermoelectric conversion material of the present invention preferably contains a polymer compound in addition to the nano conductive material and the low band gap material. When the thermoelectric conversion material contains the polymer compound, the thermoelectric conversion performance of the thermoelectric conversion element can be further enhanced.

Examples of the polymer compound include a conjugated polymer and a non-conjugated polymer. The thermoelectric conversion material of the present invention preferably contains at least one of the conjugated polymer and the non-conjugated polymer and more preferably contains both of the conjugated polymer and the non-conjugated polymer. Further, two or more conjugated polymers or non-conjugated polymers may be contained. When the thermoelectric conversion material contains both of the conjugated polymer and the non-conjugated polymer, still further enhancement of the thermoelectric conversion performance can be realized.

The polymer compound may be a homopolymer or a copolymer. When the polymer compound is a copolymer, the polymer compound may be a block copolymer, a random copolymer, or an alternate copolymer. Moreover, the polymer compound may also be a graft copolymer or the like.

The content of the polymer compound in the thermoelectric conversion material is not particularly limited, but in terms of the thermoelectric conversion performance, is preferably 10 to 80% by mass, more preferably 20 to 70% by mass, and further preferably 30 to 60% by mass in the total solid content of the thermoelectric conversion material, that is, in the thermoelectric conversion layer.

The content of the conjugated polymer compound in the thermoelectric conversion material is not particularly limited, but in terms of the thermoelectric conversion performance, within the range that suffices the above-described content of the polymer compound, is preferably 15 to 70% by mass, more preferably 25 to 60% by mass, and further preferably 30 to 50% by mass in the total solid content of the thermoelectric conversion material, that is, in the thermoelectric conversion layer.

Similarly, the content of the non-conjugated polymer compound in the thermoelectric conversion material is not particularly limited, but in terms of the thermoelectric conversion performance, within the range that suffices the above-described content of the polymer compound, is preferably 20 to 70% by mass, more preferably 30 to 65% by mass, and further preferably 35 to 60% by mass in the total solid content of the thermoelectric conversion material, that is, in the thermoelectric conversion layer.

1. Conjugated Polymer

The conjugated polymer is not particularly limited as long as it is a compound having a main chain with a structure which is conjugated by π electrons or lone-pair electrons (a lone pair). As such a conjugated structure, for example, a structure in which a single bond and a double bond are alternately connected in a carbon-to-carbon bond on a main chain is exemplified.

Examples of such a conjugated polymer include conjugated polymers having, as a repeating unit, a constituent derived from at least one compound selected from the group consisting of a thiophene-based compound, a pyrrole-based compound, an acetylene-based compound, a p-arylene-based compound, a p-arylenevinylene-based compound, a p-aryleneethynylene-based compound, a p-fluorenylenevinylene-based compound, a fluorene-based compound, an aromatic polyamine-based compound (also referred to as an arylamine-based compound), a polyacene-based compound, a polyphenanthrene-based compound, a metal-phthalocyanine-based compound, a p-xylylene-based compound, a vinylenesulfide-based compound, a m-phenylene-based compound, a naphthalenevinylene-based compound, a p-phenyleneoxide-based compound, a phenylenesulfide-based compound, a furan-based compound, a selenophene-based compound, an azo-based compound, and a metal complex-based compound.

Among these, from the viewpoint of thermoelectric conversion performance, a conjugated polymer having, as a repeating unit, a constituent derived from at least one compound selected from the group consisting of a thiophene-based compound, a pyrrole-based compound, an acetylene-based compound, a p-phenylene-based compound, a p-phenylenevinylene-based compound, a p-phenyleneethynylene-based compound, a fluorene-based compound, and an arylamine-based compound.

A substituent to be introduced into the compounds described above is not particularly limited, but it is preferable to appropriately select and introduce a substituent which can improve the dispersibility of the conjugated polymer in the dispersion medium, in consideration of compatibility with other components, types of dispersion mediums to be used, and the like.

As an example of the substituent, when an organic solvent is used as the dispersion medium, a linear, branched, or cyclic alkyl group, alkenyl group, alkynyl group, alkoxy group, or thioalkyl group, and also alkoxyalkyleneoxy group, alkoxyalkyleneoxyalkyl group, crown ether group, or aryl group can be preferably used. These groups may further have a substituent. In addition, the number of carbon atoms of the substituent is not particularly limited, but is preferably 1 to 12 and more preferably 4 to 12. A long-chain alkyl group, alkoxy group, thioalkyl group, alkoxyalkyleneoxy group, or alkoxyalkyleneoxyalkyl group having 6 to 12 carbon atoms is particularly preferred.

On the other hand, when an aqueous medium is used as the dispersion medium, a hydrophilic group such as a carboxylic acid group, a sulfonate group, a hydroxyl group, or a phosphate group is preferably further introduced into each monomer terminal or the above-described substituent. In addition thereto, a dialkylamino group, a monoalkylamino group, an amino group, a carboxyl group, an ester group, an amide group, a carbamate group, a nitro group, a cyano group, an isocyanate group, an isocyano group, a halogen atom, a perfluoroalkyl group, a perfluoroalkoxy group, or the like can be introduced as the substituent, and such introduction is preferred.

The number of substituents that can be introduced is not particularly limited, but in consideration of the dispersibility, the compatibility, and the electrical conductivity of the conjugated polymer, one or a plurality of substituents can be introduced as appropriate.

As the conjugated polymer, specifically, a conductive polymer described in JP-A-2012-251132 can be preferably used.

The molecular weight of the conjugated polymer is preferably 3,000 to 200,000 and more preferably 5,000 to 100,000. A weight average molecular weight can be measured by Gel Permeation Chromatography (GPC). The specific measurement method is the same as in the case of the charge-transfer complex.

2. Non-Conjugated Polymer

The non-conjugated polymer is a polymer compound which does not exhibit electric conductivity in the conjugated structure of the polymer main chain. Specifically, the non-conjugated polymer is a polymer other than a polymer having a polymer main chain consisting of a ring, a group, or an atom selected from an aromatic ring (carbocyclic aromatic ring or heteroaromatic ring), an ethylene bond, an ethenylene bond, and a hetero atom having lone-pair electrons.

Such a non-conjugated polymer is not particularly limited, and generally known non-conjugated polymer may be used. From the viewpoint of the thermoelectric conversion performance, a non-conjugated polymer having, as a repeating unit, a constituent derived from at least one compound selected from the group consisting of a vinyl compound, a (meth)acrylate compound, a carbonate compound, an ester compound, an amide compound, an imide compound, and a siloxane compound. These compounds may have a substituent, and as the substituent, the same substituent as that of the conjugated polymer is exemplified.

In the present invention, the term "(meth)acrylate" means both or either of acrylate and methacrylate, and a mixture of these.

Specific examples of the vinyl compound that forms polyvinyl-based polymer include a vinylarylamines such as styrene, vinylpyrrolidone, vinylcarbazole, vinylpyridine, vinylnaphthalene, vinylphenol, vinyl acetate, styrenesulfonic acid, vinyltriphenylamine; and vinyltrialkyl amines such as vinyltributylamine.

Specific examples of the (meth)acrylate compound that forms the poly(meth)acrylate include acrylate monomers including hydrophobic acrylic alkyl esters such as methyl acrylate, ethyl acrylate, propyl acrylate, and butyl acrylate; acrylic hydroxyalkly esters such as 2-hydroxyethyl acrylate, 1-hydroxyethyl acrylate, 2-hydroxypropyl acrylate, 3-hydroxypropyl acrylate, 1-hydroxypropyl acrylate, 4-hydroxybutyl acrylate, 3-hydroxybutyl acrylate, 2-hydroxybutyl acrylate, and 1-hydroxybutyl acrylate; and methacrylate monomers in which the acryloyl groups of these monomers are changed to methacryloyl groups.

Specific examples of the polycarbonate include general-purpose polycarbonates formed from bisphenol A and phosgene, IUPIZETA (trade name, manufactured by MITSUBISHI GAS CHEMICAL CO., INC.), and PANLITE (trade name, manufactured b TEIJIN LIMITED).

As the compound for forming the polyester, polyalcohol, and a hydroxy acid such as polycarboxylic acid and lactic acid can be exemplified. Specific examples of the polyester include VYLON (trade name, manufactured by TOYOBO CO., LTD.).

Specific examples of the polyamide include PA-100 (trade name, manufactured by T&K TOKA CO., LTD).

Specific examples of the polyimide include SOLPIT 6,6-PI (trade name, manufactured by Solpit Industries, Ltd.).

Specific examples of the polysiloxane include polydiphenylsiloxane and polyphenylmethylsiloxane.

The molecular weight of the non-conjugated polymer is preferably 5,000 to 300,000 and more preferably 10,000 to 150,000. A weight average molecular weight can be measured by Gel Permeation Chromatography (GPC). The specific measurement method is the same as in the case of the charge-transfer complex.

<Dispersion Medium>

The thermoelectric conversion material of the present invention contains a dispersion medium, and a nano conductive material is dispersed in this dispersion medium.

The dispersion medium may disperse the nano conductive material, and water, an organic solvent, and mixed solvents thereof can be used. The solvent is preferably an organic solvent, and preferred examples include alcohols; aliphatic halogen-based solvents such as chloroform; aprotic polar solvents such as DMF, NMP and DMSO; aromatic solvents such as chlorobenzene, dichlorobenzene, benzene, toluene, xylene, mesitylene, tetralin, tetramethylbenzene, and pyridine; ketone-based solvents such as cyclohexanone, acetone, and methyl ethyl ketone; and ether-based solvents such as diethyl ether, THF, t-butyl methyl ether, dimethoxyethane, and diglyme, and more preferred examples include halogen-based solvents such as chloroform, aprotic polar solvents such as DMF and NMP; aromatic solvents such as dichlorobenzene, xylene, tetralin, and tetramethylbenzene; and ether-based solvents such as THF.

For the thermoelectric conversion material of the present invention, one kind of the dispersion medium may be used alone or two or more kinds thereof may be used in combination.

Furthermore, it is preferable to have the dispersion medium degassed in advance and to adjust the dissolved oxygen concentration in the dispersion medium to 10 ppm or less. Examples of the method of degassing include a method of irradiating ultrasonic waves under reduced pressure; and a method of bubbling an inert gas such as argon.

Furthermore, it is preferable to have the dispersion medium dehydrated in advance. It is preferable to adjust the amount of water in the dispersion medium to 1,000 ppm or less, and more preferably to 100 ppm or less. Regarding the method of dehydration of the dispersion medium, known methods such as a method of using a molecular sieve, and distillation, can be used.

The amount of the dispersion medium in the thermoelectric conversion material is preferably 25 to 99.99% by mass, more preferably 30 to 99.95% by mass, and further preferably 30 to 99.9% by mass, relative to the total amount of the thermoelectric conversion material.

<Dopant>

When the thermoelectric conversion material of the present invention contains the conjugated polymer described above, it is preferable to further contain a dopant in terms of the fact that the electrical conductivity of the thermoelectric conversion layer can be enhanced due to an increase in carrier concentration.

The dopant is a compound that is doped into the above-described conjugated polymer, and may be any compound capable of doping the conjugated polymer to have a positive charge (p-type doping) by protonizing the conjugated polymer or eliminating electrons from the π-conjugated system of the conjugated polymer. Specifically, an onium salt compound, an oxidizing agent, an acidic compound, an electron acceptor compound and the like as described below can be used.

1. Onium Salt Compound

The onium salt compound to be used as the dopant preferably includes a compound (an acid generator, acid precursor) that generates acid by providing energy such as irradiation of active energy rays (such as radiation and electromagnetic waves). Specific examples of such onium salt compounds include a sulfonium salt, an iodonium salt, an ammonium salt, a carbonium salt, and a phosphonium salt. Among these, a sulfonium salt, an iodonium salt, an ammonium salt, or a carbonium salt is preferred, a sulfonium salt, an iodonium salt, or a carbonium salt is more preferred, a sulfonium salt, an iodonium salt is particularly preferred. Specific examples of an anion part constituting such a salt include counter anions of strong acid.

As the onium salt compound, specifically, an onium salt compound described in JP-A-2012-251132 can be preferably used.

2. Oxidizing Agent, Acidic Compound, and Electron Acceptor Compound

Specific examples of the oxidizing agent to be used as the dopant in the present invention include halogen ($Cl_2$, $Br_2$, $I_2$, ICl, $ICl_3$, IBr, IF), Lewis acid ($PF_5$, $AsF_5$, $SbF_5$, $BF_3$, $BCl_3$, $BBr_3$, $SO_3$), a transition metal compound ($FeCl_3$, FeOCl, $TiCl_4$, $ZrCl_4$, $HfCl_4$, $NbF_5$, $NbCl_5$, $TaCl_5$, $MoF_5$, $MoCl_5$, $WF_6$, $WCl_6$, $UF_6$, $LnCl_3$ (Ln=lanthanoid such as La, Ce, Pr, Nd and Sm), and also $O_2$, $O_3$, $XeOF_4$, $(NO_2^+)(SbF_6^-)$, $(NO_2^+)(SbCl_6^-)$, $(NO_2^+)(BF_4^-)$, $FSO_2OOSO_2F$, $AgClO_4$, $H_2IrCl_6$ and $La(NO_3)_3 \cdot 6H_2O$.

As the acidic compound, polyphosphoric acid (diphosphoric acid, pyrophosphoric acid, triphosphoric acid, tetraphosphoric acid, metaphosphoric acid, and the like), hydroxy compound, carboxy compound, or sulfonic acid compound, proton acid (HF, HCl, $HNO_3$, $H_2SO_4$, $HClO_4$, $FSO_3H$, $ClSO_3H$, $CF_3SO_3H$, various organic acids, amino acids and the like) are exemplified.

Examples of the electron acceptor compound include TCNQ (tetracyanoquinodimethane), tetrafluorotetracyanoquinodimethane, halogenated tetracyanoquinodimethane, 1,1-dicyanovinylene, 1,1,2-tricyanovinylene, benzoquinone, pentafluorophenol, dicyanofluorenone, cyano-fluoroalkylsulfonyl-fluorenone, pyridine, pyrazine, triazine, tetrazine, pyridopyrazine, benzothiadiazole, heterocyclic thiadiazole, porphyrin, phthalocyanine, boron quinolate-based compounds, boron diketonate-based compounds, boron diisoindomethene-based compounds, carborane-based compounds, other boron atom-containing compounds, and the electron acceptor compounds described in Chemistry Letter, 1991, pp. 1707-1710.

In the present invention, it is not essential to use these dopants, but it is preferable that further enhancement of the thermoelectric conversion property be expected by the improvement of the electrical conductivity when the dopant is used. In case of using the dopant, one kind thereof may be used alone or two or more kinds thereof may be used in combination. Regarding the used amount of the dopant, from the viewpoint of controlling the optimum carrier concentration, the dopant is used preferably in a ratio of more than 0 part by mass but 80 parts by mass or less, more preferably in a ratio of more than 0 part by mass but 60 parts by mass or less, further preferably in a ratio of 2 to 50 parts by mass, and still more preferably 5 to 40 parts by mass, relative to 100 parts by mass of the polymer compound described above.

Among the dopants described above, an onium salt compound is preferably used from the viewpoint of improving the dispersibility and the film-forming property of the thermoelectric conversion material. The onium salt compound is neutral before acid release, and generates an acid by being decomposed when energy such as light or heat is imparted, and this acid causes doping effect to be developed. Therefore, after the thermoelectric conversion material is formed and processed into a desired shape, the doping is carried out by light irradiation or the like and thus the doping effect can be exerted. Further, since the onium salt compound is neutral before acid release, each component such as the conjugated polymer or the nano conductive material is uniformly dissolved or dispersed in the thermoelectric conversion material without the aggregation or precipitation of the above-described conjugated polymer. Due to this uniform solubility or dispersibility of the thermoelectric conversion material, excellent electrical conductivity can be exerted after doping. Further, since favorable coating property or film-forming property can be achieved, the formation or processing of the thermoelectric conversion layer and the like is also excellent.

<Metal Element>

In the thermoelectric conversion material of the present invention, a metal element is preferably contained as a simple substance, an ion, or the like, in terms of further improving thermoelectric conversion performance. One kind of the metal elements can be used alone or two or more kinds thereof can be used in combination.

In the case where the thermoelectric conversion material contains the metal element, electron transportation in the thermoelectric conversion layer to be formed is promoted by the metal element, and thus thermoelectric conversion performance are considered to be improved. The metal element is not particularly limited, but a metal element having an atomic weight of 45 to 200 is preferable, a transition metal element is more preferable, and zinc, iron, palladium, nickel, cobalt, molybdenum, platinum, and tin are particularly preferable, in terms of thermoelectric conversion performance. Regarding the added amount of the metal element, as the added amount is too small, the effect of enhancing the thermoelectric conversion characteristics is not sufficiently exerted; on the other hand, as the added amount is too large, the physical strength of the thermoelectric conversion layer is decreased and the thermoelectric conversion characteristics is decreased due to the occurrence of cracks in some cases.

The mixing rate of the metal element is preferably 50 to 30,000 ppm, more preferably 100 to 10,000 ppm, and further preferably 200 to 5,000 ppm in the total solid content of the preliminary mixture in terms of the thermoelectric conversion characteristics of the thermoelectric conversion layer. The concentration of the metal element in the dispersion can be measured by a well-known method using, for example, an ICP mass spectrometer (for example, ICPM-8500 (trade name, manufactured by Shimadzu Corporation)), or an energy dispersive X-ray fluorescence spectrometer (for example, EDX-720 (trade name, manufactured by Shimadzu Corporation)).

The mixing rate of other components is preferably 5% by mass or less and more preferably 0 to 2% by mass in the total solid content of the preliminary mixture.

<Other Component>

In addition to the above-described component, the thermoelectric conversion material of the present invention may contain an antioxidant, a light-resistant stabilizer, a heat-resistant stabilizer and a plasticizer.

Specific examples of the antioxidant include IRGANOX 1010 (manufactured by Nihon Ciba-Geigy K.K.), SUMILIZER GA-80 (manufactured by Sumitomo Chemical Co., Ltd.), SUMILIZER GS (manufactured by Sumitomo Chemical Co., Ltd.) and SUMILIZER GM (manufactured by Sumitomo Chemical Co., Ltd.). Specific examples of the light-resistant stabilizer include TINUVIN 234 (manufactured by BASF), CHIMASSORB 81 (manufactured by BASF) and CYASORB UV-3853 (manufactured by Sun Chemical Corporation). Specific examples of the heat-resistant stabilizer include IRGANOX 1726 (manufactured by BASF). Specific examples of the plasticizer include ADK CIZER RS (manufactured by ADEKA Corporation).

The mixing rate of other components is preferably 5% by mass or less and more preferably 0 to 2% by mass in the total solid content of the preliminary mixture.

<Preparation of Thermoelectric Conversion Material>

The thermoelectric conversion material of the present invention can be prepared by mixing the various components described above. Preferably, the thermoelectric conversion material is prepared by mixing a nano conductive material, a low band gap material, each component as demanded in a dispersion medium, and dissolving or dispersing the components. At this time, regarding each component in the thermoelectric conversion material, it is preferable that the nano conductive material be in a dispersed state, while other components such as the low band gap material and a polymer are in a dispersed or dissolved state; and more preferable that the components other than the nano conductive material be in a dissolved state. When the components other than the nano conductive material are in a dissolved state, it is preferable because an effect of suppressing a decrease in the electrical conductivity by grain boundaries may be obtained. Meanwhile, the dispersed state as described above refers to a state of molecular aggregation having a particle size to the extent that even though the material is stored for a long time (as a rough indication, for one month or more), sedimentation does not occur in the solvent, and the dissolved state refers to a state in which the component is solvated in the state of individual molecules in the solvent.

There are no particular limitations on the method for preparing a thermoelectric conversion material, and the material can be prepared at normal temperature and normal pressure using a conventional mixing apparatus or the like. For example, the material may be prepared by dissolving or dispersing various components in a solvent by stirring, shaking, or kneading. An ultrasonication treatment may also be carried out in order to accelerate dissolution or dispersion.

In the above dispersion process, dispersibility of the nano conductive material can be increased by heating the solvent to a temperature higher than or equal to room temperature and lower than or equal to the boiling point, by prolonging the dispersion time, or by increasing the application intensity of stirring, infiltration, kneading, ultrasonic waves and the like.

[Thermoelectric Conversion Element]

The thermoelectric conversion element of the present invention includes the first electrode, the thermoelectric conversion layer, and the second electrode on the substrate. The thermoelectric conversion layer contains the nano conductive material and the low band gap material.

The thermoelectric conversion element of the present invention may be a thermoelectric conversion element including the first electrode, the thermoelectric conversion layer, and the second electrode on the substrate. The other configurations such as the positional relationship between the first and second electrodes and the thermoelectric conversion layer are not particularly limited. In the thermoelectric conversion element of the present invention, the thermoelectric conversion layer may be disposed such that at least one surface thereof comes into contact with the first electrode and the second electrode. For example, the thermoelectric conversion element may have an aspect in which the thermoelectric conversion layer is interposed between the first electrode and the second electrode, that is, the thermoelectric conversion element of the present invention may have an aspect in which the first electrode, the thermoelectric conversion layer, and the second electrode are provided in this order on a substrate. Moreover, the thermoelectric conversion element may have an aspect in which one surface of the thermoelectric conversion layer is disposed to come into contact with both of the first electrode and the second electrode, that is, the thermoelectric conversion element of the present invention may have an aspect in which the thermoelectric conversion layer is laminated on both of the first electrode and the second electrode, the electrodes being separately formed each other on the substrate.

Figure 2:
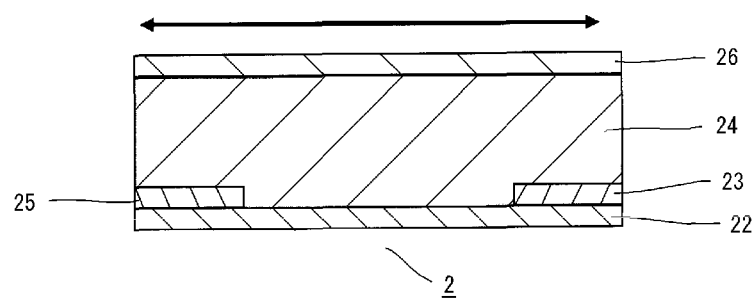

As an example of the structure of the thermoelectric conversion element of the present invention, the structures of the elements illustrated in FIG. 1 and FIG. 2 are exemplified. In FIG. 1 and FIG. 2, the arrows indicate a direction of temperature difference at the use of the thermoelectric conversion element.

Thermoelectric conversion element 1 illustrated in FIG. 1 includes, on first substrate 12, a pair of electrodes of first electrode 13 and second electrode 15, and thermoelectric conversion layer 14 formed by the thermoelectric conversion material of the present invention provided between electrodes 13 and 15. Second substrate 16 is disposed on the other surface of second electrode 15, and metal plates 11 and 17 are disposed at the outsides of first substrate 12 and second substrate 16 to face each other.

In the thermoelectric conversion element of the present invention, the thermoelectric conversion layer is preferably formed in the shape of a film (membrane) on the substrate with the electrodes interposed therebetween by using the thermoelectric conversion material of the present invention. For thermoelectric conversion element 1, it is preferable that first electrode 13 or second electrode 15 be provided on the surface (formed surface of thermoelectric conversion layer 14) of two substrates 12 and 16, and the structure have the thermoelectric conversion layer 14 which is formed by the thermoelectric conversion material of the present invention being provided between these electrodes 13 and 15.

In thermoelectric conversion element 2 illustrated in FIG. 2, first electrode 23 and second electrode 25 are disposed on first substrate 22, and thermoelectric conversion layer 24 is formed thereon which is formed by the thermoelectric conversion material of the present invention.

In thermoelectric conversion layer 14 of thermoelectric conversion element 1, One surface thereof is covered with first substrate 12 with first electrode 13 interposed therebetween. From the viewpoint of the protection of thermoelectric conversion layer 14, it is preferable that other surface of thermoelectric conversion layer 14 also come into press contact with second substrate 16. At this time, it is preferable that second electrode 15 be interposed between thermoelectric conversion layer 14 and substrate 16. In addition, in thermoelectric conversion layer 24 of thermoelectric conversion element 2, on surface thereof is covered with first electrode 23, second electrode 25, and first substrate 22. From the viewpoint of the protection of thermoelectric conversion layer 24, it is preferable that other surface of thermoelectric conversion layer 24 also come into press contact with second substrate 26. That is, it is preferable that second electrode 15 be formed in advance on the surface of second substrate 16 (a compression bonding surface of thermoelectric conversion layer 14) to be used in thermoelectric conversion element 1. Further, in thermoelectric conversion elements 1 and 2, press contact of the electrode and the thermoelectric conversion layer is preferably carried out with heating to approximately 100° C. to 200° C., from the viewpoint of enhancing adhesion.

For the substrate of the thermoelectric conversion element of the present invention, first substrate 12 and second substrate 16 of thermoelectric conversion element 1, a substrate material such as glass, transparent ceramics, a metal, or a plastic film can be used. In the thermoelectric conversion element of the present invention, a substrate having flexibility is preferred. Specifically, it is preferable to use a substrate having flexibility in which the number of cycles on folding endurance test MIT by the measurement method according to ASTM D2176 is 10,000 or more. Such a substrate having flexibility is preferably a plastic film, and preferred examples of the plastic film include a polyester film such as a polyethylene terephthalate, a polyethylene isophthalate, a polyethylene naphthalate, a polybutylene terephthalate, a poly(1,4-cyclohexylene dimethylene terephthalate), a polyethylene-2,6-phthalenedicarboxylate, and a polyester film of bisphenol A and isophthalic acid and terephthalic acid; a polycycloolefin film such as Zeonor Film (trade name, manufactured by Zeon Corporation), Arton Film (trade name, manufactured by JSR Corporation) and SUMILITE FS1700 (trade name, manufactured by SUMITOMO BAKELITE CO., LTD.); a polyimide film Kapton (trade name, manufactured by DU PONT-TORAY CO., LTD.), APICAL (trade name, manufactured by Kaneka Corporation), Upilex (trade name, Ube Industries, Ltd.) and POMIRAN (trade name, manufactured by Arakawa Chemical Industries, Ltd.); a polycarbonate film such as PURE ACE (trade name, manufactured by Teijin Chemicals Ltd.) and ELMEC (trade name, manufactured by Kaneka Corporation); a polyether ether ketone film such as SUMILITE FS1100 (trade name, manufactured by SUMITOMO BAKELITE CO., LTD.); and a polyphenylsulfide film such as TORELINA (trade name, manufactured by Toray Industries, Inc.). Appropriate selection is allowed depending on using conditions and an environment, but from viewpoints of easy availability, heat resistance, preferably, of 100° C. or higher, profitability and an effect, a commercially available polyethylene terephthalate film, polyethylene naphthalate film, various kinds of polyimide films, polycarbonate film, and the like are preferred.

In particular, it is preferably to use a substrate provided with an electrode material which is arranged on a compression bonding surface with the thermoelectric conversion layer. As the electrode material for which the first electrode and the second electrode are provided on this substrate, such a material can be used as a transparent electrode such as ITO and ZnO, a metal electrode such as silver, copper, gold and aluminum, a carbon material such as CNT and graphene, an organic material such as PEDOT/PSS, conductive paste into which conductive particulates such as silver and carbon are dispersed, and conductive paste containing a metal nanowire of silver, copper and aluminum. Among these, aluminum, gold, silver, or copper is preferable. At this time, in thermoelectric conversion element 1, substrate 11, first electrode 13, thermoelectric conversion layer 14, and second electrode 15 are configured in this order. Outside of second electrode 15, second substrate 16 may be adjacent thereto, or second electrode 15 may be exposed to the air as an outermost surface without providing second substrate 16. Further, in thermoelectric conversion element 2, substrate 22, first electrode 23, and second electrode 25, thermoelectric conversion layer 24 are configured in this order. Outside of thermoelectric conversion layer 24, second substrate 26 may be adjacent thereto, or thermoelectric conversion layer 24 may be exposed to the air as an outermost surface without providing second substrate 26.

In view of handling properties, durability or the like, thickness of the substrate is preferably 30 to 3,000 μm, more preferably, 50 to 1,000 μm, further preferably, 100 to 1,000 μm, and particularly preferably, 200 to 800 μm. When the thickness of the substrate is set within the range, the thermal conductivity is not decreased and the damage of the film (the thermoelectric conversion layer) due to external impact is also less likely to occur.

It is preferable that the thermoelectric conversion layer of the thermoelectric conversion element of the present invention be formed by the thermoelectric conversion material of the present invention and, in addition thereto, contain the polymer described above, and the dopant or a decomposed substance thereof, the metal element, and other components may be contained. The components and the content thereof in the thermoelectric conversion layer are as described above.

In the thermoelectric conversion element of the present invention, the carrier concentration of the thermoelectric conversion layer is preferably $1 \times 10^{23}$ to $1 \times 10^{26}/m^3$ and more preferably $1 \times 10^{24}$ to $5 \times 10^{25}/m^3$. The carrier concentration of the material is generally known to have an influence on the thermoelectric conversion performance thereof, and when the carrier concentration of the thermoelectric conversion layer is within the above range, it is possible to achieve satisfactory thermoelectric conversion performance, which is preferred. When the thermoelectric conversion layer is formed using the thermoelectric conversion material of the present invention, the above-described carrier concentration can be achieved.

The carrier concentration of the thermoelectric conversion layer can be measured using an electron spin resonance (ESR) analysis. In the ESR measurement, for example, BRUKER ESR EMXplus type apparatus (manufactured by Hitachi High-Tech Science Corporation) or the like can be used.

Film thickness of the thermoelectric conversion layer is preferably 0.1 μm to 1,000 μm, and more preferably, 1 μm to 100 μm. When the film thickness is set within the range, the temperature difference is easily imparted and an increase in resistance in the film can be prevented.

In general, the thermoelectric conversion element, in comparison with a photoelectric conversion element such as an element for an organic thin film solar cell, the element can be simply produced. In particular, when the thermoelectric conversion material of the present invention is used, film thickness can be increased by 100 times to 1,000 times, since it is not necessary to consider optical absorption efficiency, in comparison with the element for the organic thin film solar cell, and chemical stability to oxygen or moisture in air is improved.

The method of forming a thermoelectric conversion layer is not particularly limited, and known coating methods, such as spin coating, extrusion die coating, blade coating, bar coating, screen printing, stencil printing, roll coating, curtain coating, spray coating, and dip coating, can be used. Among them, screen printing is particularly preferable, from the viewpoint of the adhesion property of the thermoelectric conversion layer to the electrodes.

After the coating process, as necessary, a drying process is performed. For example, a solvent can be vaporized or dried by heating drying or blowing hot air.

(Doping by Energy Application)

When the thermoelectric conversion material contains the onium salt compound as a dopant, it is preferable to enhance electrical conductivity by subjecting, after film forming, the relevant film to irradiation with active energy ray or heating to perform a doping treatment. This treatment causes generation of acid from the onium salt compound, and when this acid protonates the conjugated polymer, the conjugated polymer is doped with a positive charge (p-type doping).

The active energy rays include radiation and electromagnetic waves, and the radiation includes particle beams (high-speed particle beams) and electromagnetic radiation. Specific examples of the particle beams include charged particle beams such as alpha rays ($\alpha$-rays), beta rays ($\beta$-rays), proton beams, electron beams (meaning ones accelerating an electron by means of an accelerator without depending on nuclear decay), and deuteron beams; non-charged particle beams such as neutron beams; and cosmic rays. Specific examples of the electromagnetic radiation include gamma rays ($\gamma$-rays) and X-rays (X-rays and soft X-rays). Specific examples of the electromagnetic waves include radio waves, infrared rays, visible rays, ultraviolet rays (near-ultraviolet rays, far-ultraviolet rays, and extreme ultraviolet rays), X-rays, and gamma rays. Types of active energy rays used in the present invention are not particularly limited. For example, electromagnetic waves having a wavelength near a maximum absorption wavelength of the onium salt compound may be selected as appropriate.

Among these active energy rays, from viewpoints of the doping effect and safety, ultraviolet rays, visible rays, or infrared rays are preferred. Specifically, the active energy rays include rays having a maximum emission wavelength in the range of 240 to 1,100 nm, preferably in the range of 240 to 850 nm, and more preferably in the range of 240 to 670 nm.

For irradiation with active energy rays, radiation equipment or electromagnetic wave irradiation equipment is used. A wavelength of radiation or electromagnetic waves for irradiation is not particularly limited, and one allowing radiation or electromagnetic waves in a wavelength region corresponding to a response wavelength of the onium salt compound may be selected.

Specific examples of the equipment allowing radiation or irradiation with electromagnetic waves include exposure equipment using as a light source an LED lamp, a mercury lamp such as a high-pressure mercury lamp, an ultra-high pressure mercury lamp, a Deep UV lamp, and a low-pressure UV lamp, a halide lamp, a xenon flash lamp, a metal halide lamp, an excimer lamp such as an ArF excimer lamp and a KrF excimer lamp, an extreme ultraviolet ray lamp, electron beams, and an X-ray lamp. Irradiation with ultraviolet rays can be applied using ordinary ultraviolet ray irradiation equipment such as commercially available ultraviolet ray irradiation equipment for curing/bonding/exposure use (for example, SP9-250UB, USHIO INC.).

Exposure time and an amount of light may be selected as appropriate in consideration of a kind of onium salt compound to be used and the doping effect. Specific examples of the amount of light include 10 mJ/cm$^2$ to 10 J/cm$^2$, and preferably 50 mJ/cm$^2$ to 5 J/cm$^2$.

When doping is carried out by heating, a formed thermoelectric conversion layer may be heated to a temperature higher than or equal to the temperature at which the onium salt compound generates acid. A heating temperature is preferably 50° C. to 200° C., and more preferably 70° C. to 150° C. Heating time is preferably 1 minute to 60 minutes, and more preferably 3 minutes to 30 minutes.

The timing of the doping treatment is not particularly limited, but it is preferable to perform the doping treatment after processing the thermoelectric conversion material of the present invention by film forming or the like.

The thermoelectric conversion layer (also referred to as the thermoelectric conversion film) formed by the thermoelectric conversion material of the present invention and the thermoelectric conversion element of the present invention exhibit excellent thermoelectric conversion performance. Further, the thermoelectric conversion element in which the charge-transfer complex is used as the low band gap material has also satisfactory temporal stability of the thermoelectric conversion performance, and the thermoelectric conversion performance at the initial stage can be maintained for a long period of time even under the extreme environment such as high temperature and high humidity environment.

The thermoelectric conversion element of the present invention can be suitably used as a power generation device for an article for thermoelectric generation. Specifically, as the power generation device, a generator of hot spring thermal power generation, solar thermal electric conversion, waste heat electric conversion, or a power supply for a wrist watch, a semiconductor drive power supply, a power supply for a (small sized) sensor, or the like is exemplified.

Further, the thermoelectric conversion material of the present invention and the thermoelectric conversion layer formed by the thermoelectric conversion material of the present invention are suitably used as the thermoelectric conversion element of the present invention, a material for a thermoelectric generation device, a film for thermoelectric generation, or various conductive film, and specifically, are suitably used as the thermoelectric conversion material for the power generation device described above, a film for thermoelectric generation, or the like.

EXAMPLES

The present invention will be described in more detail based on the following examples, but the invention is not intended to be limited thereto.

The low band gap material, the nano conductive material, the polymer compound, and the dopant used in Examples are described below.
[Low Band Gap Material]
1. Charge-Transfer Complex
The following charge-transfer complexes 1 to 8 were used.

TABLE 1

| Low band gap material | Optical band gap | Electron donor | Electron acceptor |
|---|---|---|---|
| Charge-transfer complex 1 | 0.8 eV | Electron donor 1 | Electron acceptor 1 |

TABLE 1-continued

| Low band gap material | Optical band gap | Electron donor | Electron acceptor |
|---|---|---|---|
| Charge-transfer complex 2 | About 1.1 eV | Electron donor 2 | Electron acceptor 2 |
| Charge-transfer complex 3 | 0.9 eV | Electron donor 3 | Electron acceptor 3 |
| Charge-transfer complex 4 | About 1.1 eV | Electron donor 4 | Electron acceptor 4 |
| Charge-transfer complex 5 | About 1.0 eV | Electron donor 5 | Electron acceptor 5 |
| Charge-transfer complex 6 | About 1.0 eV | Electron donor 6 | Electron acceptor 6 |
| Charge-transfer complex 7 | About 1.0 eV | Electron donor 7 | Electron acceptor 7 |
| Charge-transfer complex 8 | About 1.0 eV | Electron donor 8 | Electron acceptor 8 |

Electron Donor

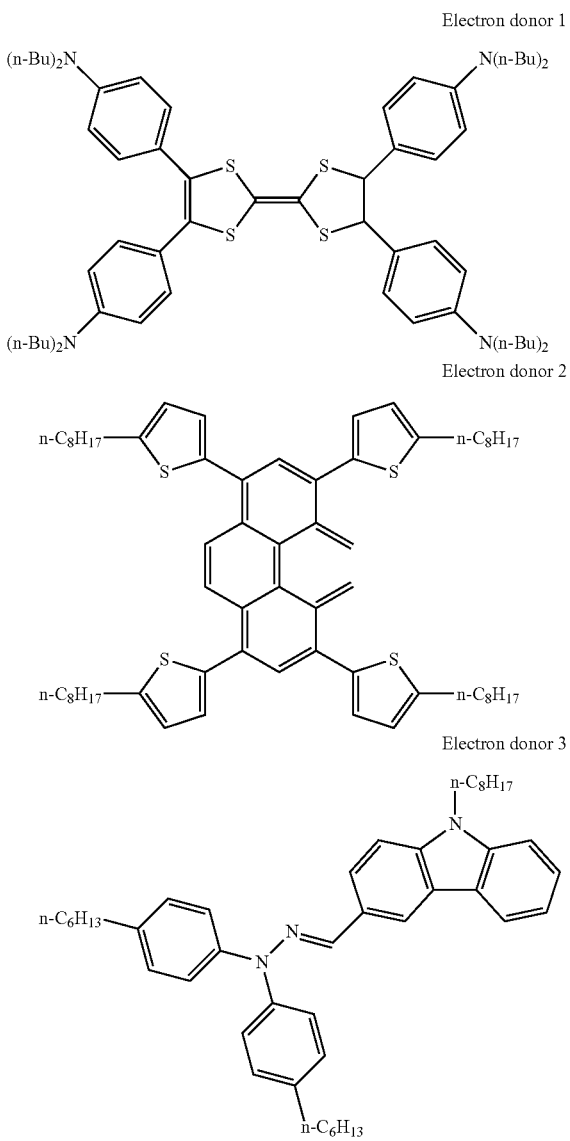

-continued
Electron donor 4
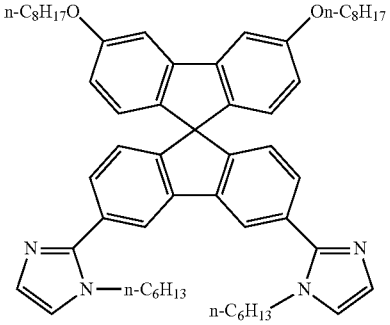
Electron donor 5
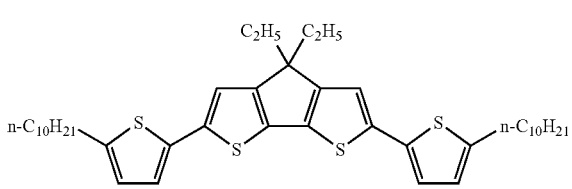
Electron donor 6
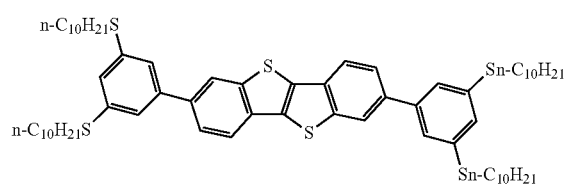
Electron donor 7
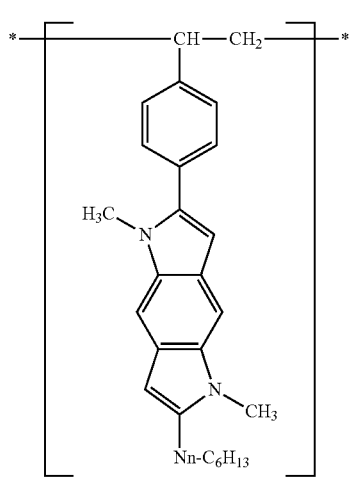
-continued
Electron donor 8
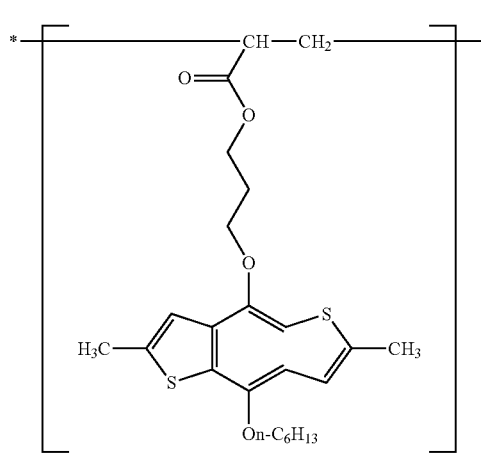
Electron Acceptor
Electron acceptor 1
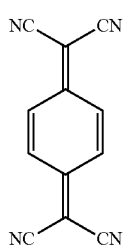
Electron acceptor 2
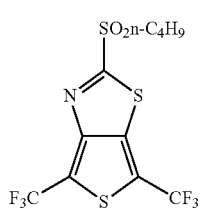
Electron acceptor 3
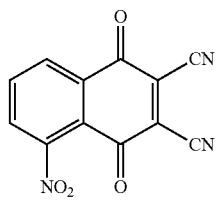
Electron acceptor 4
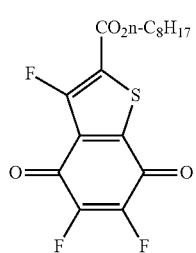

Electron acceptor 5

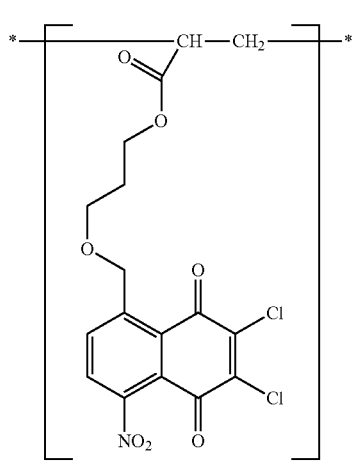

Metal complex 1

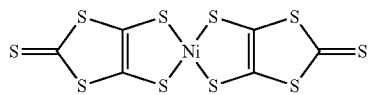

Electron acceptor 6

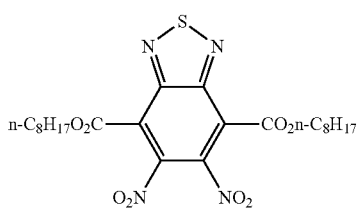

Metal complex 2

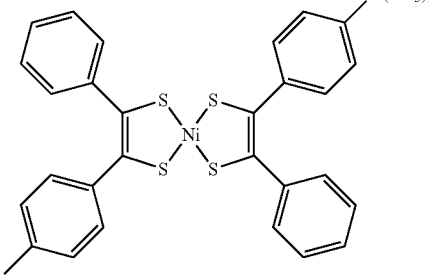

Electron acceptor 7

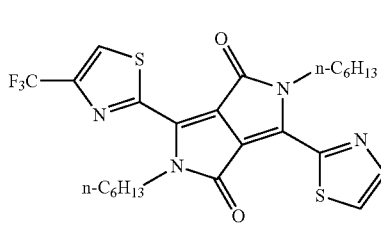

Metal complex 3

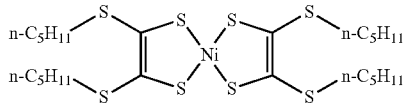

Electron acceptor 8

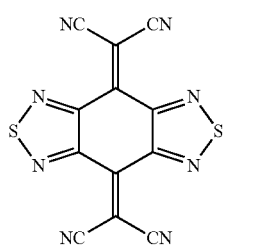

Metal complex 4

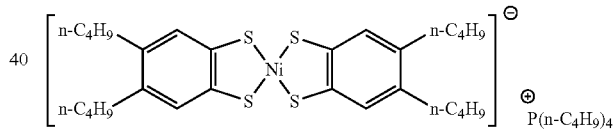

In the repeating units the electron donor and the electron acceptor described above, symbol * represents a linking site of the repeating unit.

2. Metal Complex

The following metal complexes 1 to 8 were used.

The optical band gaps of metal complexes 1 to 8 are shown below.

Metal complex 1: Optical band gap=0.7 eV
Metal complex 2: Optical band gap=0.9 eV
Metal complex 3: Optical band gap=0.8 eV
Metal complex 4: Optical band gap=1.0 eV
Metal complex 5: Optical band gap=0.8 eV
Metal complex 6: Optical band gap=0.8 eV
Metal complex 7: Optical band gap=1.0 eV
Metal complex 8: Optical band gap=1.1 eV Metal complex 5

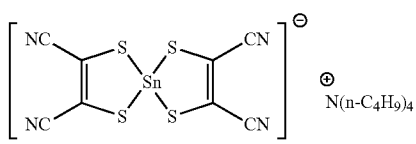

Metal complex 6

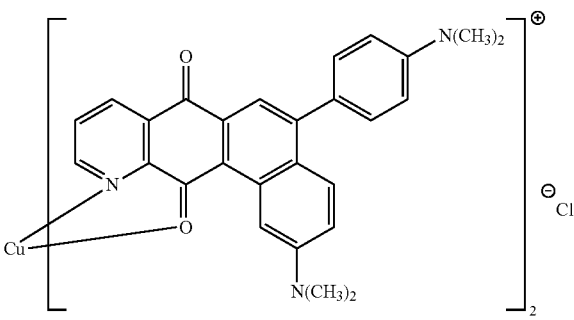

Metal complex 7

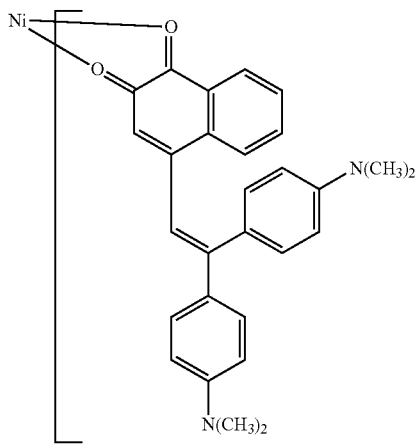

Metal complex 8

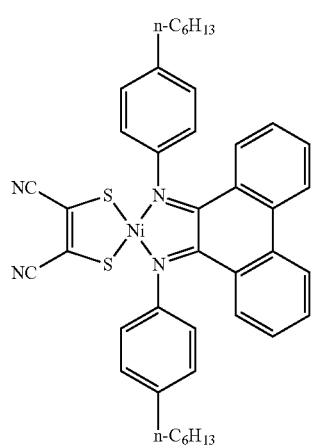

3. Arylamine Compound

The following arylamine compounds 1 to 4 were used.

The optical band gaps of arylamine compounds 1 to 4 are shown below.

Arylamine compound 1: Optical band gap=1.1 eV

Arylamine compound 2: Optical band gap=0.8 eV

Arylamine compound 3: Optical band gap=1.1 eV

Arylamine compound 4: Optical band gap=0.9 eV

Arylamine compound 1

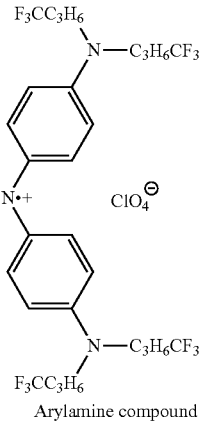

Arylamine compound 2

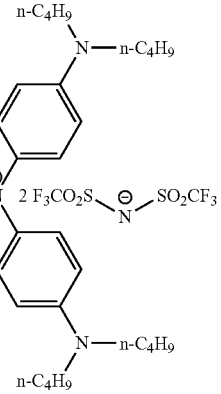

Arylamine compound 3

Arylamine compound 4

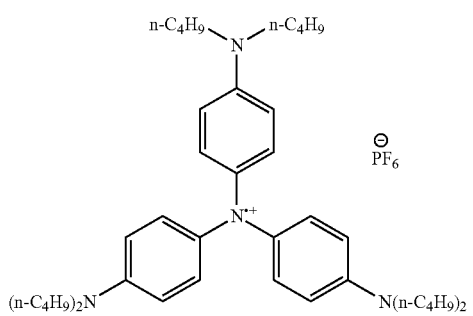

<Synthesis of Arylamine Compound 1>

5 g of N,N,N-tri(4-aminophenyl)-amine, 14 mL of 1-iodobutane, 17 g of potassium carbonate, and 100 mL of DMF were mixed and then stirred at 110° C. for 3 hours. Thereafter, ethyl acetate was added thereto, and the resultant mixture was washed with water and dried, thereby obtaining intermediate A.

2 g of intermediate A was dissolved in acetone and heated at 50° C. An acetone solution containing 540 mg of silver nitrate and 1.2 g of potassium hexafluorophosphate was added thereto and reacted for 2 hours. Thereafter, the resultant mixture was cooled to room temperature, filtered through a filter, dried, and purified, thereby obtaining 1.7 g of arylamine compound 1. Mass spectrum of the obtained compound was measured and a result of m/z=771 was obtained. As a result, the obtained compound was confirmed to be arylamine compound 1.

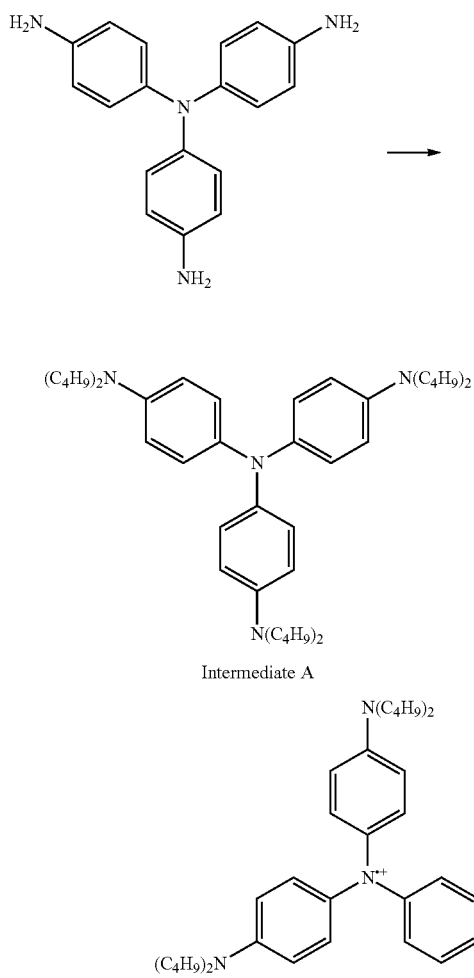

Intermediate A

<Synthesis of Arylamine Compound 2>

Arylamine compound 2 was synthesized in the same manner as in the synthesis of arylamine compound 1 described above, except that N,N,N',N'-tetrakis(4-aminophenyl)-p-phenylenediamine was used instead of N,N,N-tri(4-aminophenyl)-amine, 1,1,1-trifluoro-4-iodobutane was used instead of 1-iodobutane, and sodium perchlorate was used instead of potassium hexafluorophosphate. Mass spectrum of the obtained compound was measured and a result of m/z=1452 was obtained. As a result, the obtained compound was confirmed to be arylamine compound 2.

4. Comparative Compounds

As comparative compounds, the following comparative compounds 101 and 102 were used. The optical band gaps of these compounds are shown below.

Compound 101: Optical band gap <0.1 eV

Compound 102: Optical band gap >1.2 eV

Compound 101

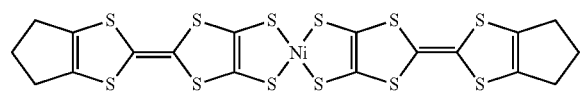

Compound 102

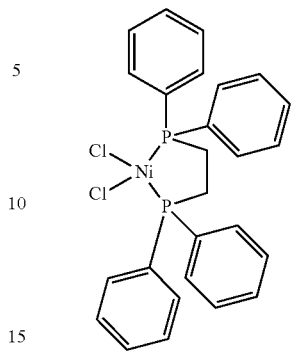

The optical band gaps of the low band gap material and the comparative compound were calculated by the following method.

<Measurement of Optical Band Gap>

The low band gap material was dissolved in a soluble organic solvent and was applied onto a quartz substrate (size: 15 mm×15 mm, thickness: 1.1 mm) which had been subjected to the UV ozone treatment by a spin coat method. The coating film was dried under the vacuum condition for 1 hour to distill off the remaining organic solvent. Thereafter, the absorption spectrum was measured by an ultraviolet visible near infrared (UV-Vis-NIR) spectrophotometer (manufactured by Shimadzu Corporation, trade name: UV-3600). The wavelength $\lambda 5$ (unit: nm) of the absorption end at the long wavelength side in which the absorbance becomes 5% relative to the maximum value ($\lambda$max) of the absorbance was obtained, and the unit of $\lambda 5$ was converted to calculate the optical band gap (unit: eV).

[Nano Conductive Material]

Nano conductive materials other than CNT were used as follows:

Graphite: AGB-5 (trade name, manufactured by Ito Graphite Co., Ltd)

Carbon nanofiber: VGCF-X (trade name, manufactured by Showa Denko K.K.)

Graphene: F-GF1205-AB (trade name, manufactured by SPI Supplies)

Carbon black: KETJENBLACK EC600JD (trade name, manufactured by Lion Corporation)

Carbon nanoparticles: Nano diamond PL-D-G (trade name, manufactured by PlasmaChem)

Silver nanowire: prepared based on the description in Production Method 2 of JP-A-2012-230881

Nickel nanotube: prepared based on the description in Example 1 of JP-B-4374439

Gold nanoparticle: 636347 (product number, manufactured by Sigma-Aldrich Co. LLC.)

Fullerene: nanom purple ST (trade name, manufactured by Frontier Carbon Corporation.)

[Polymer Compound]

1. Conjugated Polymer

The following polymer compounds 1 to 6 and PEDOT:PPS were used as the conjugated polymer.

Polymer compound 1
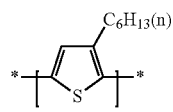
Polymer compound 2
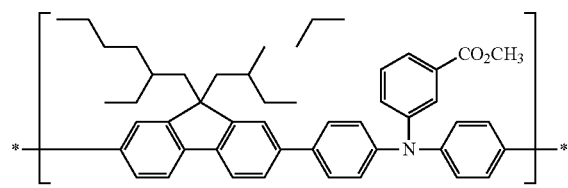
Polymer compound 3
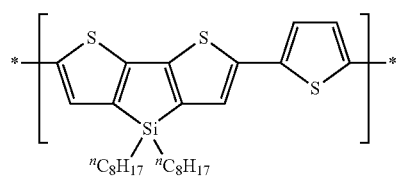
Polymer compound 4
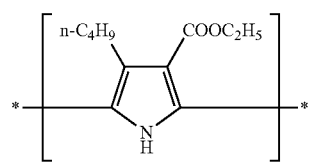
Polymer compound 5
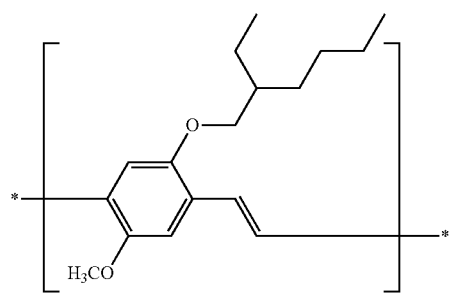
Polymer compound 6
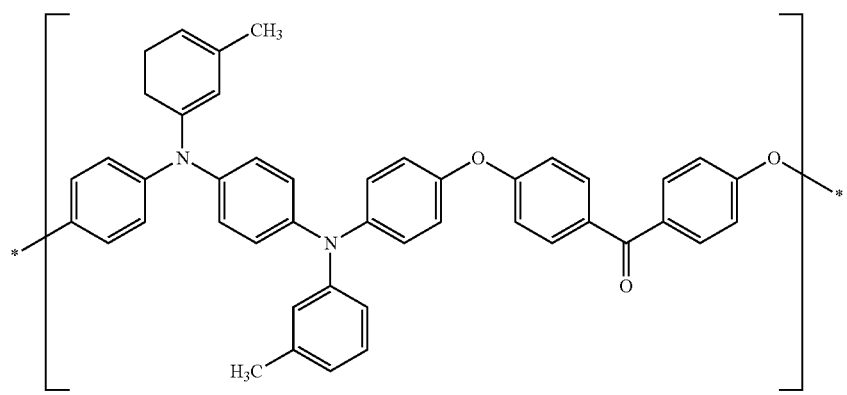

-continued

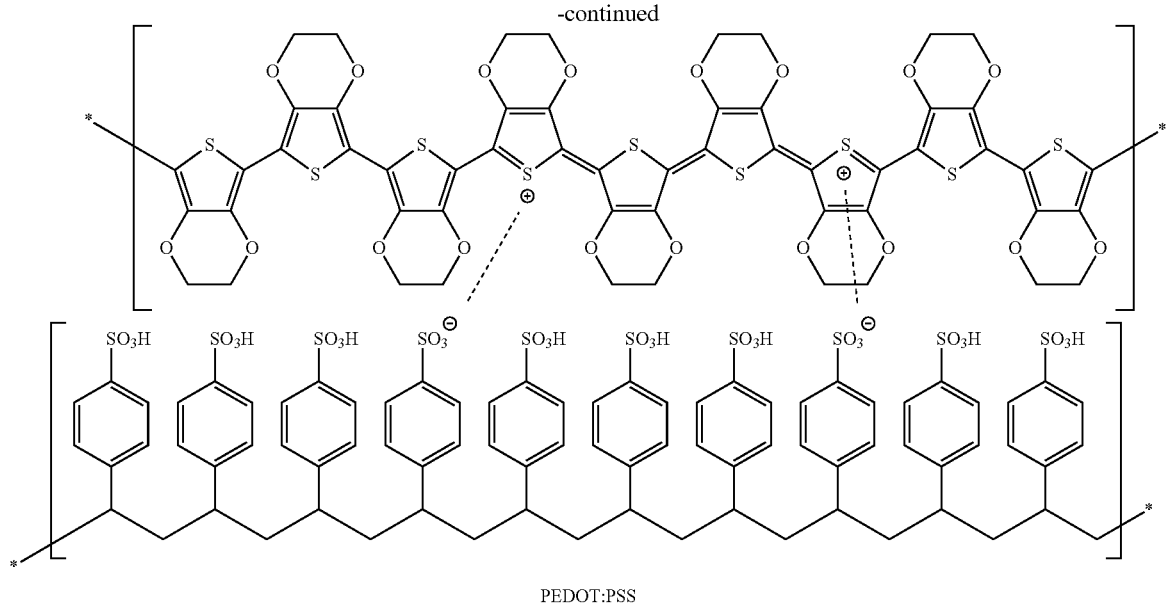

PEDOT:PSS

In the repeating units of Polymer compounds 1 to 6 and PEDOT:PPS described above, symbol * represents a linking site of the repeating unit.

Molecular weights of polymer compounds 1 to 6 were as follows. The molecular weights were measured by gel-permeation chromatography (GPC).

Polymer compound 1: Weight average molecular weight=53,000
Polymer compound 2: Weight average molecular weight=20,000
Polymer compound 3: Weight average molecular weight=19,000
Polymer compound 4: Weight average molecular weight=41,000
Polymer compound 5: Weight average molecular weight=34,000
Polymer compound 6: Weight average molecular weight=26,000
PEDOT:PSS: poly(3,4-ethylenedioxythiophene) and poly(styrenesulfonate), manufactured by H. C. Starck GmbH, trade name "Baytron P", PEDOT/PSS about 1.3% by mass of water dispersion), EDOT/PSS (mass ratio)=1/2.5

The above-described polymer compound 2 was synthesized as shown below.

Synthesis Example of Polymer Compound 2

Into a 200 mL flask, 9-(2-ethylhexyl)-9-(2-ethylpentyl)-2,7-bis(trimethylstannyl)-9H-fluorene (3.08 g, 4.38 mmol), methyl 3-(bis(4-bromophenyl)amino)benzoate (2.02 g, 4.38 mmol), and tetrakis triphenylphosphine palladium (253 mg, 0.219 mmol) were introduced and the inside of the vessel was replaced by nitrogen. In the vessel, toluene (35 mL) and N,N-dimethylformamide (9 mL) as a solvent were added using a syringe, and then the resultant mixture was reacted in an oil bath at 120° C. under a nitrogen atmosphere by heating under stirring for 24 hours. The reaction solution was cooled to room temperature, and then the solution was filtered through Celite to remove insoluble components. The obtained filtrate was added dropwise into methanol little by little, solids were precipitated, and then the solids were separated by filtration. The solids were heated and washed using an acetone solvent for 10 hours by using a Soxhlet extractor to remove impurities. Finally, the solids were dried in a vacuum for 10 hours, thereby obtaining target polymer compound 2 (production amount: 2.21 g, yield: 73%).

The weight average molecular weight of the obtained polymer compound 2 was measured by the method described above.

2. Non-Conjugated Polymer

As the non-conjugated polymer, the following polymers were used.

Polystyrene: 430102 (product number, manufactured by Sigma-Aldrich, Weight average molecular weight=192,000)
Polymethyl methacrylate: manufactured by Wako Pure Chemical Industries, Ltd.
Polyvinyl acetate: manufactured by Wako Pure Chemical Industries, Ltd.
Polylactic acid: PLA-0015 (trade name, manufactured by Wako Pure Chemical Industries, Ltd.)
Polyvinylpyrrolidone: manufactured by Wako Pure Chemical Industries, Ltd.
Polyimide compound: SOLPIT 6,6-PI (trade name, manufactured by Solpit Industries, Ltd.)
Polycarbonate compound: Iupizeta PCZ-300 (trade name, manufactured by MITSUBISHI GAS CHEMICAL COMPANY, INC.)

[Dopant]

The following polymer compounds 1 to 4 were used as the dopant.

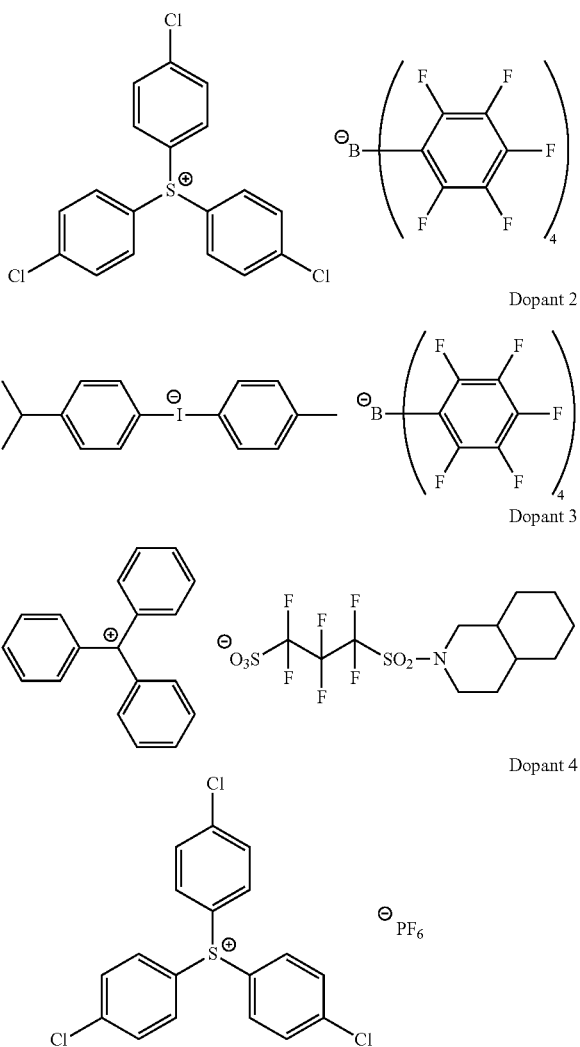

Example 1

2 mg of the charge-transfer complex 1, 4 mg of single-walled CNT (ASP-100F, manufactured by Hanwha Nanotech Corporation, dispersion (CNT concentration: 60% by mass), an average length of CNT: about 5 to 20 μm, an average diameter: about 1.0 to 1.2 nm), and 4 mg of polymer compound 1 were added in 4.0 ml of ortho-dichlorobenzene, and the mixture was dispersed in an ultrasonic bath for 70 minutes. This dispersion liquid was applied on the surface of the electrode 12 of the glass substrate 11 (thickness: 0.8 mm) having gold as the first electrode 13 (thickness: 20 nm, width: 5 mm) on one side of the surface thereof by a screen printing method, and was heated at 80° C. for 45 minutes to remove the solvent. Thereafter, the drying was carried out at room temperature in a vacuum for 10 hours, thereby forming the thermoelectric conversion layer 14 having a film thickness of 2.2 μm and a size of 8 mm×8 mm. Then, the glass substrate 16 having gold deposited thereon as the second electrode 15 (thickness of the electrode 15: 20 nm, width of the electrode 15: 5 mm, thickness of the glass substrate 16: 0.8 mm) was superimposed on the top of the thermoelectric conversion layer 14 at 80° C. such that the second electrode 15 faced the thermoelectric conversion layer 14. Thus, a thermoelectric conversion element 101 of the present invention as the thermoelectric conversion element 1 illustrated in FIG. 1 was produced.

Thermoelectric conversion elements 102 to 114 of the present invention and comparative thermoelectric conversion elements c101 to c107 were produced in the same manner as in the thermoelectric conversion element 101, except that the charge-transfer complex, the polymer compound, the CNT, and the electrode material were changed as shown in the following Table 2.

Regarding each of the thermoelectric conversion elements, the thermoelectric characteristic value (thermopower S) and the temporal stability of the thermoelectric performance relative to temperature and humidity were evaluated by the following methods. The results thereof are shown in Table 2.

[Measurement of Thermoelectric Characteristic Value (Thermopower S)]

The first electrode 13 of each thermoelectric conversion element was disposed on a hot plate maintaining constant temperature, and a Peltier device for controlling temperature was disposed on the second electrode 15. When the temperature of the Peltier device was decreased while the temperature of the hot plate was maintained constantly (100° C.), the temperature difference (a range of more than 0 K but 4 K or less) was imparted between both electrodes. At this time, when the thermopower generated between both electrodes was divided by a specific temperature difference (K) generated between both electrodes, the thermopower S (μV/K) per unit temperature difference was calculated and this value was designated as the thermoelectric characteristic value of the thermoelectric conversion element. The calculated thermoelectric characteristic value is designated as a relative value to the calculated value of the comparative thermoelectric conversion element c101 and is shown in Table 2.

[Evaluation on Temporal Stability of Thermoelectric Performance]

A Seebeck coefficient S (unit: μV/K) at 100° C. and electrical conductivity σ (unit: S/cm) of the thermoelectric conversion layer 14 formed by the film-forming and drying processes were measured by using a thermoelectric characteristic measuring apparatus (RZ2001i manufactured by OZAWA SCIENCE CO., LTD.). Then, the thermal conductivity κ (unit: W/mK) was measured by using a thermal conductivity measuring apparatus (HC-074 manufactured by EKO Instruments Co., Ltd.). The figure of merit (ZT value) at the initial stage at 100° C. was calculated according to the following Equation (A) using these values.

Figure of merit $ZT = S^2 \cdot \sigma \cdot T/\kappa$     Equation (A)

S (μV/K): thermopower per absolute temperature of 1 K (Seebeck coefficient)
σ (S/m): Electrical conductivity
κ (W/mK): Thermal conductivity
T(K): Absolute temperature Subsequently, the thermoelectric conversion layer 14 was stored in a thermostatic bath of a temperature of 85° C. and a humidity of 85% RH in the air, and after a predetermined time interval has elapsed, the figure of merit (ZT value) was calculated in the same manner as in the figure of merit at the initial stage. The cycle consisting of the storing for the predetermined time interval and the calculation of the figure of merit was repeated, and a period of time required when the figure of merit (ZT value) after starting storage was decreased to 80% of the figure of merit (ZT value) at the initial stage was designated as an indication for the temporal stability of the thermoelectric performance. The results thereof are shown in Table 2.

As the period of time required when the figure of merit (ZT value) after starting storage was decreased to 80% of the figure of merit (ZT value) at the initial stage is long, the temporal stability relative to temperature and humidity is excellent.

Example 2

Thermoelectric conversion element 201 of the present invention was produced in the same manner as in thermoelectric conversion element 101, except that the types of the polymer compound and the nano conductive material were changed as shown in Table 3. The thermopower (the relative value to the calculated value of thermoelectric conversion

TABLE 2

| Thermoelectric conversion element | Charge-transfer complex | Polymer compound | CNT | Electrode material | Temporal stability (hrs) | Thermopower (Relative value) | Remarks |
|---|---|---|---|---|---|---|---|
| 101 | 1 | 1 | Present | Gold | 201 | 197 | Ex |
| 102 | 1 | None | Present | Gold | 186 | 185 | Ex |
| 103 | 2 | 6 | Present | Gold | 244 | 238 | Ex |
| 104 | 3 | 3 | Present | Gold | 257 | 297 | Ex |
| 105 | 3 | None | Present | Gold | 213 | 235 | Ex |
| 106 | 3 | Polystyrene | Present | Gold | 269 | 283 | Ex |
| 107 | 3 | Polylactic acid | Present | Copper | 261 | 280 | Ex |
| 108 | 4 | PEDOT:PSS | Present | Silver | 235 | 266 | Ex |
| 109 | 5 | 4 | Present | Gold | 232 | 257 | Ex |
| 110 | 5 | None | Present | Aluminum | 183 | 218 | Ex |
| 111 | 6 | Polyvinyl acetate | Present | Aluminum | 263 | 248 | Ex |
| 112 | 6 | 5 | Present | Silver | 255 | 239 | Ex |
| 113 | 7 | Polymethyl methacrylate | Present | Copper | 248 | 261 | Ex |
| 114 | 8 | 2 | Present | Silver | 231 | 267 | Ex |
| c101 | None | Polystyrene | Present | Gold | 93 | 100 (standard) | C Ex |
| c102 | Electron donor 3 only | None | Present | Gold | 22 | 126 | C Ex |
| c103 | Electron acceptor 3 only | Polystyrene | Present | Gold | 35 | 114 | C Ex |
| c104 | None | PEDOT:PSS | Present | Gold | 15 | 180 | C Ex |
| c105 | 1 | None | None | Gold | Unmeasurable | Below detectable limit | C Ex |
| c106 | None | 2 | None | Gold | Unmeasurable | Below detectable limit | C Ex |
| c107 | 4 | 3 | None | Gold | Unmeasurable | Below detectable limit | C Ex |

"Ex" means Example according to the present invention, and "C Ex" means Comparative Example.

As clearly seen from Table 2, all of the thermoelectric conversion elements 101 to 114 of the present invention containing the charge-transfer complex having an optical band gap of 0.1 eV or more and 1.1 eV or less and the CNT as the nano conductive material had excellent temporal stability as well as high thermopower.

On the other hand, comparative thermoelectric conversion elements c101 to c107 not containing the low band gap material or the CNT had low thermopower and inferior temporal stability as compared to thermoelectric conversion elements 101 to 107 of the present invention.

element c101) and the temporal stability were evaluated in the same manner as in Example 1.

Subsequently, thermoelectric conversion elements 202 to 209 and comparative thermoelectric conversion element c201 were produced in the same manner as in thermoelectric conversion element 201, except that the types of the charge-transfer complex and the nano conductive material were changed as shown in Table 3. The evaluation was performed in the same manner as in the thermoelectric conversion element 201.

The results thereof are shown in Table 3.

TABLE 3

| Thermoelectric conversion element | Charge-transfer complex | Polymer compound | Nano conductive material | Temporal stability (hrs) | Thermopower (Relative value) | Remarks |
|---|---|---|---|---|---|---|
| 201 | 1 | Polystyrene | Graphite | 248 | 202 | Ex |
| 202 | 2 | Polystyrene | Carbon nanofiber | 230 | 248 | Ex |
| 203 | 3 | Polystyrene | Graphene | 225 | 215 | Ex |
| 204 | 3 | Polystyrene | Carbon black | 251 | 233 | Ex |
| 205 | 4 | Polystyrene | Carbon nanoparticles | 253 | 247 | Ex |
| 206 | 5 | Polystyrene | Silver nanowire | 237 | 228 | Ex |
| 207 | 6 | Polystyrene | Nickel nanotube | 201 | 189 | Ex |
| 208 | 7 | Polystyrene | Gold nanoparticles | 217 | 171 | Ex |
| 209 | 8 | Polystyrene | Fullerene | 255 | 197 | Ex |
| C201 | None | Polystyrene | Carbon nanofiber | 240 | 139 | C Ex |

"Ex" means Example according to the present invention, and "C Ex" means Comparative Example.

As apparent from Table 3, as to thermoelectric conversion elements 201 to 209 of the present invention, which contain a nano conductive material and a charge-transfer complex of which band gap is of 0.1 eV or more and 1.1 eV or less, all of them had thermopower higher than thermoelectric conversion element c101, and had excellent thermoelectric conversion performance.

Example 3

2 mg of charge-transfer complex 1, 2 mg of CNT (ASP-100F, manufactured by Hanwha Nanotech Corporation), 2 mg of dopant 1, and 2.5 mg of polystyrene (Aldrich 430102) as a polymer compound, and 2.5 mg of polymer compound 1 were added in 5 ml of ortho-dichlorobenzene, and the mixture was dispersed in an ultrasonic bath for 70 minutes. After the thermoelectric conversion layer was formed using this dispersion liquid in the same manner as in Example 1, the thermoelectric conversion layer was subjected to ultraviolet irradiation (amount of light: 1.06 J/cm$^2$) using an ultraviolet irradiator (ECS-401 GX manufactured by EYE GRAPHICS Co., Ltd.) and doping was carried out. Thereafter, the second electrode was superimposed in the same manner as in Example 1, thereby producing thermoelectric conversion element 301 of the present invention.

Thermoelectric conversion elements 302 to 310 of the present invention and comparative thermoelectric conversion element c301 were produced in the same manner as in thermoelectric conversion element 301, except that the charge-transfer complex, the dopant, and the polymer compound were changed as shown in the following Table 4. Incidentally, in thermoelectric conversion elements 302, 304, and 307, the doping treatment by ultraviolet irradiation was not performed.

Regarding each of the thermoelectric conversion elements, the thermoelectric characteristic value (thermopower S) and the temporal stability were evaluated in the same manner as in Example 1. The results thereof are shown in Table 4. Incidentally, the thermopower shown in Table 4 is a relative value to the calculated value of the comparative thermoelectric conversion element c101 produced in Example 1.

As clearly seen from Table 4, all of thermoelectric conversion elements 301 to 310 of the present invention containing the polymer compound and the dopant in addition to the CNT and the charge-transfer complex having an optical band gap of 0.1 eV or more and 1.1 eV or less exhibited further excellent thermopower and temporal stability.

On the other hand, comparative thermoelectric conversion element c301 not containing the low band gap material was inferior in both of the thermopower and the temporal stability.

Example 4

Thermoelectric conversion element 401 of the present invention as the thermoelectric conversion element 1 was produced in the same manner as in thermoelectric conversion element 101 of Example 1, except that the second substrate (made of glass) 16 having the second electrode 15 in which a polyethylene terephthalate film (thickness: 125 μm) having flexibility (the number of cycles on folding endurance test MIT measured by the measurement method according to ASTM D2176 being 50,000 cycles or more) was formed by a copper paste (trade name: ACP-080, manufactured by Asahi Chemical Research Laboratory Co., Ltd.) instead of glass, was used as the first substrate 12 having the first electrode 13. When the temperature difference of 3° C. was imparted between the first substrate (polyethylene terephthalate film) 12 having the first electrode 13 and the second electrode 15 with the second substrate 16 interposed therebetween, it was confirmed by a voltmeter that the thermopower of 248 μV was generated between both electrodes.

Comparative thermoelectric conversion element c401 was produced in the same manner as in the thermoelectric conversion element 401, except that the thermoelectric conversion material produced in the thermoelectric conversion element c101 of Example 1 was used as the thermoelectric conversion material. When the temperature difference of 3° C. was imparted between the first substrate having the first electrode and the second electrode with the second substrate interposed therebetween, it was confirmed by a voltmeter that the thermopower of 101 μV was generated between both electrodes.

TABLE 4

| Thermoelectric conversion element | Charge-transfer complex | CNT | Dopant | Polymer compound | Temporal stability (hrs) | Thermopower (Relative value) | Remarks |
| --- | --- | --- | --- | --- | --- | --- | --- |
| 301 | 1 | Present | 1 | Polymer compound 1 Polystyrene | 201 | 348 | Ex |
| 302 | 2 | Present | FeCl$_3$ | Polymer compound 2 Polymethyl methacrylate | 208 | 394 | Ex |
| 303 | 3 | Present | 2 | Polymer compound 3 Polyvinyl acetate | 322 | 413 | Ex |
| 304 | 3 | Present | 3 | Polymer compound 4 | 237 | 371 | Ex |
| 305 | 4 | Present | Sulfuric acid | Polymer compound 5 Polylactic acid | 277 | 349 | Ex |
| 306 | 5 | Present | 4 | Polymer compound 6 Polyvinylpyrrolidone | 248 | 338 | Ex |
| 307 | 5 | Present | 2 | Polymer compound 2 Polyimide compound | 241 | 407 | Ex |
| 308 | 5 | Present | 3 | Polymer compound 3 | 208 | 346 | Ex |
| 309 | 6 | Present | 2 | Polymer compound 4 Polystyrene | 246 | 348 | Ex |
| 310 | 7 | Present | Pyrophosphoric acid | Polymer compound 3 Polycarbonate compound | 255 | 341 | Ex |
| c301 | None | Present | 3 | Polystyrene | 128 | 103 | C Ex |

"Ex" means Example according to the present invention, and "C Ex" means Comparative Example.

As clearly seen from the above results, in the thermoelectric conversion element 401 containing the CNT and the charge-transfer complex, the generated thermopower was large as compared to the comparative thermoelectric conversion element c401 not containing the charge-transfer complex.

Example 5

Thermoelectric conversion elements 501 to 504 of the present invention were produced in the same manner as in the thermoelectric conversion element 101, except that a metal salt shown in Table 5 was added in an added amount shown in Table 5 to the charge-transfer complex 3 and the single-walled CNT, and the thermopower (the relative value to the calculated value of the thermoelectric conversion element c101) and the temporal stability were evaluated in the same manner as in Example 1. The results thereof are shown in Table 5.

in a vacuum for 10 hours, thereby forming the thermoelectric conversion layer having a film thickness of 2.1 μm and a size of 15 mm×15 mm. Then, the glass substrate having gold deposited thereon as the second electrode (thickness of the electrode: 20 nm, width of the electrode: 5 mm, thickness of the glass substrate: 0.8 mm) was superimposed on the top of the thermoelectric conversion layer at 80° C. such that the second electrode faced the thermoelectric conversion layer. Thus, thermoelectric conversion element 601 was produced.

Thermoelectric conversion elements 602 to 627 and comparative thermoelectric conversion elements c601 to c608 were produced in the same manner as in thermoelectric conversion element 601, except that the metal complex, the polymer compound, the nano conductive material, and the electrode material were changed as shown in the following Table 6-1 and Table 6-2. Incidentally, when two kinds of the polymer compounds were used, each of the polymer compounds was added in an amount of 2.0 mg.

TABLE 5

| Thermoelectric conversion element | Charge-transfer complex | CNT | Polymer compound | Metal salt | Addition amount of metal salt (ppm) | Temporal stability (hrs) | Thermopower (Relative value) | Remarks |
|---|---|---|---|---|---|---|---|---|
| 501 | 3 | Present | 3 | Cobalt bromide | 50 | 247 | 304 | Ex |
| 502 | 3 | Present | 3 | Palladium chloride | 630 | 301 | 361 | Ex |
| 503 | 3 | Present | 3 | Nickel chloride | 7500 | 248 | 348 | Ex |
| 504 | 3 | Present | 3 | Molybdenum boride | 15000 | 197 | 260 | Ex |

"Ex" means Example according to the present invention.

As clearly seen from Table 5, all of thermoelectric conversion elements 501 to 504 of the present invention containing the metal element in addition to the CNT and the charge-transfer complex having an optical band gap of 0.1 eV or more and 1.1 eV or less exhibited excellent thermopower and temporal stability.

Example 6

2 mg of the metal complex 1, 4 mg of single-walled CNT (ASP-100F, manufactured by Hanwha Nanotech Corporation, dispersion (CNT concentration: 60% by mass), an average length of CNT: about 5 to 20 μm, an average diameter: about 1.0 to 1.2 nm, a volume average diameter (D50): 50 nm), and 4 mg of the polymer compound 1 were added in 4.0 ml of ortho-dichlorobenzene, and the mixture was dispersed in an ultrasonic bath for 70 minutes. This dispersion liquid was applied on the surface of the electrode of the glass substrate (thickness: 0.8 mm) having gold as the first electrode (thickness: 20 nm, width: 5 mm) on one side of the surface thereof by a screen printing method, and was heated at 80° C. for 60 minutes to remove the solvent. Thereafter, the drying was carried out at room temperature The thermoelectric characteristic values (thermopower and thermoelectric output) of each thermoelectric conversion element were evaluated by the following method. The results thereof are shown in Table 6-1 and Table 6-2.

[Measurement of Thermopower and Thermoelectric Output]

The first electrode 13 of each thermoelectric conversion element was disposed on a hot plate maintaining constant temperature, and a Peltier device for controlling temperature was disposed on the second electrode 15. When the temperature of the Peltier device was decreased while the temperature of the hot plate was maintained constantly (100° C.), the temperature difference (a range of more than 0 K but 4 K or less) was imparted between both electrodes. At this time, when the voltage generated between both electrodes was designated as the thermopower V (unit: V) and the current was designated as the I (unit: A), the thermoelectric output calculated by the product of the thermopower V and the current I (thermopower V×current I, unit: W) was calculated. The obtained values of the thermopower and the thermoelectric output each are shown in Table 6-1 and Table 6-2 as the relative values to the calculated values of comparative thermoelectric conversion element c601.

TABLE 6-1

| Thermoelectric conversion element | Metal complex | Polymer compound | Nano conductive material | Electrode material | Thermopower (Relative value) | Thermoelectric output (Relative value) | Remarks |
|---|---|---|---|---|---|---|---|
| 601 | 1 | 1 | CNT | Gold | 250 | 348 | Ex |
| 602 | 1 | 5 | CNT | Aluminum | 310 | 470 | Ex |
| | | Polystyrene | | | | | |
| 603 | 1 | Polystyrene | CNT | Gold | 286 | 309 | Ex |
| 604 | 2 | 4 | CNT | Gold | 281 | 362 | Ex |
| 605 | 3 | 6 | CNT | Gold | 266 | 340 | Ex |

TABLE 6-1-continued

| Thermoelectric conversion element | Metal complex | Polymer compound | Nano conductive material | Electrode material | Thermopower (Relative value) | Thermoelectric output (Relative value) | Remarks |
|---|---|---|---|---|---|---|---|
| 606 | 4 | None | CNT | Gold | 256 | 287 | Ex |
| 607 | 3 | 5 Polyvinylcarbazole | CNT | Gold | 304 | 467 | Ex |
| 608 | 3 | 14 | CNT | Aluminum | 287 | 410 | Ex |
| 609 | 4 | 25 | CNT | Silver | 299 | 407 | Ex |
| 610 | 4 | 3 Polylactic acid | CNT | ITO | 302 | 435 | Ex |
| 611 | 5 | 2 | CNT | Gold | 398 | 388 | Ex |
| 612 | 5 | Polystyrene | CNT | Gold | 296 | 324 | Ex |
| 613 | 5 | Polylactic acid | CNT | Aluminum | 252 | 309 | Ex |
| 614 | 6 | PEDOT:PSS | CNT | Copper | 248 | 266 | Ex |
| 615 | 6 | 3 Polyvinyl acetate | CNT | Aluminum | 296 | 452 | Ex |
| 616 | 7 | Polymethyl methacrylate | CNT | Gold | 335 | 320 | Ex |
| 617 | 8 | 1 | CNT | Silver | 277 | 391 | Ex |
| 618 | 1 | 3 Polystyrene | Carbon black | Gold | 294 | 383 | Ex |
| 619 | 2 | None | Graphite | Gold | 269 | 294 | Ex |
| 620 | 2 | 3 Polystyrene | Graphite | Gold | 301 | 428 | Ex |
| 621 | 3 | 3 Polystyrene | Graphene | Gold | 327 | 469 | Ex |
| 622 | 3 | 3 Polystyrene | Carbon nanofiber | Gold | 289 | 446 | Ex |
| 623 | 4 | 3 Polystyrene | Nickel nanotube | Gold | 307 | 386 | Ex |
| 624 | 5 | 3 Polystyrene | Silver nanowire | Gold | 369 | 403 | Ex |
| 625 | 6 | 3 Polystyrene | Carbon nanoparticles | Gold | 290 | 362 | Ex |
| 626 | 7 | 3 Polystyrene | Fullerene | Gold | 264 | 352 | Ex |
| 627 | 8 | 3 Polystyrene | Gold nanoparticles | Gold | 286 | 366 | Ex |

"Ex" means Example according to the present invention.

TABLE 6-2

| Thermoelectric conversion element | Metal complex | Polymer compound | Nano conductive material | Electrode material | Thermopower (Relative value) | Thermoelectric output (Relative value) | Remarks |
|---|---|---|---|---|---|---|---|
| c601 | 101 | 1 | CNT | Gold | 100 (standard) | 100 (standard) | C Ex |
| c602 | 102 | 3 Polylactic acid | CNT | Gold | 116 | 138 | C Ex |
| c603 | None | Polystyrene | CNT | Gold | 104 | 86 | C Ex |
| c604 | None | 1 Polystyrene | CNT | Aluminum | 93 | 114 | C Ex |
| c605 | None | 3 Polystyrene | Carbon nanofiber | Gold | 87 | 187 | C Ex |
| c606 | 5 | None | None | Gold | Undetectable | Undetectable | C Ex |
| c607 | None | 2 | None | Gold | Undetectable | Undetectable | C Ex |
| c608 | 4 | 3 | None | Gold | Undetectable | Undetectable | C Ex |

"C Ex" means Comparative Example.

As apparent from Table 6-1, Table 6-2, all of the thermoelectric conversion elements of the present invention, containing the metal complex having the optical band gap of 0.1 eV or more and 1.1 eV or less and nano conductive material, exhibited excellent thermopower and thermoelectric output.

On the other hand, Comparative Examples c601 and c602 using the metal complex having an optical band gap of less than 0.1 eV or more than 1.1 eV and Comparative Examples c603 to c605 not using the low band gap material had low thermopower and low thermoelectric output. Further, Comparative Examples c606 to c608 not containing the nano conductive material had the thermopower and the thermoelectric output which were equal to or less than the detection limit.

Example 7

2 mg of the arylamine compound 1, 4 mg of single-walled CNT (ASP-100F, manufactured by Hanwha Nanotech Corporation, dispersion (CNT concentration: 60% by mass), an average length of CNT: about 5 to 20 µm, an average diameter: about 1.0 to 1.2 nm, a volume average diameter (D50): 50 nm), and 4 mg of the polymer compound 1 were added in 4.0 ml of ortho-dichlorobenzene, and the mixture was dispersed in an ultrasonic bath for 70 minutes. This dispersion liquid was applied on the surface of the electrode of the glass substrate (thickness: 0.8 mm) having gold as the first electrode (thickness: 20 nm, width: 5 mm) on one side of the surface thereof by a screen printing method, and was heated at 80° C. for 60 minutes to remove the solvent. Thereafter, the drying was carried out at room temperature in a vacuum for 10 hours, thereby forming the thermoelectric conversion layer having a film thickness of 2.1 μm and a size of 15 mm×15 mm. Then, the glass substrate having gold deposited thereon as the second electrode (thickness of the electrode: 20 nm, width of the electrode: 5 mm, thickness of the glass substrate: 0.8 mm) was superimposed on the top of the thermoelectric conversion layer at 80° C. such that the second electrode faced the thermoelectric conversion layer. Thus, thermoelectric conversion element 701 was produced.

Thermoelectric conversion elements 702 to 713 were produced in the same manner as in thermoelectric conversion element 701, except that the arylamine compound, the polymer compound, the nano conductive material, and the electrode material were changed as shown in the following Table 7. Incidentally, when two kinds of the polymer compounds were used, each of the polymer compounds was added in an amount of 2.0 mg.

The thermopower and the thermoelectric output of each thermoelectric conversion element were evaluated in the same manner as in Example 6. The results thereof are shown in Table 7. The thermopower and the thermoelectric output are represented as the relative values of comparative thermoelectric conversion element c601 of Example 6. Further, in Table 7, comparative thermoelectric conversion elements c603 to c605, and c607 produced in Example 6 are shown together.

As apparent from Table 7, all of the thermoelectric conversion elements of the present invention, containing the arylamine compound and nano conductive material, exhibited excellent thermopower and thermoelectric output.

On the other hand, Comparative Examples c603 and c605 not using the low band gap material had low thermopower and low thermoelectric output. Further, Comparative Examples c607 not containing the nano conductive material had the thermopower and the thermoelectric output which were equal to or less than the detection limit.

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

1, 2 Thermoelectric conversion element
11, 17 Metal plate
12, 22 First substrate
13, 23 First electrode
14, 24 Thermoelectric conversion layer
15, 25 Second electrode
16, 26 Second substrate

The invention claimed is:

1. A thermoelectric conversion element comprising, on a substrate, a first electrode, a thermoelectric conversion layer, and a second electrode, wherein a nano conductive material and a low band gap material are contained in the thermoelectric conversion layer, and an optical band gap of the low band gap material is 0.1 eV or more and 1.1 eV or less, and the low band gap material is a non-polymeric metal complex compound represented by any one of Formulas (3C) to (3D):

TABLE 7

| Thermoelectric conversion element | Arylamine compound | Polymer compound | Nano conductive material | Electrode material | Thermopower (Relative value) | Thermoelectric output (Relative value) | Remarks |
|---|---|---|---|---|---|---|---|
| 701 | 2 | None | CNT | Gold | 340 | 289 | Ex |
| 702 | 1 | 1 | CNT | Aluminum | 297 | 356 | Ex |
| 703 | 2 | 3 | CNT | Copper | 275 | 395 | Ex |
| 704 | 3 | 3 | CNT | Gold | 253 | 330 | Ex |
| 705 | 4 | 4 | CNT | ITO | 240 | 377 | Ex |
| 706 | 1 | 2 Polylactic acid | CNT | Gold | 307 | 403 | Ex |
| 707 | 4 | 3 Polystyrene | CNT | Gold | 336 | 425 | Ex |
| 708 | 4 | PEDOT:PSS | CNT | Gold | 268 | 288 | Ex |
| 709 | 1 | 2 Polystyrene | Graphite | Gold | 280 | 376 | Ex |
| 710 | 2 | 2 Polystyrene | Carbon nanofiber | Gold | 301 | 402 | Ex |
| 711 | 3 | 5 Polystyrene | Graphene | Gold | 277 | 329 | Ex |
| 712 | 4 | 2 Polystyrene | Nanowire of silver | Gold | 311 | 353 | Ex |
| 713 | 1 | 3 Polylactic acid | Carbon black | Gold | 318 | 390 | Ex |
| c603 | None | Polystyrene | CNT | Gold | 104 | 86 | C Ex |
| c604 | None | 1 Polystyrene | CNT | Aluminum | 93 | 114 | C Ex |
| c605 | None | 3 Polystyrene | Carbon nanofiber | Gold | 87 | 187 | C Ex |
| c607 | None | 2 | None | Gold | Undetectable | Undetectable | C Ex |

"Ex" means Example according to the present invention, and "C Ex" means Comparative Example.

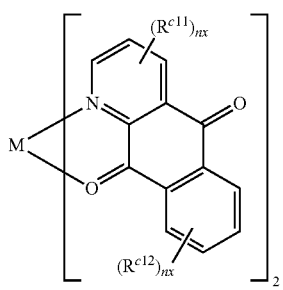

Formula(3C)

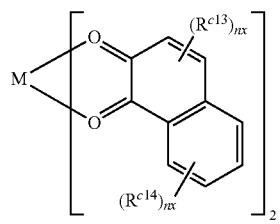

Formula(3D)

wherein, in Formulas (3C) to (3D), M is a metal atom selected from the group consisting of Ni, Fe, Cu and Sn, or a metal ion thereof; when M is a metal ion, the compound represented by Formulas (3C) to (3D) may have an arbitrary counter ion; nx represents an integer of 0 or more; and $R^{c11}$ to $R^{c14}$ each independently represent a substituent selected from the group consisting of an alkyl group, a cycloalkyl group, an alkenyl group, an alkynyl group, an aromatic hydrocarbon ring group, an aromatic heterocyclic group, an oxazolyl group, a benzoxazolyl group, a thiazolyl group, an isoxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group, a quinoxalinyl group, a pyridazinyl group, a triazinyl group, a quinazolinyl group, a phthalazinyl group, a borole group, and an azaborine group, a heterocyclic group, an alkoxy group, a cycloalkoxy group, an aryloxy group, an alkylthio group, a cycloalkylthio group, an arylthio group, an alkoxycarbonyl group, an aryloxycarbonyl group, a sulfamoyl group, an acyl group, an acyloxy group, an amide group, a carbamoyl group, an ureido group, a sulfinyl group, an alkylsulfonyl group, an arylsulfonyl group or a heteroarylsulfonyl group, an amino group, a cyano group, a nitro group, a hydroxyl group, a mercapto group, and a silyl group.

2. The thermoelectric conversion element according to claim 1, wherein the thermoelectric conversion layer further contains at least one polymer in addition to the nano conductive material and the low band gap material selected from the group consisting of a conjugated polymer and a non-conjugated polymer.

3. The thermoelectric conversion element according to claim 1, wherein the nano conductive material is at least one kind of material selected from the group consisting of a carbon nanotube, a carbon nanofiber, graphite, graphene, carbon nanoparticles and a metal nanowire.

4. The thermoelectric conversion element according to claim 1, wherein the nano conductive material is a carbon nanotube.

5. The thermoelectric conversion element according to claim 1, wherein the first electrode and the second electrode each independently are formed by aluminum, gold, silver, or copper.

6. An article for thermoelectric power generation using the thermoelectric conversion element according to claim 1.

7. A power supply for a sensor using the thermoelectric conversion element according to claim 1.

8. The thermoelectric conversion element according to claim 1, wherein the non-polymeric metal complex compound has a metal ion and a counter ion.

9. A thermoelectric conversion material for forming a thermoelectric conversion layer of a thermoelectric conversion element, the material comprising a nano conductive material and a low band gap material, wherein an optical band gap of the low band gap material is 0.1 eV or more and 1.1 eV or less, and the low band gap material is a non-polymeric metal complex compound represented by any one of Formulas (3C) to (3D):

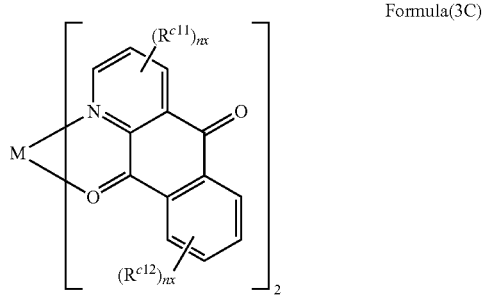

Formula(3C)

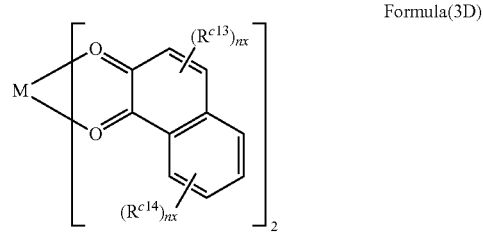

Formula(3D)

wherein, in Formulas (3C) to (3D), M is a metal atom selected from the group consisting of Ni, Fe, Cu and Sn, or a metal ion thereof; when M is a metal ion, the compound represented by Formulas (3C) to (3D) may have an arbitrary counter ion; nx represents an integer of 0 or more; and $R^{c11}$ to $R^{c14}$ each independently represent a substituent selected from the group consisting of an alkyl group, a cycloalkyl group, an alkenyl group, an alkynyl group, an aromatic hydrocarbon ring group, an aromatic heterocyclic group, an oxazolyl group, a benzoxazolyl group, a thiazolyl group, an isoxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group, a quinoxalinyl group, a pyridazinyl group, a triazinyl group, a quinazolinyl group, a phthalazinyl group, a borole group, and an azaborine group, a heterocyclic group, an alkoxy group, a cycloalkoxy group, an aryloxy group, an alkylthio group, a cycloalkylthio group, an arylthio group, an alkoxycarbonyl group, an aryloxycarbonyl group, a sulfamoyl group, an acyl group, an acyloxy group, an amide group, a carbamoyl group, an ureido group, a sulfinyl group, an alkylsulfonyl group, an arylsulfonyl group or a heteroarylsulfonyl group, an amino group, a cyano group, a nitro group, a hydroxyl group, a mercapto group, and a silyl group.

10. The thermoelectric conversion material according to claim 9, further comprising at least one polymer in addition to the nano conductive material and the low band gap material selected from the group consisting of a conjugated polymer and a non-conjugated polymer.

\* \* \* \* \*